United States Patent [19]
Nishimura

[11] Patent Number: 6,028,786
[45] Date of Patent: Feb. 22, 2000

[54] MAGNETIC MEMORY ELEMENT HAVING COUPLED MAGNETIC LAYERS FORMING CLOSED MAGNETIC CIRCUIT

[75] Inventor: Naoki Nishimura, Tokyo, Japan

[73] Assignee: Canon Kabushiki Kaisha, Tokyo, Japan

[21] Appl. No.: 09/066,570

[22] Filed: Apr. 27, 1998

[30]     Foreign Application Priority Data

| Apr. 28, 1997 | [JP] | Japan | 9-111037 |
| Apr. 28, 1997 | [JP] | Japan | 9-111040 |
| Jun. 12, 1997 | [JP] | Japan | 9-155224 |
| Jun. 12, 1997 | [JP] | Japan | 9-155225 |

[51] Int. Cl.⁷ ................................................. G11C 11/15
[52] U.S. Cl. .......................................... 365/173; 365/171
[58] Field of Search ..................................... 365/173, 171

[56]                 References Cited

U.S. PATENT DOCUMENTS 5,173,873  12/1992  Wu et al. ................................. 365/173
5,587,943  12/1996  Torok et al. ............................ 356/158

FOREIGN PATENT DOCUMENTS

WO96/25740  8/1996  WIPO .

OTHER PUBLICATIONS

H. Sakakima, et al; "Solid State Memory Using GMR Films", J. Magn. Soc. Japan, vol. 20, No. 1, pp. 22–26 (1996) and Transl.

*Primary Examiner*—David Nelms
*Assistant Examiner*—Hoai V. Ho
*Attorney, Agent, or Firm*—Fitzpatrick, Cella, Harper & Scinto

[57]                   ABSTRACT

A magnetic memory element comprising a first magnetic layer magnetized in an orientation of magnetization along one in-plane direction, a second magnetic layer magnetized in an orientation of magnetization parallel or antiparallel to the orientation of magnetization of the first magnetic layer, the second magnetic layer having a higher coercive force than that of the first magnetic layer, a non-magnetic layer interposed between the first magnetic layer and the second magnetic layer, and a third magnetic layer for magnetically coupling the first magnetic layer with the second magnetic layer in order to form a closed magnetic circuit with the first magnetic layer and the second magnetic layer.

15 Claims, 41 Drawing Sheets

FIG. 1
PRIOR ART
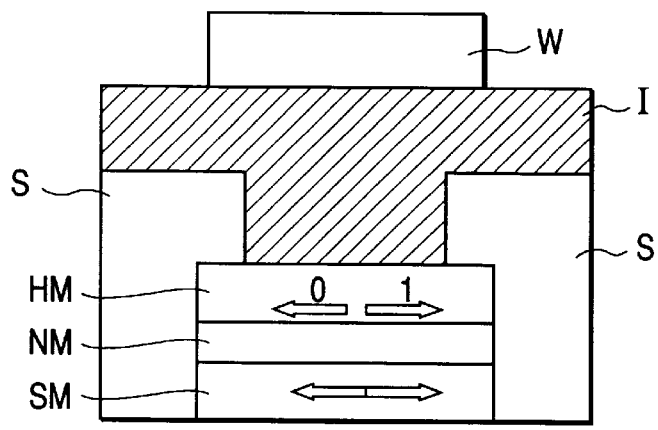
FIG. 2A
PRIOR ART
FIG. 2C
PRIOR ART
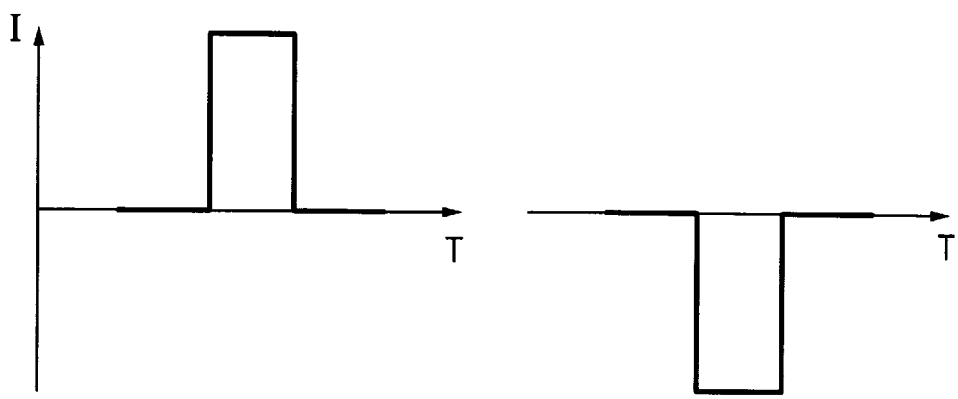
FIG. 2B
PRIOR ART
FIG. 2D
PRIOR ART
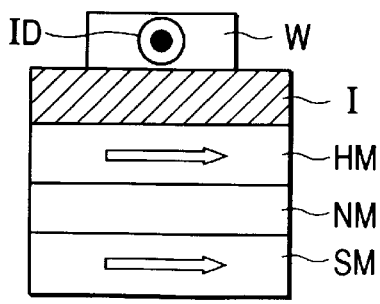
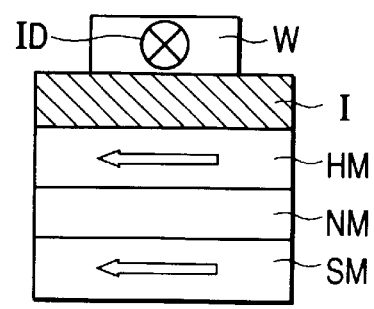

FIG. 43A1
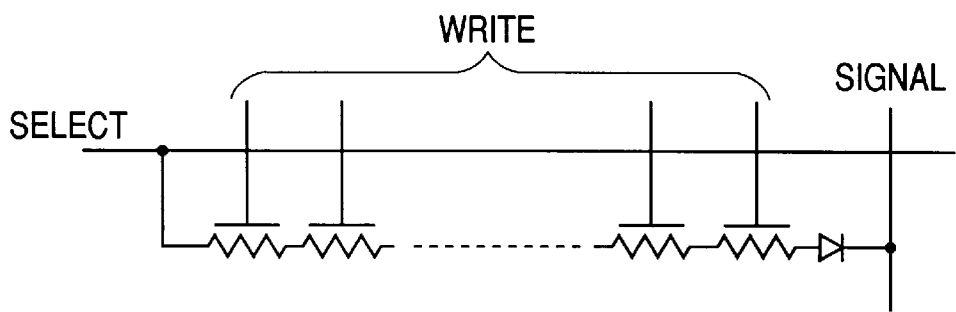
FIG. 43A2
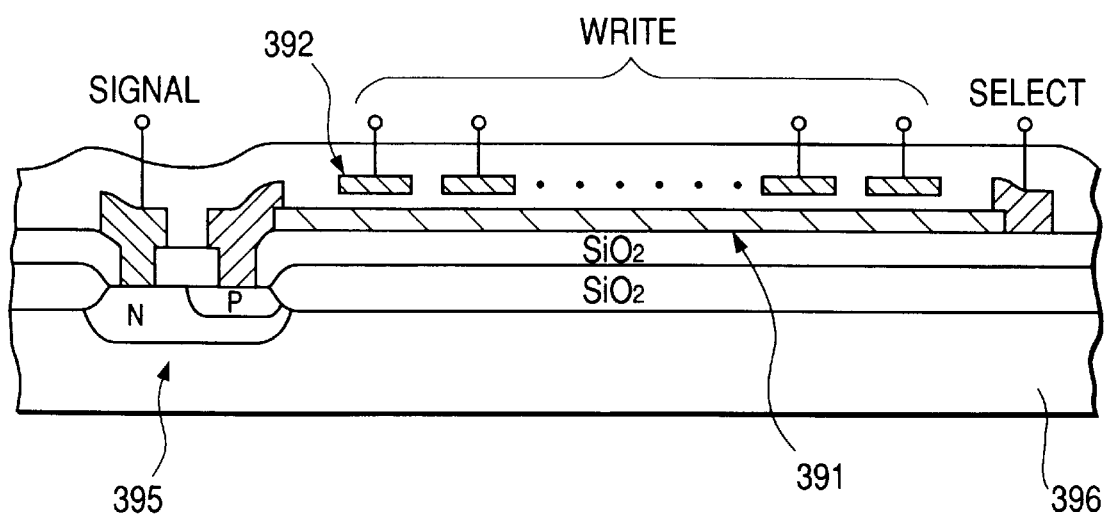

FIG. 43B1
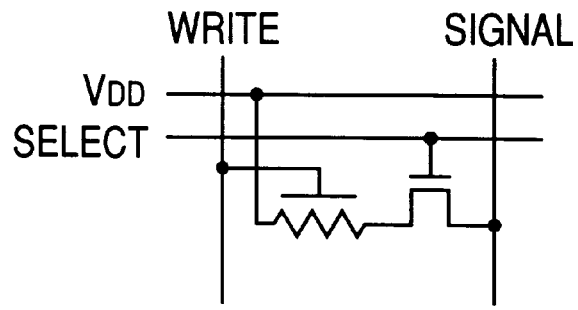
FIG. 43B2
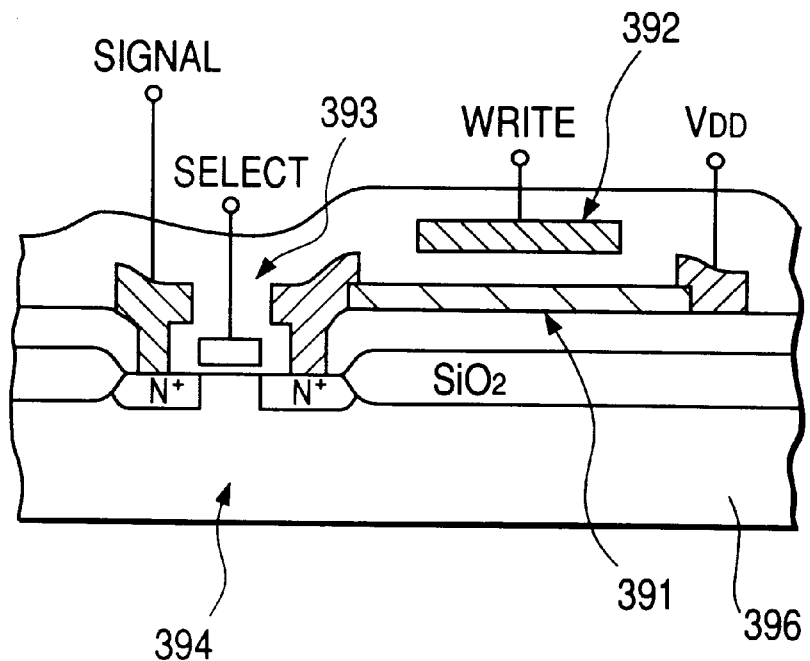

FIG. 43C1
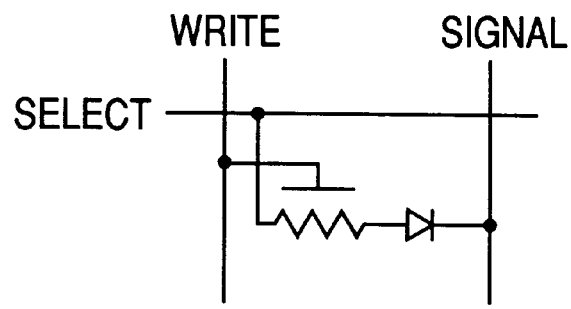
FIG. 43C2
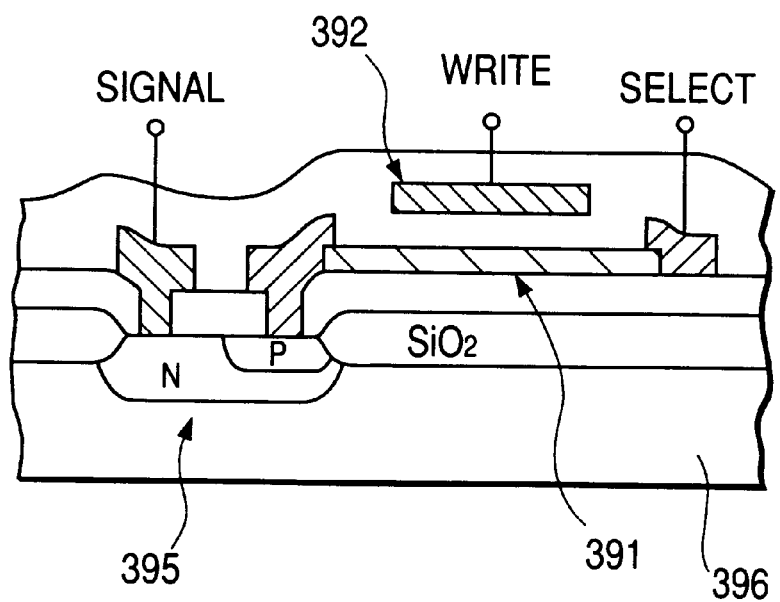

FIG. 51A1
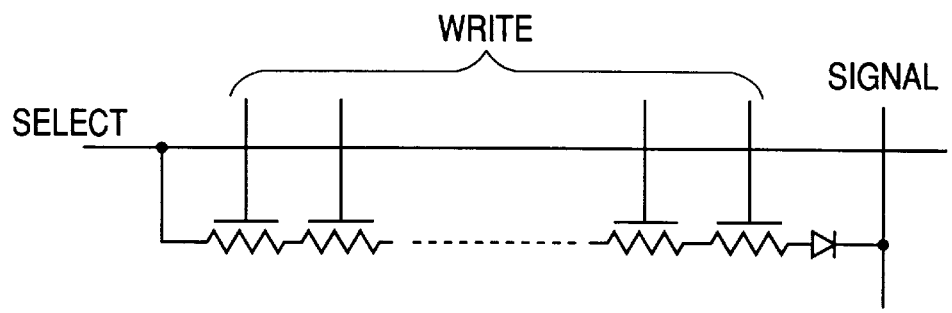
FIG. 51A2
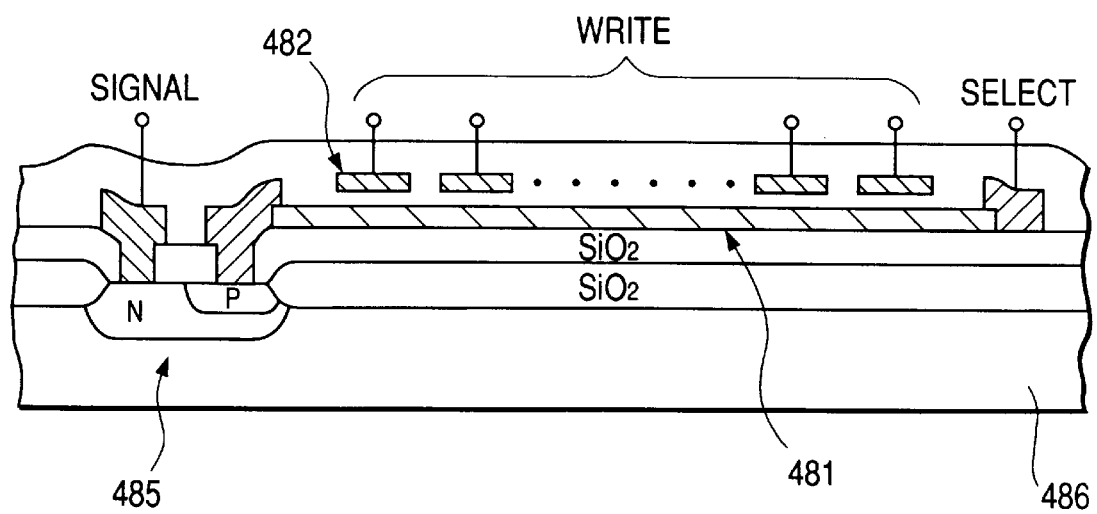

FIG. 51B1
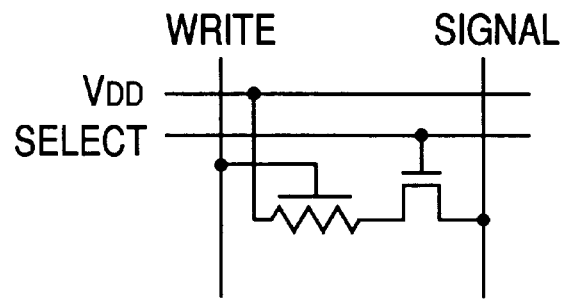
FIG. 51B2
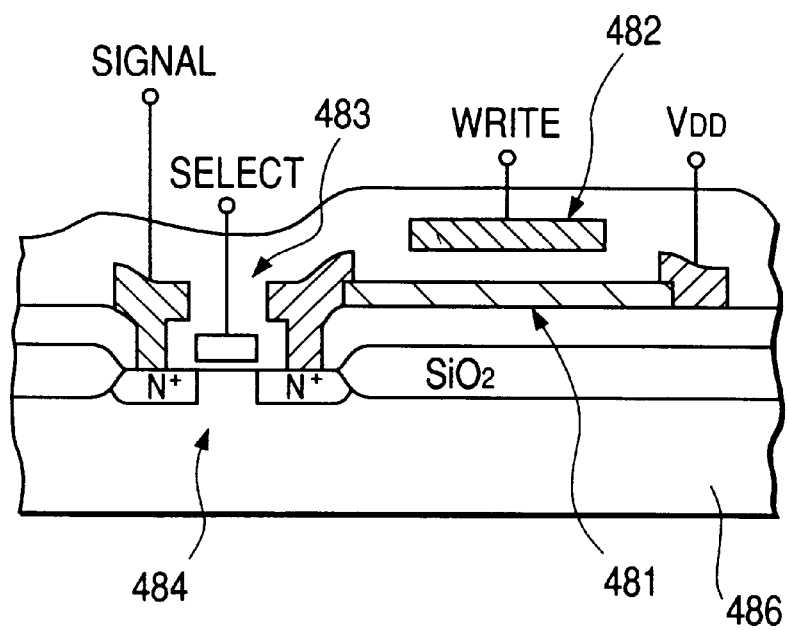

FIG. 51C1
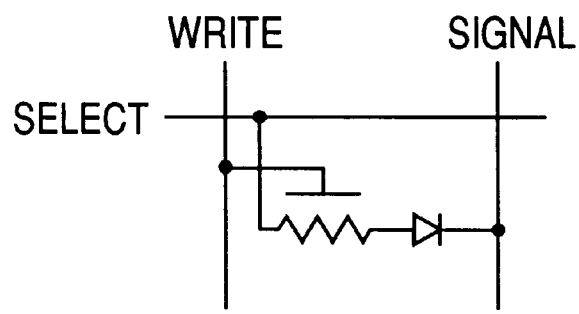
FIG. 51C2
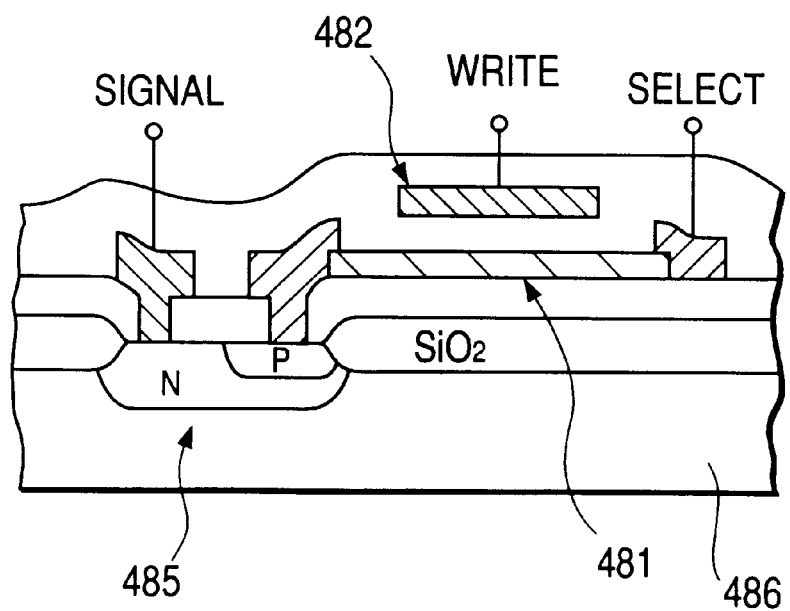

MAGNETIC MEMORY ELEMENT HAVING COUPLED MAGNETIC LAYERS FORMING CLOSED MAGNETIC CIRCUIT

BACKGROUND OF THE INVENTION

1. Field of the Invention

The present invention relates to a magnetic thin-film memory element for recording information therein by directions of magnetization and regenerating the information therefrom by magneto-resistance, and a magnetic thin-film memory using the magnetic thin-film memory elements.

2. Related Background Art

Magnetic thin-film memories are solid state memories having no moving parts as semiconductor memories, and have advantages over the semiconductor memories; e.g., the information stored therein is not lost even without supply of power; the number of repetitive rewrites is infinite; there is no risk of destroying the recorded contents even if exposed to radiation, and so on. Particularly, thin-film magnetic memories utilizing the giant magneto-resistance (GMR) effect are drawing attention in recent years, because they can produce stronger output than the magnetic thin-film memories using the anisotropic magneto-resistance effect, which have been proposed heretofore.

For example, Journal of the Magnetic Society of Japan, Vol. 20, p 22 (1996) describes a solid state memory consisting of memory elements made of a stack of constituent elements including hard-magnetic film HM/non-magnetic film NM/soft-magnetic film SM/non-magnetic film NM as shown in FIG. 1. Each memory element is provided with sense lines S joined with a metal conductor and a word line W insulated from the sense lines S by insulating film I. Information is written by a magnetic field generated by word-line current and sense-line current.

Specifically, as shown in FIGS. 2A to 2D, memory states "0," "1" are recorded by allowing a current I to flow through the word line W and thereby generating either of magnetic fields of different directions depending upon directions ID of the current I through the word line W so as to cause reversal of magnetization in the hard-magnetic film HM. For example, when the positive current is allowed to flow as shown in FIG. 2A, the rightward magnetic field is generated as shown in FIG. 2B, thereby recording "1" in the hard-magnetic film HM; in contrast, when the negative current is allowed to flow as shown in FIG. 2C, the leftward magnetic field is generated as shown in FIG. 2D, thereby recording "0" in the hard-magnetic film HM.

The information is read by allowing a smaller current I than the recording current to flow through the word line W so as to cause only reversal of magnetization in the soft-magnetic film SM and measuring change in resistance on that occasion, as shown in FIGS. 3A to 3E. When the giant magneto-resistance is utilized, there appears a difference between resistances in the parallel state and in the antiparallel state of magnetization in the soft-magnetic film SM and in the hard-magnetic film HM. Therefore, the memory states of "1" and "0" can be discriminated from each other by change in resistance occurring at that time.

When a pulse signal including a positive pulse and a negative pulse in this order as shown in FIG. 3A is applied, the magnetization varies from rightward to leftward in the soft-magnetic layer. In the memory state "1," the small resistance as shown in FIG. 3B changes to the large resistance as shown in FIG. 3C. In the memory state "0," the large resistance as shown in FIG. 3D changes to the small resistance as shown in FIG. 3E. By detecting this change in resistance, the information recorded in the hard-magnetic film HM can be read irrespective of the magnetization states of the soft-magnetic film SM after recording. This realizes nondestructive reading.

With the magnetic thin-film memory of the above structure, however, the demagnetizing field (self-demagnetizing field) produced inside the magnetic layers cannot be ignored as the area of bit cell becomes smaller. The demagnetizing field changes the magnetization direction from the fixed direction in the record-holding magnetic layer, so as to make the magnetization direction unstable. The magnetic thin-film memory of the above structure thus failed to store information with decreasing sizes of bit cell and had a drawback of not allowing high integration of bit cells accordingly.

SUMMARY OF THE INVENTION

In view of these points, an object of the present invention is to provide a magnetic thin-film memory permitting high integration by eliminating the demagnetizing field in the magnetic thin films, which was the hindrance against the decrease in the size of bit cell.

Another object of the present invention is to provide a recording/regenerating method of magnetic thin-film memory that realizes stabler recording/regeneration, a wide production margin of the non-magnetic layer, a short time for regeneration, and regeneration with less noise.

The above objects are achieved by a magnetic memory element comprising:

a first magnetic layer magnetized in an orientation of magnetization along one in-plane direction;

a second magnetic layer magnetized in an orientation of magnetization parallel or antiparallel to the orientation of magnetization of the first magnetic layer, the second magnetic layer having a higher coercive force than that of the first magnetic layer;

a non-magnetic layer interposed between the first magnetic layer and the second magnetic layer; and a third magnetic layer for magnetically coupling the first magnetic layer with the second magnetic layer in order to form a closed magnetic circuit with the first magnetic layer and the second magnetic layer.

The objects are also achieved by a magnetic thin-film memory in which the above-stated magnetic thin-film memory elements are arrayed in a matrix.

The present invention will be described in further detail in the embodiments which follow.

BRIEF DESCRIPTION OF THE DRAWINGS

FIG. 1 is a cross-sectional view of the conventional magnetic thin-film memory using the giant magneto-resistance effect;

FIGS. 2A, 2B, 2C, and 2D are explanatory drawings to show the recording operation of the conventional magnetic thin-film memory using the giant magneto-resistance effect;

FIGS. 12A and 12B are cross-sectional, explanatory drawings to show the structure of magnetic thin-film memory elements of comparative examples, wherein FIG. 12A is a drawing to show the magnetization state of mono-layer magnetic film and FIG. 12B is a drawing to show the magnetization state of two-layer magnetic film;

FIGS. 13A, 13B and 13C are drawings to show dependence of internal magnetic field against length L of magnetic member as to magnetic members of a square shape, wherein FIG. 13A is a drawing to show the demagnetizing field Hd in the monolayer film of a comparative example, FIG. 13B is a drawing to show Hd–Hst, obtained by subtracting a static magnetic field Hst induced by one layer from the demagnetizing field Hd in the other layer, as to the two-layer film of another comparative example, and FIG. 13C is a drawing to show the dependence as to the magnetic thin-film memory element of the present invention;

FIGS. 14A, 14B, and 14C are drawings to show dependence of leakage magnetic field Hn in the in-plane direction against distance d from the side face of magnetic member, wherein FIG. 14A is a drawing to show the dependence as to the monolayer film of a comparative example, FIG. 14B is a drawing to show the dependece as to the two-layer film of another comparative example, and FIG. 14C is a drawing to show the dependence as to the magnetic thin-film memory element of the present invention;

FIGS. 21A, 21B and 21C are drawings to explain an example of the regenerating method using the magneto-resistive element of the present invention by temporal changes of magnetic field and resistance, wherein FIG. 21A is a drawing to show time T response of magnetic field H, FIG. 21B is a drawing to show time T response of resistance R where the magnetization state of FIG. 20A is regenerated, and FIG. 21C is a drawing to show time T response of resistance R where the magnetization state of FIG. 20C is regenerated;

FIGS. 22A, 22B, and 22C are drawings to explain another example of the regenerating method using the magneto-resistive element of the present invention by temporal changes of magnetic field and resistance, wherein FIG. 22A is a drawing to show time T response of magnetic field H, FIG. 22B is a drawing to show time T response of resistance R where the magnetization state of FIG. 20A is regenerated, and FIG. 22C is a drawing to show time T response of resistance R where the magnetization state of FIG. 20C is regenerated;

FIGS. 31A, 31B and 31C are drawings to show dependence of internal magnetic field against length L of magnetic member as to magnetic members of a square shape, wherein FIG. 31A is a drawing to show the demagnetizing field Hd in the monolayer film of a comparative example, FIG. 31B is a drawing to show Hd−Hst, obtained by subtracting a static magnetic field Hst induced by one layer from the demagnetizing field Hd in the other layer, as to the two-layer film of another comparative example, and FIG. 31C is a drawing to show the dependence as to the magnetic thin-film memory element of the present invention;

FIGS. 32A, 32B and 32C are drawings to show dependence of leakage magnetic field Hn in the in-plane direction against distance d from the side face of magnetic member, wherein FIG. 32A is a drawing to show the dependence as to the monolayer film of a comparative example, FIG. 32B is a drawing to show the dependence as to the two-layer film of another comparative example, and FIG. 32C is a drawing to show the dependence as to the magnetic thin-film memory element of the present invention;

FIGS. 33A and 33B are cross-sectional, explanatory drawings to show the structure of magnetic thin-film memory elements of comparative examples, wherein FIG. 33A is a drawing to show the magnetization state of monolayer magnetic film and FIG. 33B is a drawing to show the magnetization state of two-layer magnetic film;

FIGS. 43A1, 43A2, 43B1, 43B2, 43C1, and 43C2 are circuit diagrams and structural drawings in case of connecting the magnetic thin-film memory element according to the present invention with a transistor or diode;

FIGS. 51A1, 51A2, 51B1, 51B2, 51C1, and 51C2 are circuit diagrams and structural drawings in case of connecting the magnetic thin-film memory element according to the present invention with a transistor or diode;

DETAILED DESCRIPTION OF THE PREFERRED EMBODIMENTS

Since in the magnetic thin-film memory element of the present invention the magnetic layers involved in recording form a closed magnetic circuit during storage, the negative effect due to the demagnetizing field can be eliminated, so that information of magnetization can be stored stably. Accordingly, the cell width of one bit can be decreased and the magnetic thin-film memory can be realized with high degree of integration.

In addition, no leakage magnetic field appears in an adjacent cell, so that recording or regeneration of information can be performed more stably.

The access time can be decreased, because regeneration can be achieved with one pulse.

The production margin of non-magnetic layer can be expanded, and resistance variation can be suppressed during regeneration. Therefore, S/N can be increased.

FIRST EMBODIMENT

The present embodiment is an embodiment utilizing the CIP (Current in-plane to the film plane)-MR (Magneto-Resistance) effect occurring when the current is allowed to flow in parallel to the film plane during regeneration.

[Structure of Magnetic Thin-film Memory Element]

Figure 3A:
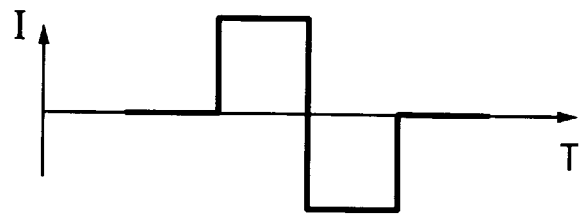
FIGS. 3A, 3B, 3C, 3D, and 3E are explanatory drawings to show the regenerating operation of the conventional magnetic thin-film memory using the giant magneto-resistance effect.
Figure 3B:
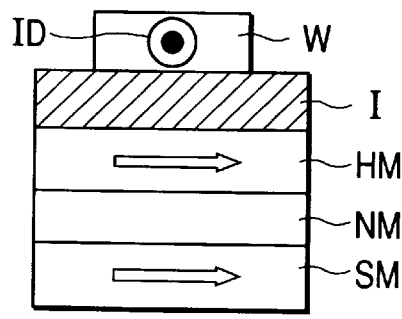
Figure 3D:
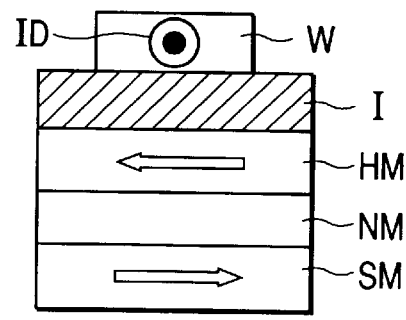
Figure 3C:
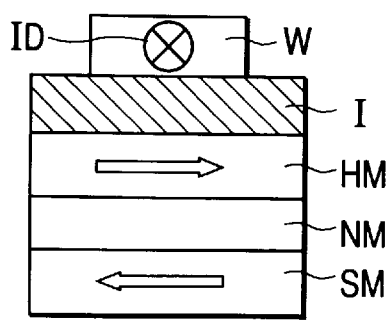
Figure 3E:
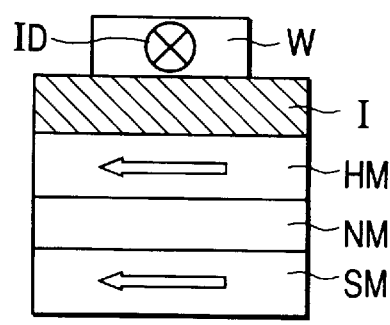
Figure 4:
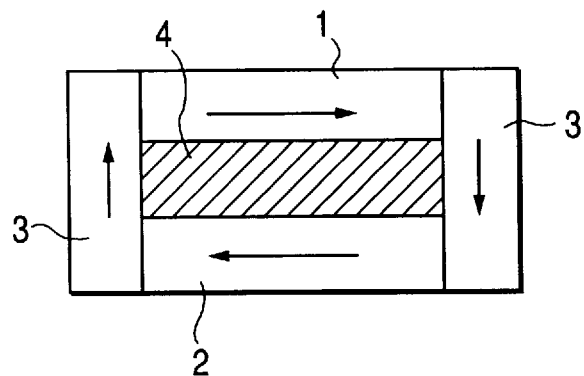
FIG. 4 is a cross-sectional, explanatory drawing to show the structure of a magnetic thin-film memory element as a first embodiment of the present invention.
Figure 5:
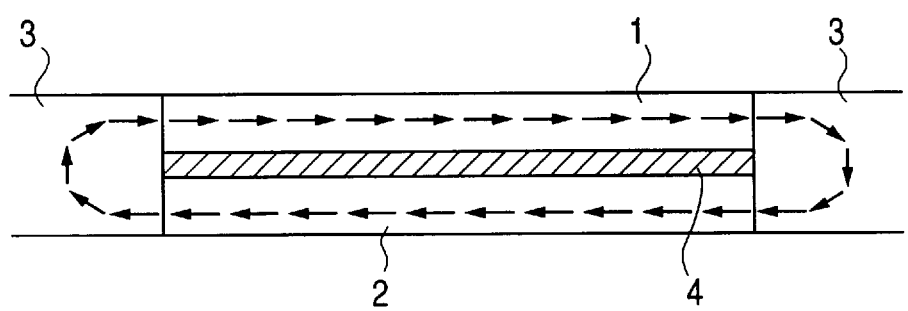
FIG. 5 is a cross-sectional, explanatory drawing to show the detailed magnetization state in the magnetic thin-film memory element of the first embodiment according to the present invention.
Figure 6:
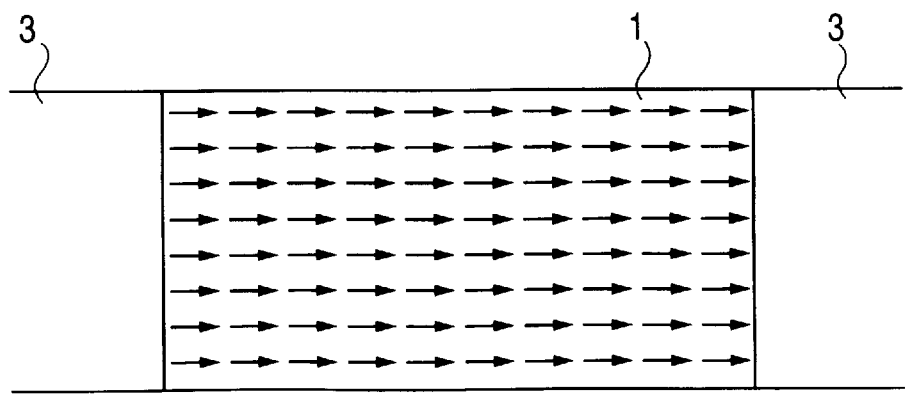
FIG. 6 is an explanatory drawing to show the detailed top plan view of the magnetization state in the magnetic thin-film memory element of the first embodiment of the present invention.
Figure 8:
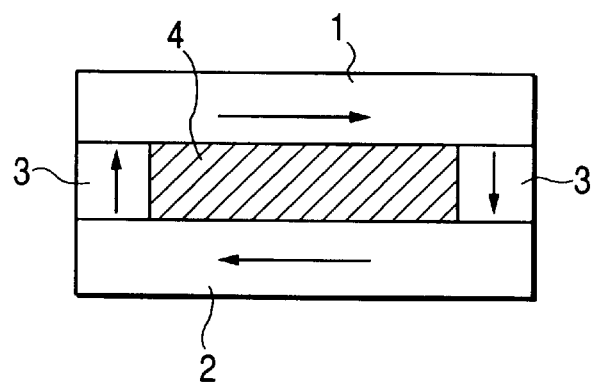
FIG. 8 is a cross-sectional, explanatory drawing to show another form of the magnetic thin-film memory element in the first embodiment of the present invention.

The present invention will be described in more detail by reference to the drawings. FIG. 4 and FIG. 8 are cross-sectional, explanatory drawings, each of which shows an example of the magnetic thin-film memory element of the present invention. In FIG. 4, numeral 1 designates a first magnetic layer, 2 a second magnetic layer, 3 a third magnetic layer, and 4 a non-magnetic layer. The arrows indicate main magnetization directions in the respective magnetic layers. FIG. 5 is a detailed view of the magnetization state of the memory element in the structure of FIG. 4. FIG. 6 is a first-magnetic-layer-side top plan view of the magnetization state of the memory element in the structure of FIG. 4.

As shown in FIG. 4, the magneto-resistive thin-film element according to the present invention is constructed in such structure that the first magnetic layer 1 and second magnetic layer 2, each including magnetization aligned in one in-plane direction in the film plane, are stacked with the non-magnetic layer in between, the third magnetic layer 3 is provided on the side faces of the first magnetic layer and second magnetic layer, and the non-magnetic layer is surrounded as a whole by the first magnetic layer, the second magnetic layer, and the third magnetic layer.

In the storage condition where the external magnetic field is 0, the magnetization in the first magnetic layer is antiparallel to that in the second magnetic layer and a closed magnetic circuit is formed through the third magnetic layer.

FIG. 4 shows the main directions of magnetization in the respective layers and, more specifically, a ring loop is formed so that the magnetization in the third magnetic layer is curved gently as shown in FIG. 5, thereby achieving a stable energy state.

Since the third magnetic layer forms portions with large curvature in the ring loop, the third magnetic layer is preferably made of a material having smaller magnetic anisotropy and coercive force and higher permeability than the first magnetic layer and the second magnetic layer and readily taking any magnetization direction. The third magnetic layer may also be preferably made of a material with small domain wall energy, in order to suppress increase in the domain wall energy occurring in the case of spins being curved.

The material for the third magnetic layer is preferably magnetic material having small magnetostriction constants and small magnetic anisotropy and a smaller coercive force than those of the first magnetic layer and the second magnetic layer. An example of such magnetic material is a metal film principal components of which are Ni and Fe; specific examples of the metal are NiFe and NiFeCo, for example.

A vertical magnetic film may also be used preferably as the material for the third magnetic layer; for example, a metal film or the like containing at least one alloy selected from the group consisting of GdFe, DyFe, and TbFe. Examples of this alloy are $Gd_xFe_{100-x}$, $Dy_xFe_{100-x}$ and $Tb_xFe_{100-x}$, for example. In these vertical magnetic films, x is preferably in the range of 10 to 35 both inclusive in the element composition. These alloys may also be used in combination with an additive element such as Co.

Figure 9:
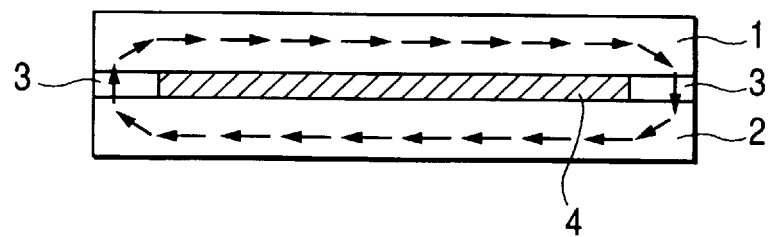
FIG. 9 is a cross-sectional, explanatory drawing to show the detailed magnetization state in the magnetic thin-film memory element shown in FIG. 8.
Figure 10:
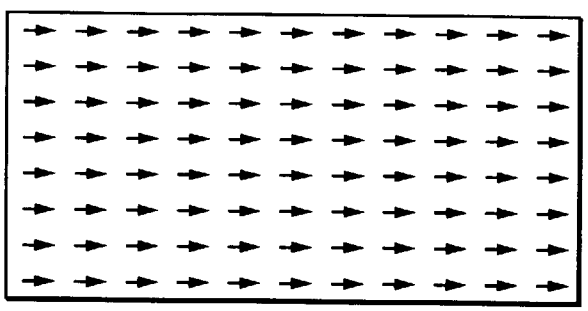
FIG. 10 is an explanatory drawing to show the detailed top plan view of the magnetization state in the magnetic thin-film memory element shown in FIG. 8.

In FIG. 4, the third magnetic layer is placed in contact with the side faces of the first magnetic layer, the non-magnetic layer, and the second magnetic layer, but the third magnetic layer 3 may also be formed between the first magnetic layer 1 and the second magnetic layer 2 so as to replace parts of the non-magnetic layer 4, as shown in FIG. 8. The state of magnetization in the structure of FIG. 8 is illustrated in detail in FIG. 9 and it is seen therefrom that a closed magnetic circuit is composed. In this case, portions with large curvature in the ring loop exist in the first magnetic layer and in the second magnetic layer. When the first magnetic layer is observed from above it, the state of magnetization thereof is as shown in FIG. 10.

In this case, the larger the occupying range of the third magnetic layer 3, the lower the magneto-resistance; therefore, the overall length of the third magnetic layer is preferably not more than one third of the length of the non-magnetic layer; more preferably, not more than a quarter. In the case of the element in the structure of FIG. 8, the third magnetic layer is made more preferably of a material having a large vertical magnetic component, because it forms the portions mainly taking charge of the vertical magnetic areas in the closed magnetic circuit.

Figure 11:
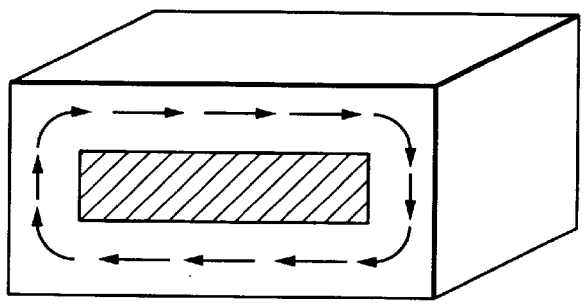
FIG. 11 is an explanatory drawing to stereoscopically show the magnetization state in the magnetic thin-film memory element of the present invention.

The above described the memory elements in the structure of FIG. 4 and in the structure of FIG. 8, but the memory element may also be constructed in the structure of a combination thereof; the point is that the first magnetic layer and the second magnetic layer are formed through the third magnetic layer so that the ring magnetization loop is established as a whole as shown in FIG. 11.

The features of the first magnetic layer, the second magnetic layer, and the non-magnetic layer will be described below. The first magnetic layer is provided for establishing the ring loop with the second magnetic layer and for reading the magnetization information stored in the second magnetic layer by making use of the giant magneto-resistance effect.

The first magnetic layer is preferably a film of metal having a component of at least one selected from the group consisting of Ni, Fe, and Co. Examples of this metal (alloy) are NiFe, NiFeCo, FeCo, CoFeB, and so on. When the element composition of NiFe is defined as $Ni_xFe_{100-x}$, x is preferably in the range of 35 to 86 both inclusive. When the element composition of NiFeCo is defined as $Ni_x(Fe_{100-y}Co_y)_{100-x}$, x is preferably in the range of 10 to 70 both inclusive and y preferably in the range of 30 to 90 both inclusive; more preferably, y in the range of 60 to 85 both inclusive.

The first magnetic layer may also be made preferably of an amorphous alloy main components of which are Co and Fe. A specific example of the amorphous alloy is amorphous magnetic material of CoFeB having such a composition as $Co_{84}Fe_9B_7$ or $Co_{72}Fe_8B_{20}$, for example.

The second magnetic layer is provided mainly for the purpose of storing the magnetization information and the direction of magnetization therein is determined depending upon the information of "0" or "1." Requirements for the second magnetic layer are that the giant magneto-resistance effect appears efficiently therein, as in the case of the first magnetic layer, and that it can stably preserve the state of magnetization.

The second magnetic layer is preferably a film of metal whose main component is Fe and/or Co. Examples of the metal (alloy) are Fe, FeCo, Co, and so on. The metal may also contain the additive element such as Pt. Addition of Fe to Co decreases the coercive force, whereas addition of Pt increases the coercive force. Therefore, the second magnetic layer can be, for example, $Co_{100-x-y}Fe_xPt_y$ and the coercive force is controlled by adjusting the element composition rates x and y.

The thickness of the first magnetic layer needs to be determined so as to efficiently withdraw the giant magneto-resistance effect of scattering type. Specifically, if the thickness of the first magnetic layer is much greater than the mean free path of electron electrons will experience phonon scattering in the first magnetic layer so as to degrade the magneto-resistance effect; therefore, the thickness is preferably not more than 200 Å. More preferably, the thickness is not more than 150 Å. Too small thicknesses, however, will lower the resistance of cell so as to decrease the output of regenerated signal or possibly fail to retain magnetization in some cases. Therefore, the thickness is preferably not less than 20 Å and more preferably not less than 80 Å. Similarly, as in the case of the first magnetic layer, the thickness of the second magnetic layer is also determined so as to efficiently achieve the giant magneto-resistance effect of scattering type and thus is determined to be preferably not more than 200 Å and more preferably not more than 150 Å. Too small thicknesses, however, will degrade the memory retaining performance and may decrease the resistance of cell so as to reduce the output of regenerated signal in some cases. Therefore, the thickness of the second magnetic layer is preferably not less than 20 Å and more preferably not less than 80 Å.

The non-magnetic layer is a good conductor and it is preferably made of material a main component of which is Cu, because such material has the Fermi energy level close to those of the magnetic layers and good adhesion to the magnetic layers, so that the resistance is likely to occur at the interface upon change in the direction of magnetization and this is advantageous in obtaining large magneto-resistance ratios. The thickness of the non-magnetic layer is preferably between 5 Å inclusive and 60 Å inclusive.

It is preferred in the present invention that a magnetic layer a main component of which is Co be provided either between the first magnetic layer and the non-magnetic layer or between the second magnetic layer and the non-magnetic layer, or at the both interfaces, because it increases the magneto-resistance ratios and thus achieves higher S/N ratios. In this case the thickness of the layer the principal component of which is Co is preferably not more than 20 Å.

In the present invention, defining {first magnetic layer/non-magnetic layer/second magnetic layer/non-magnetic layer} as one unit, a stack of such units may be employed in order to increase S/N. The number of the stacked units is preferably as large as possible, because the MR ratios will increase; but too high numbers of stacked units will cause disturbance in the interface between the magnetic layer and the non-magnetic layer. Therefore, the number of stacked units is preferably not more than 40 and more preferably in the range of approximately 3 to 20.

[Structure of Memory]

Next described in detail is an array structure of memory cells where a solid state memory is constructed by arraying many magnetic thin-film memory elements of the present invention.

Figure 19:
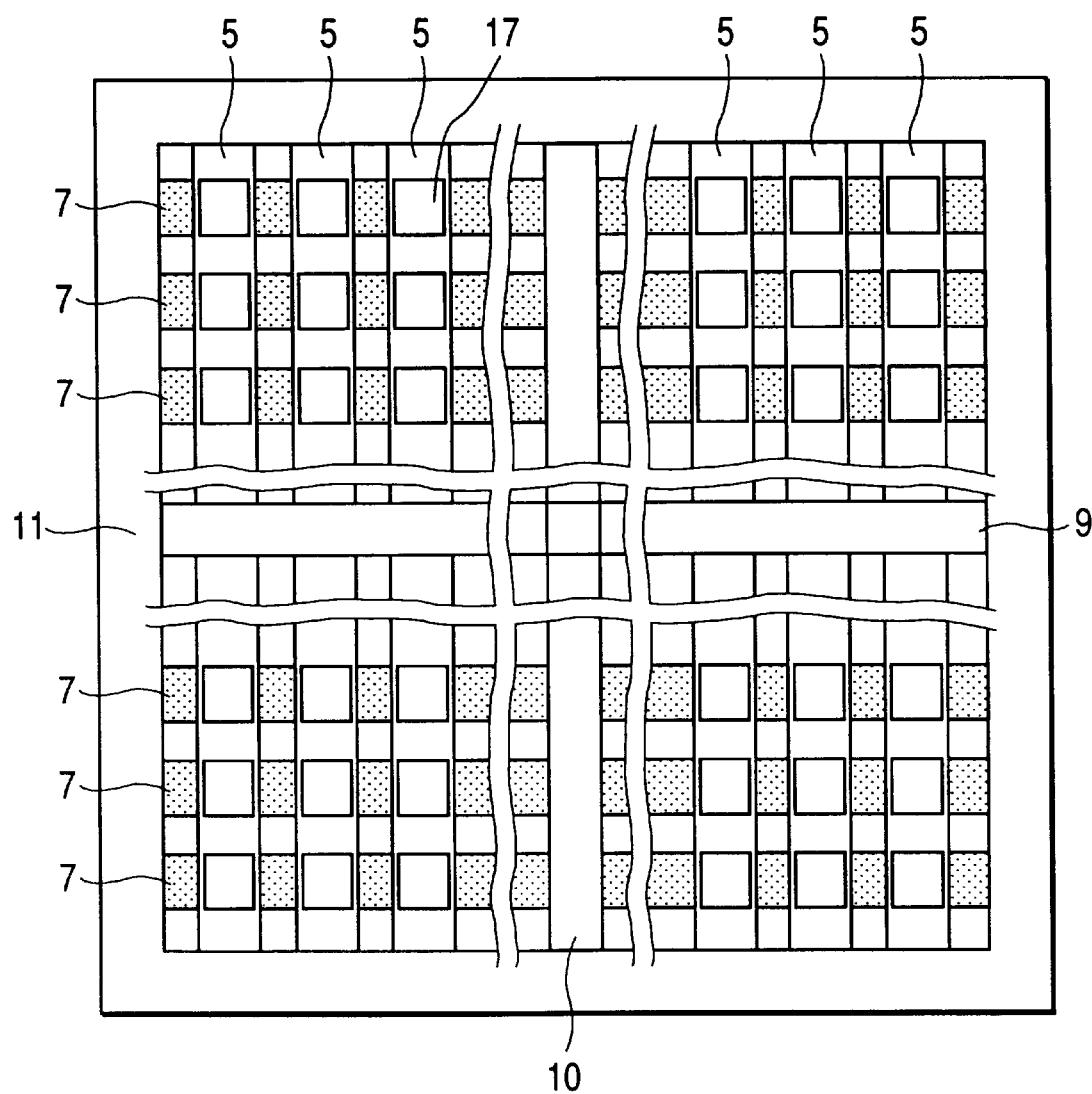
FIG. 19 is an overall plan view of a magnetic thin-film memory of the present invention.

FIG. 19 is a top plan view of an example of a magnetic thin-film memory of the present invention. Each memory cell 17 is a storage unit having one magnetic thin-film memory element. In this figure only parts of many memory cells 17 are illustrated and the other cells are omitted. Memory cells 17 are arranged in series to compose each of sense lines 7. The sense lines are arranged horizontally in FIG. 19, but the sense lines may be arranged vertically.

Word lines 5 are placed immediately above the memory cells 17 through an insulating layer not illustrated in the same figure and are arranged perpendicular to the sense lines. There are some cases in which word lines 6 are provided below the sense lines 7, though not illustrated.

The word lines are provided mainly for recording, while the sense lines mainly for reading of regenerated signals. Driving circuit areas 9, 10, 11 are provided at the both ends of each word line and each sense line, and semiconductor devices including a decoder, a driver, etc. for selectively driving each word line and each sense line are provided in these areas. A sense amplifier for amplifying the regenerated signals is incorporated at the end of sense line.

A preferred substrate for the magnetic thin-film memory elements of the present invention is a silicon substrate. This is because the above-stated semiconductor devices can be made on the common substrate to the memory elements of the present invention.

Figure 15:
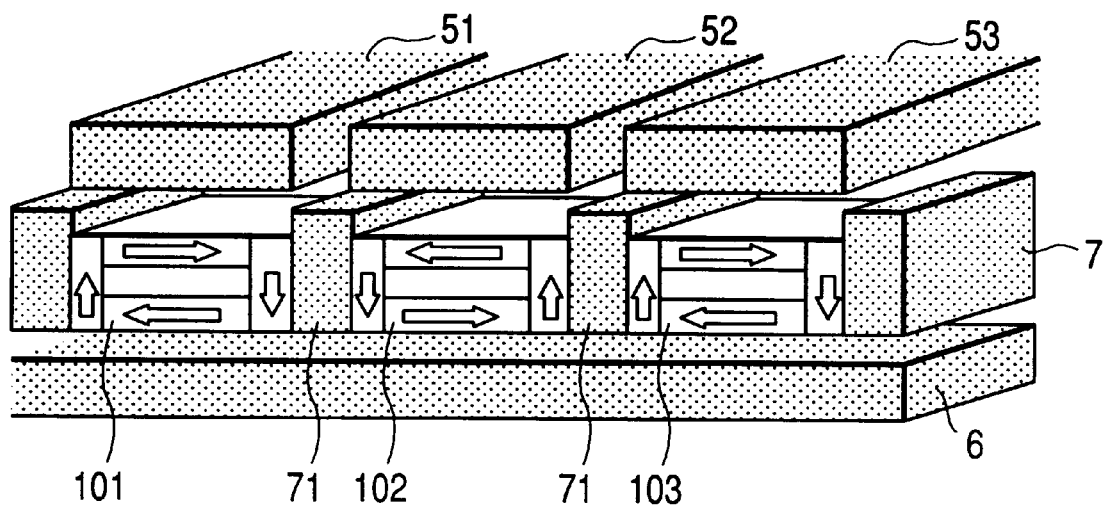
FIG. 15 is an explanatory drawing to stereoscopically show an example of array structure of magnetic thin-film memory elements according to the present invention.

The array example of memory cells in the memory shown in FIG. 19 will be described more specifically. FIG. 15 stereoscopically shows the structural example in which the magnetic thin-film memory elements of the present invention shown in FIG. 4 are arrayed in series.

This figure shows a portion with three memory cells extracted, in which memory elements 101, 102, 103 are arrayed in series and in which word lines 5, including 51, 52, 53, are formed above the respective memory elements. Another word line 6 is provided below the memory cells.

Although not illustrated in the same figure, an insulating layer fills the space between each word line and memory cell, so as to prevent the word line from electrically conducting to the memory cell.

The memory cells are connected by good conductor 71 and a sense line 7 is formed by connecting the memory elements 101, 102, 103 in series. This good conductor 71 is material having a lower resistivity than those of the first magnetic layer and second magnetic layer and is preferably Al or the like, for example. The electric current is allowed to flow through the sense line during regeneration, so that the current passes through the third magnetic layer. It is not preferable that the magnetization state of the third magnetic layer should affect the regenerated signal and, in order to avoid it, the length of the third magnetic layer along the direction of sense line is preferably not less than 500 Å.

Figure 16:
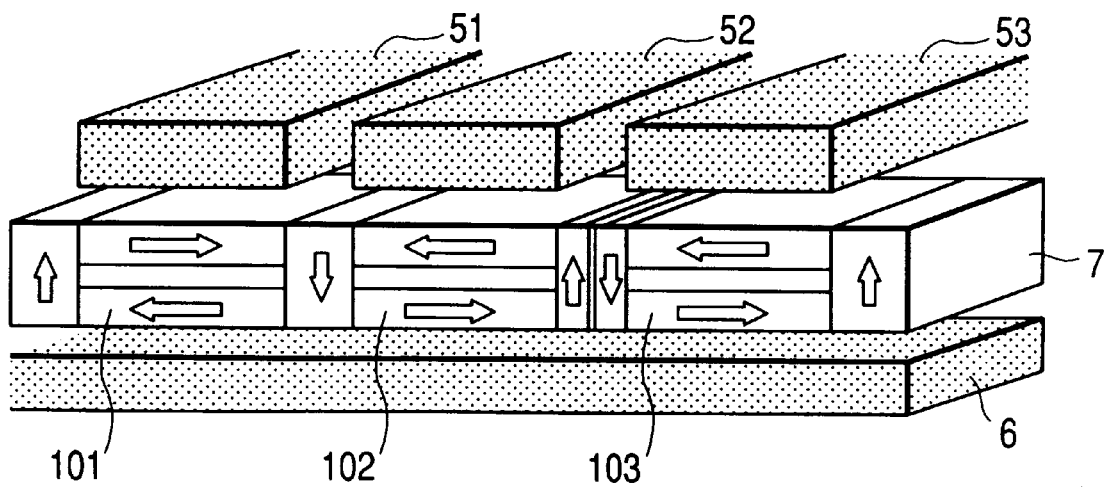
FIG. 16 is an explanatory drawing to stereoscopically show another example of array structure of magnetic thin-film memory elements according to the present invention.
Figure 17:
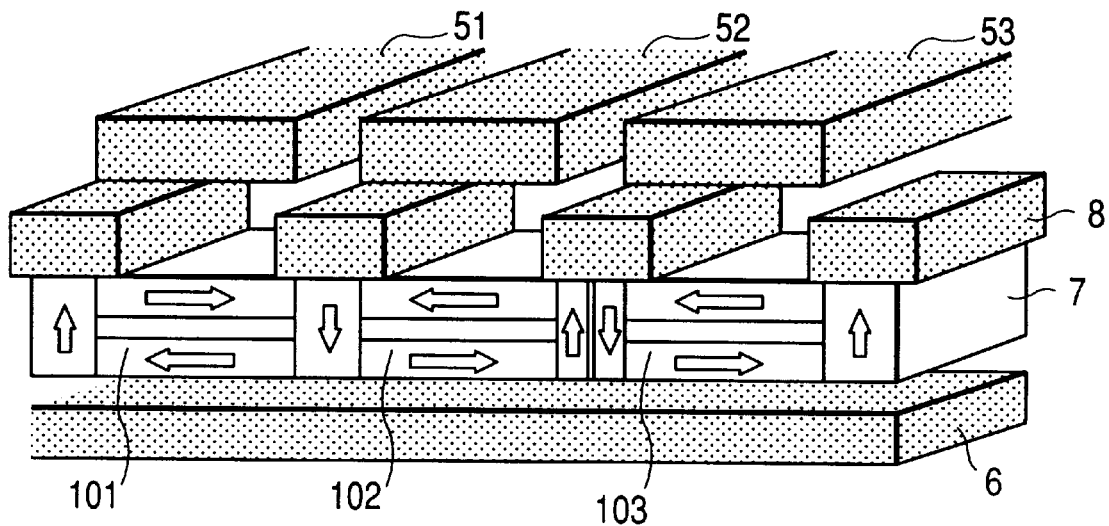
FIG. 17 is an explanatory drawing to stereoscopically show still another example of array structure of magnetic thin-film memory elements according to the present invention.

Other examples of array structures of the magnetic thin-film memory elements according to the present invention are illustrated in FIG. 16 and in FIG. 17. The structure of FIG. 15 has the good conductor 71 between the memory cells, whereas the example of the structure shown in FIG. 16 is constructed so that the third magnetic layer fills the spaces between the memory elements arranged in series without providing the good conductor 71. The third magnetic layer is also provided for the purpose of separating the elements one from another, so that this structure is more preferable because it is simpler than the structure of FIG. 15.

Figure 18:
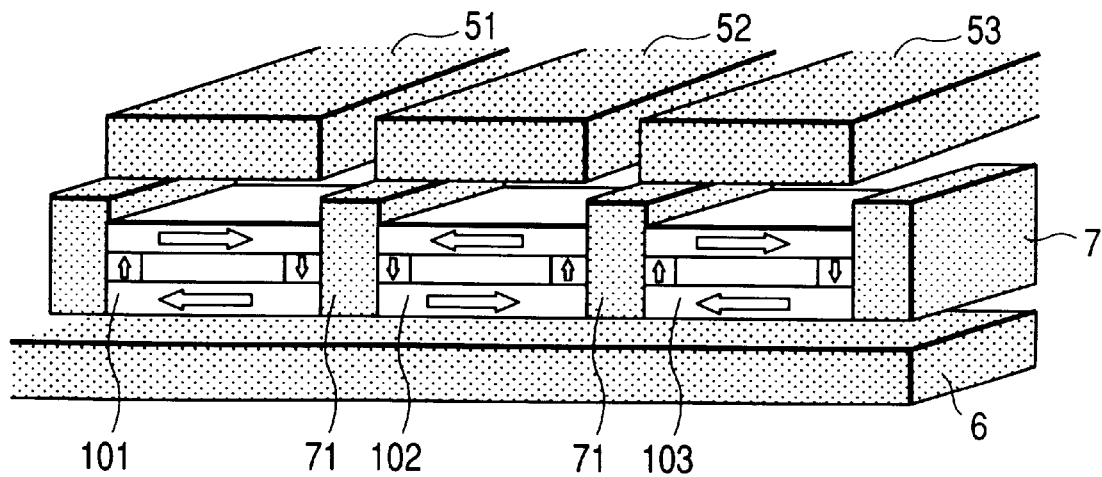
FIG. 18 is an explanatory drawing to stereoscopically show still another example of array structure of magnetic thin-film memory elements according to the present invention.

Since the third magnetic layer is the magnetic material, it has a relatively larger resistance than the wire material of Al or the like, however. When the cells are connected in series, the resistance of the wire part except for the memory cells becomes large and there are some cases where sufficient regenerating output is not achieved. In order to prevent this, a good conductor 8 with a lower resistivity than those of the first magnetic layer and the second magnetic layer may be provided above the third magnetic layer as shown in FIG. 17. This arrangement can decrease the resistance between memory cells, so that the regenerating output can be improved. This good conductor 8 is preferably material having a low resistivity, such as Al. A more prominent effect can be achieved when the good conductor 8 is formed in contact with the memory elements at the both ends to such an extent as not to degrade the regenerated signal, e.g. in contact with parts of the second magnetic layer in the example of FIG. 17. Another example of array structure of the magnetic thin-film memory elements of the present invention is shown in FIG. 18. In this case the memory elements have the structure of the element shown in FIG. 8. In this case the memory elements are connected by good conductor 71, in the same manner as in FIG. 15, so as to decrease the resistance of wire part. As shown in FIG. 15 to FIG. 18, the word lines 5 and 6 need to be located near the magnetic layer so as to cause reversal of magnetization only in the magnetic layer of an objective memory cell. The word line 6 is illustrated in FIG. 15, FIG. 16, FIG. 17, and FIG.

18, but the word line 6 does not always have to be provided as described hereinafter and thus can be omitted.

The magnetic thin-film memory of the present invention can retain the storage property of magnetization information even with decreasing cell sizes, different from the conventional magnetic thin-film memories. This effect of the present invention will be discussed with comparative examples.

In the magnetic thin-film memory element of the present invention, as shown in FIG. 6, the magnetization in the first magnetic layer and the magnetization in the second magnetic layer, not illustrated in the drawing, are aligned uniformly in one direction. This is because the third magnetic layer cancels the demagnetizing field in the first magnetic layer and in the second magnetic layer.

Figure 7:
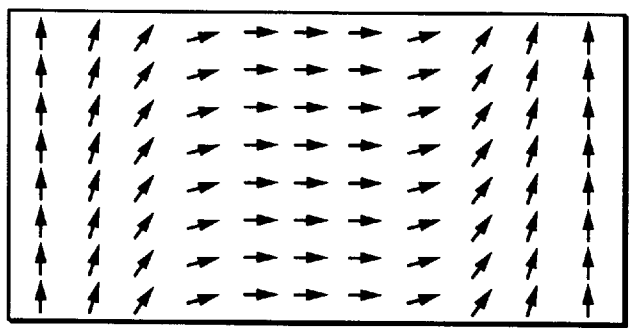
FIG. 7 is an explanatory drawing to show the detailed top plan view of the magnetization state in a magnetic thin-film memory element of a comparative example.
Figure 12A:
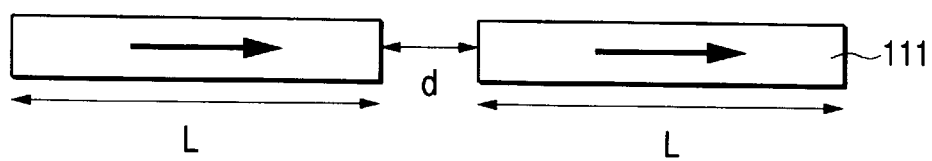

FIG. 7 is a top plan view of the magnetization state of a magnetic film of single layer having the easy axis of magnetization along the lateral direction as shown in FIG. 12A, as a comparative example. A large demagnetizing field is produced inside the magnetic film of single layer, so that spins gradually rotate as approaching the end faces as shown in FIG. 7, so as to be oriented in parallel to the end faces.

Figure 12B:
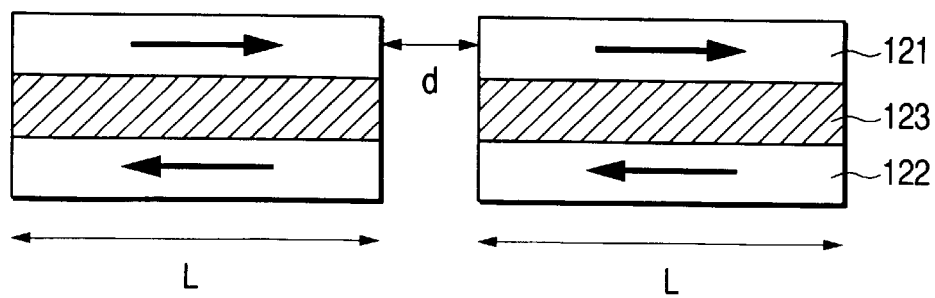

Another comparative example is a magnetic film of two layers in the antiparallel magnetization state, which is a two-layer magnetic film achieved by extracting the third magnetic layer from the magnetic thin-film memory of the present invention shown in FIG. 12B. The magnetization state is slightly improved as compared with the monolayer magnetic film, because the magnetization in one layer acts in the direction to reduce the demagnetizing field in the other layer. Also in this case, however, plus or minus magnetization is aligned at the end faces and mutual repulsion between them increases the energy. This causes spins to gradually rotate from the center toward the end faces and finally be oriented in parallel to the end faces thereat.

As described above, the magnetic films in the structures of the comparative examples shown in FIG. 12A and FIG. 12B have the big problem that it becomes difficult to stably store the magnetization information because of nonuniform directions of spins and thus the magnetization information is deleted.

The degree of this nonuniformity of spin orientation is dependent on the strength of the demagnetizing field produced inside the magnetic layer and storage performance of magnetization will be degraded with increase in the strength of the demagnetizing field. The strength of the demagnetizing field can be estimated roughly by assuming that the magnetic film is an ellipsoid of a disk shape.

Figure 13A:
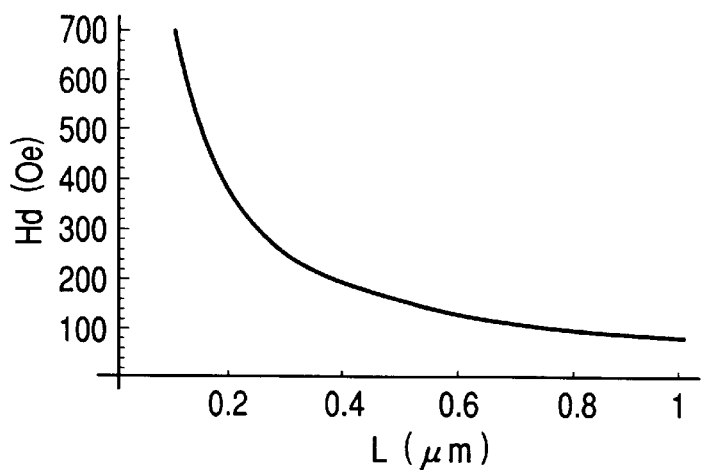

FIG. 13A shows the relation of demagnetizing field Hd of the monolayer magnetic film 111 shown in FIG. 12A against length L of magnetic layer, as a comparative example. This relation was obtained under the following conditions; the width of the magnetic layer was equal to the length thereof, the value of saturation magnetization was 800 emu/cc, which was a typical value of permalloy ($Ni_{80}Fe_{20}$), and the thickness of the magnetic layer was 100 Å. It is seen that the demagnetizing field takes very large values not less than 100 [Oe] in the range where the length L of magnetic layer is not more than 1 μm.

Figure 13B:
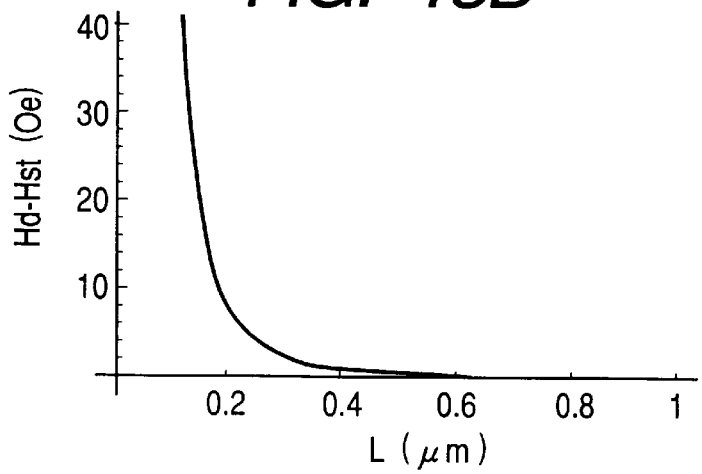

FIG. 13B shows the same relation for the two-layer film shown in FIG. 12B, as another comparative example. Also in this case, the conditions were as follows; the width of the magnetic layers was equal to the length thereof, the saturation magnetization was 800 emu/cc, the thicknesses of the magnetic layer 121 and magnetic layer 122 both were 100 Å, and the thickness of the non-magnetic layer 123 was 20 Å. In the case of this two-layer film, the demagnetizing field appearing in one magnetic layer 121 was relieved by static magnetic field Hst induced by the other layer 122, and, therefore, the magnetic field Hd−Hst effectively exerted on the inside of the magnetic field was obtained. Here, Hst was obtained under the assumption that the magnetization existed without spin curling at the end faces. In practice there is spin curling, so that Hst becomes smaller than the obtained value. Still, it is seen that Hd−Hst suddenly increases in the range where the length L of the magnetic film is not more than 0.4 μm.

The coercive force of the second magnetic layer is preferably in the range of 5 [Oe] to 50 [Oe] both inclusive from the constraint of the magnitude of word current and more preferably in the range of approximately 10 [Oe] to 30 [Oe] as described hereinafter. When the strength of the demagnetizing field is approximately one tenth of the coercive force, it is difficult to achieve stable preservation of magnetization. Therefore, even if the antiparallel magnetization state of the two-layer magnetic film of the prior art is employed, it is difficult to achieve stable preservation of magnetization with memory cells having the length of magnetic member being 0.4 μm; it is also seen that the stable preservation of magnetization is impossible with the conventional magnetization structure at the length of 0.2 μm where the demagnetizing field exceeds 10 [Oe].

Figure 13C:
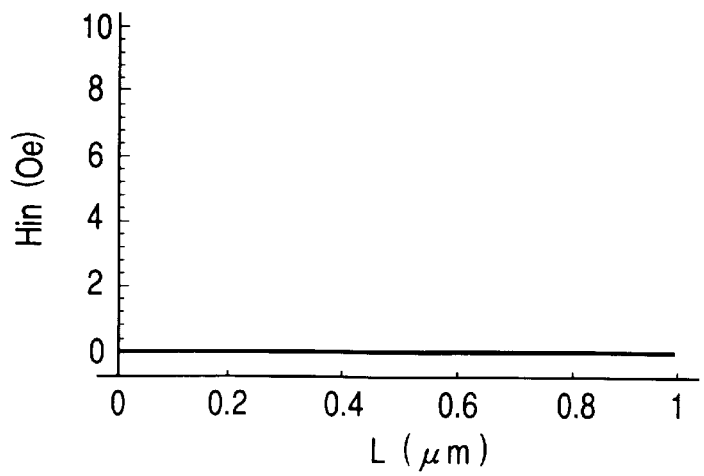

In contrast with it, FIG. 13C shows the demagnetizing field (the magnetic field Hin occurring inside the magnetic member) for the magnetic film of the closed magnetic circuit configuration of the present invention including the third magnetic layer in addition to the structure of FIG. 13B. It is seen that the demagnetizing field is 0, irrespective of the length L of magnetic film, and the demagnetizing field that could impede alignment of magnetization is effectively suppressed. With the magnetic thin-film memory element of the present invention, the stable preservation of magnetization information can be achieved even in the case of high integration of memory cells of microstructure accordingly. It is also seen that the memory element of the present invention enhances the effect with the memory cell where the first magnetic layer and second magnetic layer have the length of not more than 0.4 μm and that the effect of the present invention becomes remarkable where the length is not more than 0.2 μm. This means that the magnetic thin-film memory element of the present invention can be minimized down to the size that is permitted by production steps.

Further, the magnetic thin-film memory element of the present invention has the feature that no leakage magnetic field appears outside. Because of this, recording/regeneration of information can be carried out more stably even in the small cell size.

Figure 14A:
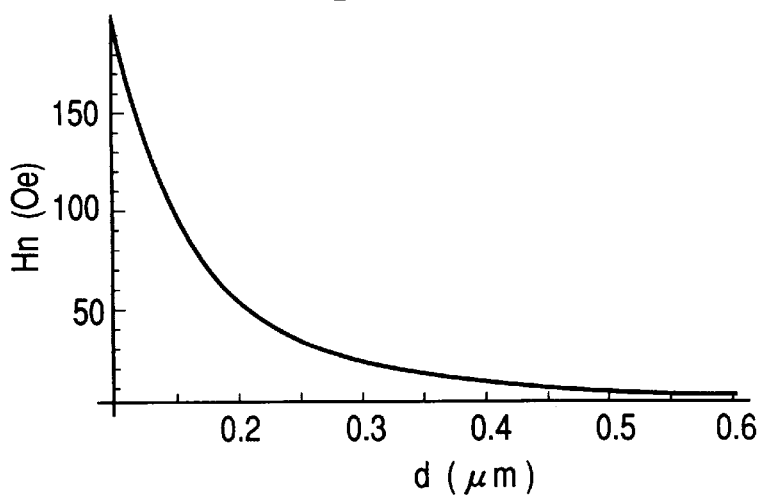
Figure 14B:
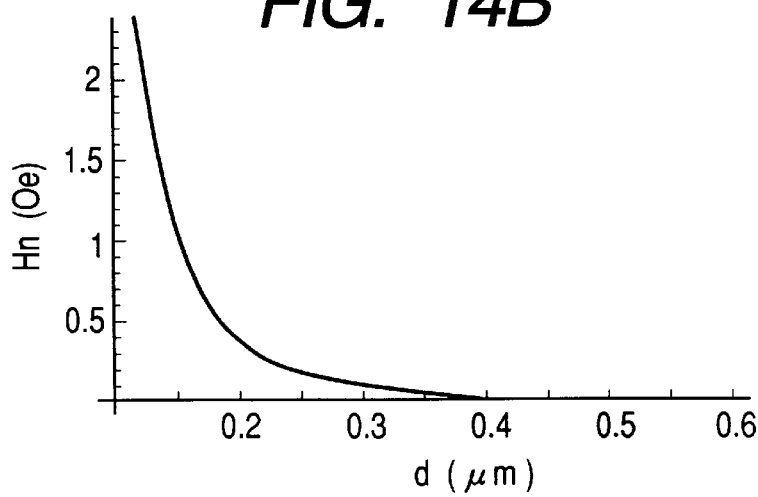
Figure 14C:
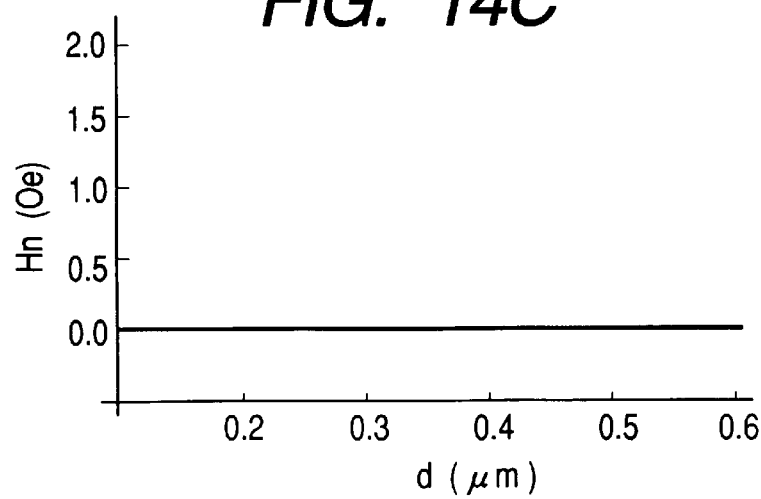

This effect of the present invention will be described together with comparative examples in FIGS. 14A–14C. FIG. 14A and FIG. 14B are plots of strength of in-plane magnetic field Hn generated at the side face of an adjacent memory element, against distance d between magnetic films where memory elements of the conventional monolayer film or two-layer film shown in FIG. 12A or in FIG. 12B, respectively, are arranged in series. Similarly, FIG. 14C is a plot of strength of in-plane magnetic field Hn generated at the side face of an adjacent memory element against distance d between the first magnetic layers of adjacent memory elements or between the second magnetic layers thereof, for the magnetic thin-film memory elements of the present invention as shown in FIGS. 15–18. The length of the all magnetic films was 0.2 μm.

It is apparent from FIG. 14A that in the monolayer magnetic film of the comparative example the magnetic field of not less than 5 [Oe] is produced in the range where the distance d between memory elements is not more than 0.6 μm; it is also apparent from FIG. 14B that in the two-layer magnetic film of another comparative example the magnetic field of not less than 1 [Oe] is produced in the range where the distance d between memory elements is not more than 0.1 μm. The coercive force of the second magnetic layer is preferably in the range of 5 [Oe] inclusive to 50 [Oe] inclusive and more preferably in the range of approximately 10 [Oe] to 30 [Oe]. As described hereinafter, the preferred magnetic field during regeneration is a half or less of that during recording, and, therefore, the reversal of magnetization is induced more preferably by the generated magnetic field of 5 [Oe] to 20 [Oe] inclusive.

This means that the magnetic field of 1 [Oe] induced by the adjacent memory element can be equal to approximately one tenth during recording or approximately one fifth during reproduction, of the magnetic field generated by the word line. Therefore, it could be a big cause of malfunction during recording or regeneration, particularly during regeneration. With the conventional cell structures, it is difficult to decrease the width between cells in order to increase the degree of integration and it is impossible to achieve high integration accordingly.

In contrast, in the magnetic thin-film memory element of the present invention there is no leakage magnetic field in the adjacent cell as shown in FIG. 14C, so that stabler recording/regeneration of information can be performed. It is also seen that the effect of the present invention is great in the range where the distance between the second magnetic layers of adjacent memory elements is not more than 0.6 μm; the effect of the present invention becomes greater in the range of the distance being not more than 0.1 μm.

In the above description, the two-layer magnetic film of one comparative example, which was a layer obtained by excluding the third magnetic layer from the magnetic thin-film memory of the present invention, was described under the assumption that the two layers were in the antiparallel magnetization state. This two-layer magnetic film takes the antiparallel magnetization state of the two layers depending upon the thickness of the non-magnetic layer, but the parallel and antiparallel states will appear alternately with increasing thicknesses of the non-magnetic layer. The two-layer magnetic film thus has a problem that the thickness margin of the non-magnetic layer for antiparallel magnetization is narrow. It is thus difficult to stably realize the antiparallel magnetization state in many memory elements on one memory.

In contrast with it, with the memory constructed of the memory elements of the present invention, the antiparallel magnetization state can be realized stably in many memory elements, not much depending upon the thickness of the non-magnetic layer, and preservation of information and stable recording/regeneration can also be achieved in highly integrated memories.

In the case of the conventional magnetic thin-film of the comparative example, it was difficult to produce magnetic anisotropy sufficient for orientation of magnetization in the in-plane direction where the shape was one having the width and length equal to each other, for example, where the shape was a square or a circle on the top plan view. In the conventional magnetic thin-film memory the magnetization orientation was realized by shape anisotropy by setting the ratio of length to width to 2 to 3 or more, accordingly. In this case, however, there was the problem that the so-called superparamagnetism phenomenon that magnetism disappeared even near the room temperature was likely to occur because of the spin disturbance as described previously, so as to make preservation of magnetization unstable.

In contrast with it, in the case of the magnetic thin-film memory of the present invention, relatively large anisotropy appears because of the ring loop even in the case where the shape of the magnetic thin-film is square. This assures stability of information even where the memory cells are square, so that the degree of integration can be increased considerably. If the magnetic thin-film memory of the present invention is possibly used under conditions of relatively high temperatures, for example, it may be contemplated that the ratio of length to width is made greater than 1 to achieve shape anisotropy so as to enhance anisotropy and increase the storage performance more. In this case the effect of shape anisotropy becomes distinct where the ratio of length to width is not less than 2. Therefore, the ratio of length to width of the magnetic thin-film memory element is preferably not less than 2. In this case the third magnetic layer should better be formed along the longitudinal direction.

Another method for inducing magnetic anisotropy is a method for applying the magnetic field during formation of film, which is easy and effective. This method is carried out by applying the magnetic field along one in-plane direction to the substrate by use of permanent magnet or the like during deposition of the first magnetic layer and second magnetic layer. It is preferably executed by applying the external magnetic field having the intensity of not less than 10 [Oe]. More preferably, the magnetic field of not less than 50 [Oe] is applied along one direction during deposition. In this case the third magnetic layer is better formed along the direction in which the magnetic field is applied.

[Recording Method]

Next described is an example of the recording method using the magnetic thin-film memory elements according to the present invention. Each memory cell of the present invention is provided with at least two electrode lines of word line 5 such as 51, 52, or 53 and sense line 7 as shown in FIG. 19 and FIG. 15 to FIG. 18, and a magnetic field is generated according to the Ampere's law when a current is allowed to flow through each line. Since these two electrode lines are perpendicular to each other, magnetic fields generated thereby are also perpendicular to each other. A magnetic field applied to the magnetic layers of memory cell is the vector sum of these orthogonal magnetic fields. When in this state a magnetic field strong enough to reverse magnetization in the second magnetic layer is applied by the current through the word line, the magnetization in the second magnetic layer will be oriented in a desired direction, so as to achieve recording. It is thus possible to perform recording of only specific cells selected from the many cells on the matrix. Propriety of reversal of magnetization is described by asteroid curve of magnetic layer.

The second magnetic layer needs to have high coercive force, because it is preferred to preserve the magnetization state stably. On the other hand, it is, however, also preferred to reverse the magnetization in the second magnetic layer by a weak magnetic field generated by a small current in order to prevent disconnection of word line due to electromigration and in order to decrease the dissipation power. For this purpose, the second magnetic layer needs to have low coercive force. The coercive force of the second magnetic layer is thus determined so as to satisfy the both requirements. Specifically, the coercive force of the second magnetic layer is preferably in the range of 5 [Oe] inclusive to 50 [Oe] inclusive. More preferably, the coercive force of the second magnetic layer is in the range of 10 [Oe] inclusive to 30 [Oe] inclusive.

Since the fundamental recording and below-described regeneration of the present invention can be done using the word line 5 and sense line 7 as described above, the word line 6 shown in FIG. 15 to FIG. 18 does not always have to be provided. However, the recording and below-described regeneration may be carried out using the word line 6 perpendicular to the word line 5 in order to generate a greater magnetic field. In another permissible arrangement the word line 5 above the memory element is omitted and the word line 6 below the memory element is positioned in the direction perpendicular to the sense line 7. When the semiconductor devices and memory elements are made on a common substrate, production is easier where the word lines are made after deposition of memory elements, however. Therefore, the memory is made preferably in the order of substrate/first magnetic layer/non-magnetic layer/second magnetic layer/insulating layer/word lines.

In another permissible arrangement a buffer layer is provided on the substrate and the memory elements are formed thereon in order to control the coercive force, for example. This provision of the buffer layer suppresses variation in coercive force between different memory cells or facilitates control of absolute value of coercive force. Preferred materials for the buffer layer are insulating materials, for example SiN.

[Regenerating Method]

Next described is an example of the regenerating method using the magnetic thin-film memory of the present invention.

The magnetic thin-film memory element of the present invention exhibits the giant magneto-resistance (GMR) effect by spin dependent scattering and the resistance thereof is low in the parallel magnetization state of the first magnetic layer and second magnetic layer but high in the antiparallel magnetization state thereof. During regeneration a current weaker than during recording is allowed to flow through the word line above or below the magnetic thin-film memory element, thereby generating a weaker magnetic field. This magnetic field is arranged to have such intensity as to reverse only the magnetization in the first magnetic layer but not to reverse the magnetization in the second magnetic layer, in order to prevent the magnetization information stored from being deleted during regeneration. The coercive force of the first magnetic layer needs to be smaller than that of the second magnetic layer. In order to ensure the sufficient margin of generated magnetic field, the coercive force of the first magnetic layer is preferably not more than a half of that of the second magnetic layer, and more preferably not more than one third thereof. The current is set so that the magnetic field induced by the word line is greater than the magnetic field for reversal of magnetization in the first magnetic layer but smaller than the magnetic field for reversal of magnetization in the second magnetic layer.

Figure 20A:
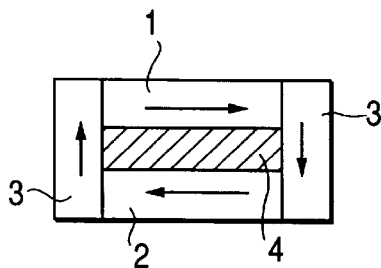
FIGS. 20A and 20C are drawings to show the magnetization storage states of "0" and "1" in the magnetic thin-film memory element of the present invention.
Figure 20C:
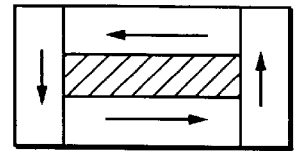

FIGS. 20A to 20D are drawings to show magnetization states during storage and during regeneration of magnetization of "0" and "1" in the magnetic thin-film memory element of the present invention. FIGS. 21A to 21C show time responses of magnetic field H and resistance R when the leftward magnetic field is applied to the memory elements of FIGS. 20A to 20D. For example, let us suppose the magnetization in the second magnetic layer 2 is retained in the leftward state as shown in FIG. 20A.

Figure 20B:
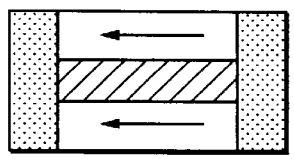
FIGS. 20B and 20D are drawings to show the magnetization states of "0" and "1" during regeneration in the magnetic thin-film memory element of the present invention.
Figure 21A:
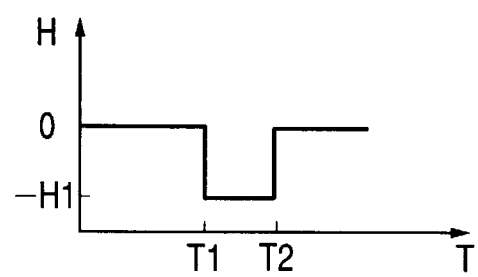
Figure 21B:
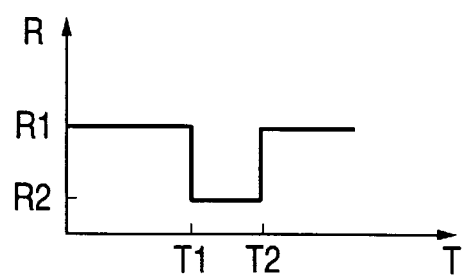
Figure 21C:
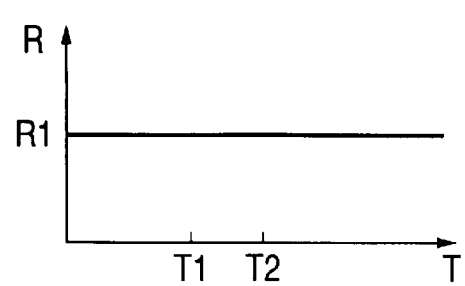

When the leftward magnetic field −H1 is applied at the time T1 as shown in FIG. 21A, the magnetization in the first magnetic layer 1 is inverted from rightward to leftward as shown in FIG. 20B. The resistance varies from a large value R1 to a small value R2 as shown in FIG. 21B. When the magnetic field becomes 0 at the time of T2, the magnetic thin-film memory of the present invention again forms the ring loop to return the first magnetic layer into the rightward magnetization state of FIG. 20A, so that the resistance comes back to R1.

Next, let us suppose the magnetization in the second magnetic layer is rightward as shown in FIG. 20C. In this case, since the magnetization in the first magnetic layer is leftward, the direction of magnetization in the first magnetic layer is not inverted upon application of the leftward magnetic field −H1 and no resistance change occurs (FIG. 21C). Therefore, the magnetization state of the second magnetic layer can be detected by measuring a difference between currents or between voltages with and without the resistance change. When the magnetization in the first magnetic layer is parallel to that in the second magnetic layer, the third magnetic layer is stabilized in the magnetization configuration of the most stable state during application of the magnetic field to the first magnetic field and the second magnetic field.

Since in the magnetic thin-film memory of the present invention the magnetization in the first magnetic layer is always antiparallel to that in the second magnetic layer after recording, regeneration can be done by only the magnetic field of one direction as described above. On the other hand, in the case of the two-layer magnetic film of the conventional structure as a comparative example achieved by excluding the third magnetic layer from the magnetic thin-film memory of the present invention, it is difficult to stably realize the antiparallel magnetization state in many memory elements on one memory as described above. In contrast with it, the antiparallel magnetization state can be realized stably in the many memory elements on the memory constructed of the memory elements of the present invention, so that the invention can realize the regenerating method that permits quick access by one pulse current as described above.

Figure 22A:
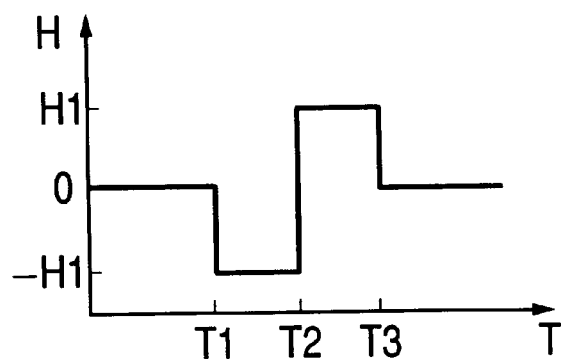
Figure 22B:
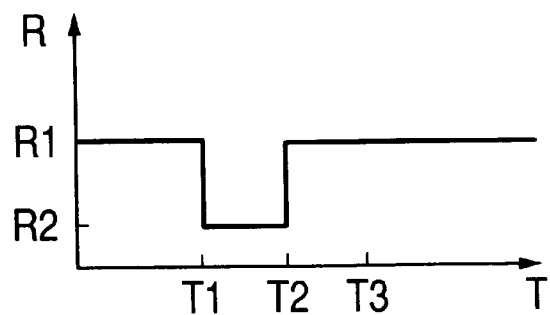
Figure 22C:
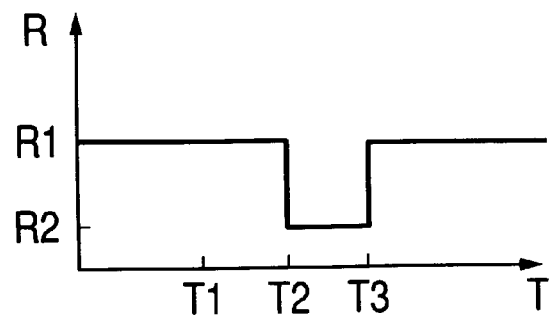

Described next is another example of the regenerating method using the magnetic thin-film memory of the present invention. The above-stated method was the example in which the current of the fixed direction was allowed to flow through the word line so as to generate only the leftward magnetic field, but a reverse current may also be allowed to flow in a subsequent period so as to generate the rightward magnetic field H1. FIGS. 22A to 22C are drawings to show time responses of magnetic field H and resistance R where the leftward magnetic field is applied to the memory element of the present invention and thereafter the rightward magnetic field is applied thereto. Suppose the leftward magnetic field −H1 is applied during the period between the times T1 and T2 and the rightward magnetic field during the period between the times T2 and T3. In the case where the magnetization state is that of FIG. 20A, the resistance R varies from the low value R2 to the high value R1 at the time T2 of reversal of direction of magnetic field as shown in FIG. 22B.

Figure 20D:
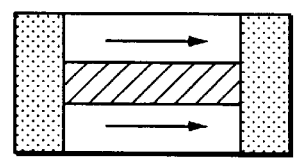

In the case where the magnetization state is that of FIG. 20C, the magnetization direction of the first magnetic layer 1 is reversed from leftward to rightward during the period between T2 and T3 for application of the rightward magnetic field as shown in FIG. 20D. Thus the resistance R varies from the high value R1 to the low value R2 at the time T2 of reversal of direction of magnetic field as shown in FIG. 22C. Namely, change in the resistance is observed in either of the magnetization states by this regenerating method. Therefore, more accurate detection can be done by measuring values of time differential of resistance at the time T2, though more time is necessary for regeneration.

The above described the regeneration of only one cell, but in practice there are many cells placed on the matrix and it is necessary to regenerate only the magnetization information of specific cells. In order to achieve it, as in recording, the current is allowed to flow through the sense line connected to each objective cell and the current is also allowed to flow through the word line perpendicular to the sense line at the same time as it, thereby generating the magnetic field; the regeneration is thus achieved by applying the magnetic field outside the asteroid curve of magnetic field to only the first magnetic layer of the objective cells. In an alternative way, only the first magnetic layer of the specific cells can also be inverted using the two perpendicular word lines.

The resistance change is measured at the both ends of a sense line that connects the memory elements arranged vertically or horizontally in series. Specifically, the semiconductor devices for detecting the resistance change are arranged in the portion of 11 or 10 shown in FIG. 19, so that information can be regenerated in order from the cells arranged on one sense line.

In the magnetic thin-film memory element of the present invention the magnetization in the first magnetic layer is always opposite to that in the second magnetic layer without application of magnetic field; therefore, the resistance of the other memory cells than accessed cells is always constant. Accordingly, the regenerating method using the magnetoresistive element of the present invention has no variation in resistance and thus permits accurate detection with less noise, as compared with the conventional method with unfixed magnetization states of memory cells.

The recording/regeneration of the present invention uses the pulse current; if the time width of this pulse is too long the access speed will become low and the dissipation power will increase. If it is too short conversely, appropriate recording or regeneration will not be performed. The time width of one pulse is thus preferably between 1 ns and 500 $\mu$s both inclusive and more preferably between 4 ns and 100 ns both inclusive. If the current is too large electromigration of wiring material will occur to increase the risk of disconnection. If the current is too small good recording or regeneration will not be realized in some cases. The current is determined also taking account of the cross section of wire, and it is usually preferably between 10 $\mu$A and 500 mA both inclusive. The current is more preferably between 50 $\mu$A and 10 mA both inclusive.

EXAMPLE 1

The magnetic thin-film memory element of the present invention was fabricated and the operation thereof was checked. Deposition and processing of memory element was conducted using a magnetron sputter apparatus and a focus ion beam apparatus. The sputter deposition was carried out as follows; a sputter chamber was evacuated to the high vacuum of $5\times10^{-5}$ Pa, thereafter Ar gas was introduced as a sputter gas up to 0.1 Pa, and deposition was effected on Si substrate successively to form a film of $Ni_{14}Fe_{13}Co_{73}$ (in the thickness of 80 Å) as the first magnetic layer, a film of Cu (in the thickness of 20 Å) as the non-magnetic layer, and a film of $Fe_{20}Co_{80}$ (in the thickness of 100 Å) as the second magnetic layer thereon. Control of thickness of each layer was done by adjusting the sputter power. The element compositions of the magnetic layers were controlled by adjusting the sputter power of each of targets of Ni, Fe, and Co.

Then the film was processed in the size of 0.2 $\mu$m×0.4 $\mu$m and a film of $Ni_{50}Fe_{50}$ as the third magnetic layer was deposited and processed in contact with the lateral surface along the longitudinal direction of the film, thus producing the magnetic thin-film memory element of the present invention in the structure of FIG. 4. The width of the third magnetic layer was 0.2 $\mu$m, which was the same as that of the first and second magnetic layers, and the length of the third magnetic layer was 0.3 $\mu$m. The thickness of the third magnetic layer was 200 Å, which was the same as the total thickness of the first and second magnetic layers and the non-magnetic layer. The third magnetic layer was deposited on the both lateral surfaces so as to obtain the same configuration as shown in FIG. 4. After that, In was deposited on the both ends of the third magnetic layer to form electrodes for measurement of resistance. Then a layer of SiN was deposited as a protective layer 5000 Å thick.

Figure 23A:
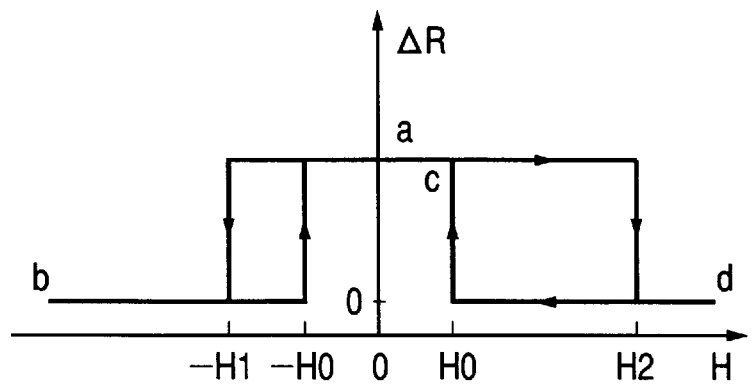
FIGS. 23A, 23B, and 23C are drawings to show magneto-resistance change ΔR of the magneto-resistive element of the present invention shown in Example 1 against applied magnetic field H.
Figure 23B:
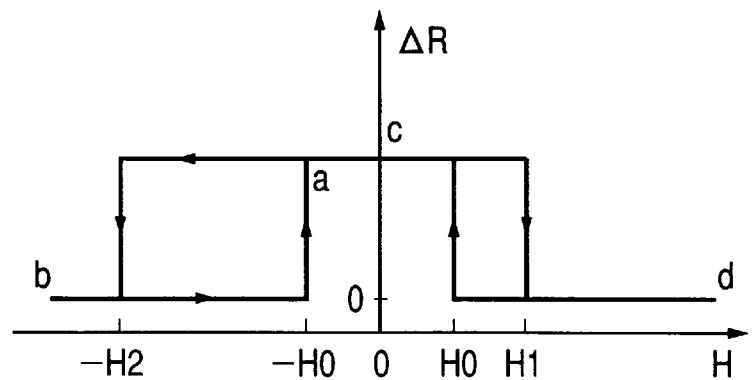
Figure 23C:
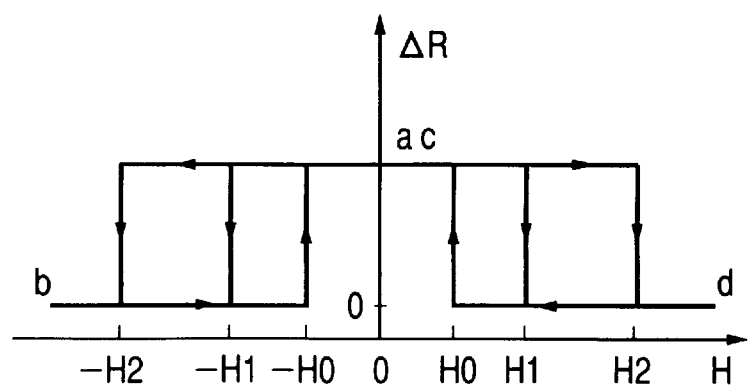

The resistance change of this element was measured by applying the magnetic field in the in-plane direction parallel to the film plane. FIGS. 23A to 23C are plots of difference $\Delta R$ from the resistance where the sufficient magnetic field was applied, against magnetic field H.

As shown in FIG. 23A, when the magnetic field was applied in the minus direction, $\Delta R=0$ at the magnetic field of −H1; thereafter no change appeared even with application of stronger magnetic field. As the magnetic field was then decreased, the resistance started increasing at the magnetic field of −H0, weaker than −H1, back to the original value. When the magnetic field was applied in the plus direction this time, $\Delta R=0$ at the magnetic field of H2; thereafter, no change appeared with increase in the strength of magnetic field. As the magnetic field was then decreased, the resistance started increasing at the magnetic field of H0, weaker than the magnetic field of H2, back to the original value.

When the magnetic field was then applied again in the minus direction, $\Delta R=0$ at the magnetic field of −H2 this time as shown in FIG. 23B. Thereafter, no change occurred with increase in the strength of magnetic field. As the magnetic field was then decreased, the resistance started increasing at the magnetic field of −H0 back to the original value. When the magnetic field was further applied in the plus direction this time, $\Delta R=0$ at the magnetic field of H1. Thereafter, no change appeared with increase in the strength of magnetic field. When the magnetic field was then decreased, the resistance started increasing at the magnetic field of H0 back to the original value.

The resultant loop was that of the shape shown in FIG. 23C. It is presumed that transition among the magnetization states shown in FIGS. 20A to 20D occurred in the order of a, b, a, d, and c in the figure of FIG. 23A; and from the magnetization state of c to the magnetization states of b, a, d, and a in order in the figure of FIG. 23B. The intensities of the respective magnetic fields were H0=3 [Oe], H1=7 [Oe], and H2=16 [Oe], and $\Delta R/R$ was 11%. After 1000 repetitions of the loop of FIG. 23C, the magnetic field and resistance were measured in the same manner and the values of the magnetic field, the resistance, and the resistance change were the same as those in the first measurement.

It was thus verified that the magnetic thin-film memory element of this example was able to record information according to the directions of magnetic field with application of the magnetic field of 16 [Oe] and regenerate the recorded information with application of the magnetic field of 7 [Oe] and that it was able to realize stable information recording/regeneration with excellent repetitive recording/regeneration durability.

COMPARATIVE EXAMPLE 1

In order to confirm the effect of the present invention, a memory element was made in the same structure as in Example 1 except that the third magnetic layer was excluded from the magnetic thin-film memory element of Example 1. After that, the change in resistance was observed under application of magnetic field in the same way. In the first measurement the loop of magnetic field vs. resistance similar to that of FIG. 23C was obtained, but it was found that the magnetic field corresponding to H2 had the width of 5 [Oe] to 10 [Oe] and the magnetic field corresponding to Hi had the width of 2 [Oe] to 7 [Oe] and that the magnetization in the second magnetic layer became unstable with application of the magnetic field strong enough to regenerate the information. With repetitions of the magnetic field loop, the shape of loop became gradually broken and no loop appeared in the 58th measurement at all, so as to disable recording or regeneration.

EXAMPLE 2

The magnetic thin-film memory element of the present invention was made in the same structure as in Example 1 except that the width and length of the magnetic films were 0.2 μm×0.3 μm and that during deposition of the first magnetic layer and second magnetic layer the external magnetic field of 100 [Oe] was applied to induce magnetic anisotropy. The loop of magnetic field vs. resistance was then measured in the same manner as in Example 1. The loop obtained showed that H0=2 [Oe], H1=5 [Oe], H2=12 [Oe], and ΔR/R was 8% and that no change was observed even after 1000 repetitions.

COMPARATIVE EXAMPLE 2

In order to confirm the effect of the present invention, the memory element was next made in the same structure as in Example 2 except that the third magnetic layer was excluded from the magnetic thin-film memory element of Example 2, and the memory element was evaluated in the same manner. In this case, no loop appeared even in the first measurement and recording or regeneration was thus impossible.

EXAMPLE 3

Figure 24:
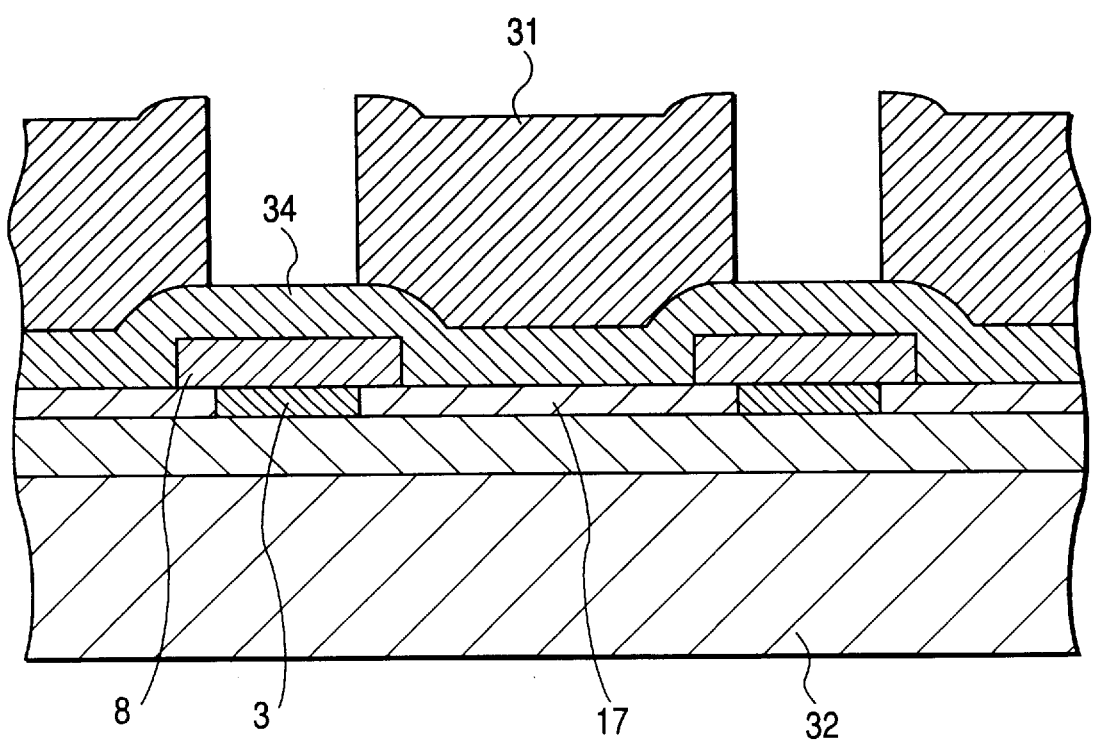
FIG. 24 is a cross-sectional view of a memory element group of the present invention shown in Example 3.

A magnetic thin-film memory of eight bits was made using the memory elements of the structure shown in FIG. 4. FIG. 24 shows a cross section of the structure. The memory was made in the following procedures.

On the Si substrate the word lines 32 were formed in the thickness 1 μm and the width 0.2 μm by depositing and processing a layer thereof by sputtering and photoetching.

Then deposition was conducted successively to form a layer of $Ni_{80}Fe_{20}$ (in the thickness of 80 Å) as the first magnetic layer, a layer of Cu (in the thickness of 20 Å) as the non-magnetic layer, and a layer of $Fe_{20}Co_{80}$ (in the thickness of 100 Å) as the second magnetic layer. The thickness of each layer and the compositions of the magnetic layers were controlled by adjusting the sputter power of each of the targets of Ni, Fe, and Co. During the deposition of the first magnetic layer and second magnetic layer the permanent magnet was used to apply the magnetic field of 100 [Oe] in one in-plane direction parallel to the film plane so that uniaxial magnetic anisotropy appeared in the magnetic layer.

Then the films were processed in the island patterns 0.3 μm wide and 0.3 μm long by the photoetching technology to form totally eight memory cells, four in series and two in parallel, thus producing the 8-bit memory. The distance between cells was 0.1 μm. In this case, the longitudinal direction was the same as the direction of application of the magnetic field during the deposition so that the easy axis of magnetization was made coincident with the direction of the ring loop. While keeping the photoresist film remaining on the second magnetic layer, a film of $Ni_{50}Fe_{50}$ was deposited as the third magnetic layer 3 in contact with the lateral surface of the first and second magnetic layers.

After that, a film of Al was deposited as good conductor 8 over the third magnetic layer. The thickness of the good conductor 8 was 400 Å and the width thereof was 0.2 μm. The good conductor was formed partly in contact with the second magnetic layer as illustrated.

After that, a film of SiN was deposited in the thickness of 400 Å as insulating layer 34. Then a film of W was deposited to form the word lines 31 0.2 μm wide and 0.2 μm thick in the vertical direction. Then Cu lines for measurement of resistance were attached by In to the both faces of element in contact with the third magnetic layer.

Then the current of 800 μA was allowed to flow through the both word line 31 and word line 32 of this element to record "0" or "1" in each of the eight cells by the magnetic field generated. Then the magnetic field was produced by allowing the current pulse of the pulse width 50 μs to flow through the word line 31 while allowing the current of 10 μA to flow through the sense line constructed of the memory cells 17 connected in series by the procedures shown in FIGS. 21A, 21B, and 21C, and it was confirmed that the information in the respective cells was able to be regenerated independently of each other. The magneto-resistance ratio at this time was approximately 7%.

EXAMPLE 4

The magnetic thin-film memory element of the present invention of FIG. 4 was made by the procedures of Example 3 in the structure in which the first magnetic layer was the film of $CO_{84}Fe_9B_7$ having the thickness of 120 Å, the non-magnetic layer was the film of Cu, the second magnetic layer was the film of Co having the thickness of 100 Å, and the third magnetic layer was the film of $Ni_{70}Fe_{30}$ having the thickness equal to the total thickness of the first magnetic layer, the non-magnetic layer, and the second magnetic layer. The non-magnetic layer of the memory element of the present invention was formed in different thicknesses varying at intervals of 5 Å in the range from 15 Å to 40 Å. In Table 1 each case wherein the directions of magnetization in the first magnetic layer and in the second magnetic layer are parallel is indicated by ferromagnetic configuration F while each case wherein they are antiparallel by antiferromagnetic configuration AF.

TABLE 1

| Thickness of non-magnetic layer (Å) | 15 | 20 | 25 | 30 | 35 | 40 | 45 | 50 |
|---|---|---|---|---|---|---|---|---|
| Example | AF | AF | AF | AF | AF | AF | AF | AF |
| Comparative Example | F | F | AF | AF | AF | F | AF | F |

It was clarified that the antiferromagnetic configuration was always realized even with change in thickness in the case of the element of the present invention and that the margin was wide for the thickness of the non-magnetic layer.

COMPARATIVE EXAMPLE 3

Memory elements of this comparative example were produced in the structure of two-layer magnetic film achieved by excluding the third magnetic layer from the same structure as in Example 4, by changing the thickness of the non-magnetic layer in the same manner. The results are shown in Table 1. It was clarified that the change from the antiferromagnetic configuration to the ferromagnetic configuration occurred even with a 5 Å shift of thickness of non-magnetic layer and that the margin was thus very narrow for the thickness of the non-magnetic layer.

SECOND EMBODIMENT

The present embodiment is the form utilizing the CPP (Current Perpendicular to the film Plane)-MP (Magneto-Resistance) effect where the current is allowed to flow perpendicular to the film plane during regeneration.

Structure of Magnetic Thin-film Memory Element

Figure 25A:
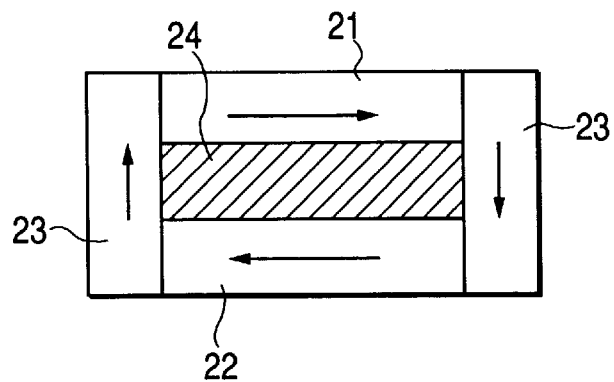
FIG. 25A is a cross-sectional, explanatory drawing to show the structure of a magnetic thin-film memory element as a second embodiment of the present invention, wherein arrows indicate directions of magnetization.
Figure 25B:
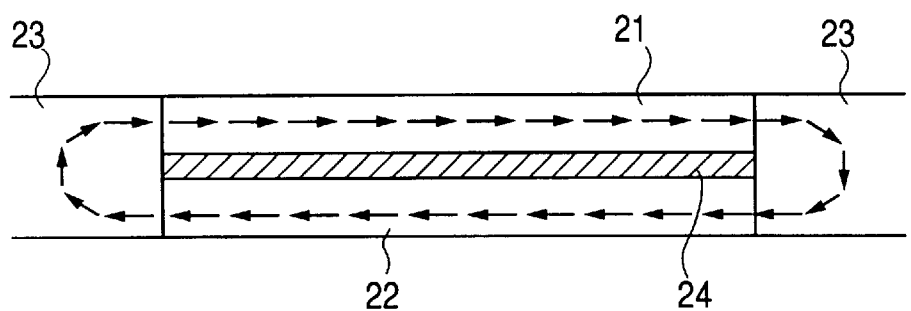
FIG. 25B is a cross-sectional view to show the detailed magnetization state in the magnetic thin-film memory element shown in FIG. 25A.
Figure 25C:
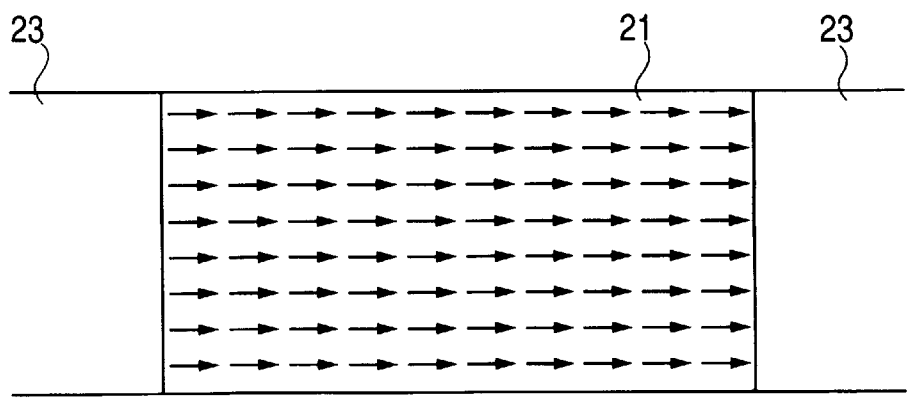
FIG. 25C is an explanatory drawing to show the detailed top plan view of the magnetization state in the magnetic thin-film memory element shown in FIG. 25A.

The present invention will be described in more detail by reference to the drawings. FIGS. 25A, 25B, 25C and FIGS. 26A, 26B, 26C are explanatory drawings to show examples of the magnetic thin-film memory element of the present invention. In FIG. 25A, numeral 21 designates a first magnetic layer, 22 a second magnetic layer, 23 a third magnetic layer, and 24 a non-magnetic layer. The arrows indicate main magnetization directions in the respective magnetic layers. FIG. 25B is a detailed view of the magnetization state of the memory element in the structure of FIGS. 25A to 25C. FIG. 25C is a first-magnetic-layer-side top plan view of the magnetization state of the memory element in the structure of FIG. 25A.

As shown in FIGS. 25A to 25C, the magneto-resistive thin-film element according to the present invention is constructed in such structure that the first magnetic layer 21 and second magnetic layer 22, each including magnetization aligned in one in-plane direction in the film plane, are stacked with the non-magnetic layer in between, the third magnetic layer 23 is provided on the side faces of the first magnetic layer and second magnetic layer, and the non-magnetic layer is surrounded as a whole by the first magnetic layer, the second magnetic layer, and the third magnetic layer.

In the storage condition where the external magnetic field is 0, the magnetization in the first magnetic layer is antiparallel to that in the second magnetic layer and a closed magnetic circuit is formed through the third magnetic layer.

FIG. 25A shows the main directions of magnetization in the respective layers and, more specifically, a ring loop is formed so that the magnetization in the third magnetic layer is curved gently as shown in FIG. 25B, thereby achieving a stable energy state. The product of flux density and cross section is preferably constant throughout the inside of the first, second, and third magnetic layers in order to establish the perfect closed magnetic circuit. As illustrated in FIG. 25C, the magnetization in the first magnetic layer is uniformly oriented in one direction. The magnetization of the second magnetic layer is also uniformly oriented in one direction in the same manner as in FIG. 25C except that the direction of magnetization is reverse. The stable magnetization state is realized in this way.

Since the third magnetic layer forms portions with large curvature in the ring loop, the third magnetic layer is preferably made of a material having smaller magnetic anisotropy and coercive force and higher permeability than the first magnetic layer and the second magnetic layer and readily taking any magnetization direction. The third magnetic layer may also be preferably made of a material with small domain wall energy, in order to suppress increase in the domain wall energy occurring in the case of spins being curved.

The material for the third magnetic layer is preferably magnetic material having small magnetostriction constants and small magnetic anisotropy and a smaller coercive force than those of the first magnetic layer and the second magnetic layer. An example of such magnetic material is a film of metal principal components of which are Ni and Fe; specific examples of the metal are NiFe and NiFeCo, for example. Fe, Co, FeCo can be adduced as the example.

A vertical magnetic film may also be used preferably as the material for the third magnetic layer; for example, a metal film or the like containing at least one alloy selected from the group consisting of GdFe, DyFe, and TbFe. Examples of this alloy are $Gd_xFe_{100-x}$, $Dy_xFe_{100-x}$ and $Tb_xFe_{100-x}$, for example. In these vertical magnetic films, x is preferably in the range of 10 to 35 both inclusive in the element composition. These alloys may also be used in combination with an additive element such as Co.

Figure 26A:
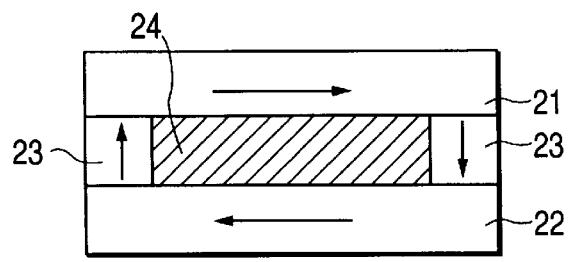
FIG. 26A is a cross-sectional, explanatory drawing to show another example of the magnetic thin-film memory element in the second embodiment of the present invention.

In FIGS. 25A–25C, the third magnetic layer is placed in contact with the side faces of the first magnetic layer, the non-magnetic layer, and the second magnetic layer, but the third magnetic layer 23 may also be formed between the first magnetic layer 21 and the second magnetic layer 22 so as to replace parts of the non-magnetic layer 24, as shown in FIG. 8. The state of magnetization in the structure of FIG. 26A is illustrated in detail in FIG. 26B and it is seen therefrom that a closed magnetic circuit is composed. In this case, portions with large curvature in the ring loop exist in the first magnetic layer and in the second magnetic layer. When the first magnetic layer is observed from above, the magnetization in the first magnetic layer is also uniformly oriented in one direction in the element of this structure as shown in FIG. 26C. The magnetization of the second magnetic layer is also uniformly oriented in one direction in the same manner as shown in FIG. 26C except that the magnetization direction is reverse. The stable magnetization state is realized in this way.

Figure 26B:
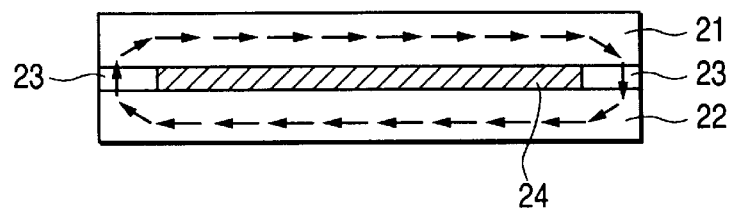
FIG. 26B is a cross-sectional, explanatory drawing to show the detailed magnetization state of the magnetic thin-film memory element shown in FIG. 26A.
Figure 26C:
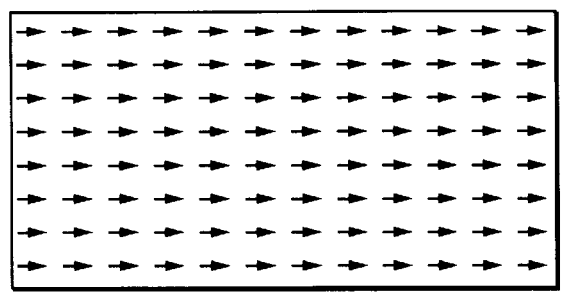
FIG. 26C is an explanatory drawing to show the detailed top plan view of the magnetization state in the magnetic thin-film memory element shown in FIG. 26A.

In the case of the structure of FIGS. 26A–26C, the larger the occupying range of the third magnetic layer 23, the lower the magneto-resistance; therefore, the overall length of the third magnetic layer is preferably not more than one third of the length of the non-magnetic layer; more preferably, not more than a quarter. In the case of the element of this structure, the third magnetic layer is made more preferably of a material having a large vertical magnetic component, because it forms the portions mainly taking charge of the vertical magnetic areas in the closed magnetic circuit.

The above described the memory elements in the structure of FIGS. 25A–25C and in the structure of FIGS. 26A–26C, but the memory element may also be constructed in the structure of a combination thereof; the point is that the first magnetic layer and the second magnetic layer are formed through the third magnetic layer so that the ring magnetization loop is established as a whole.

In the first form of the magnetic thin-film memory of the second embodiment according to the present invention, the magnetic thin-film memory element used is the one revealing the magneto-resistance effect by spin dependent tunneling. For the magneto-resistance effect by this spin dependent tunneling, a thin insulating layer is used as the non-magnetic layer in the structure of first magnetic layer/non-magnetic layer/second magnetic layer shown in FIGS. 25A–25C or FIGS. 26A–26C, for example. The memory element is made so that the tunnel phenomenon of electron takes place from the first magnetic layer to the second magnetic layer when the current is made to flow perpendicular to the film plane during regeneration.

In the magnetic thin-film memory element of the spin dependent tunneling type used in the present invention, conduction electrons are spin-polarized in the ferromagnetic metal and electron states of up spin and down spin are different in the Fermi surface. When a ferromagnetic tunnel junction is made in the structure of ferromagnetic material, insulator, and ferromagnetic material, using such ferromagnetic metal, the conduction electrons tunnel while keeping their spin. Therefore, tunnel probabilities vary depending upon the magnetization states of the two magnetic layers, which will appear as a change of tunnel resistance. The resistance is small when the magnetization in the first magnetic layer is parallel to that in the second magnetic layer; whereas the resistance is large when the magnetization in the fist magnetic layer is antiparallel to that in the second magnetic layer, accordingly.

The greater the difference between state densities of up spin and down spin, the larger this resistance; therefore, stronger regenerated signals can be obtained. Then the first magnetic layer and second magnetic layer are preferably made of magnetic material with high spin polarizability. Specifically, they are preferably made of film of metal containing at least one selected from the group consisting of Ni, Fe, and Co, as a component. Specific examples of such metal are Fe, Co, FeCo, NiFe, NiFeCo, and so on. When the element composition of NiFe is defined in the form of $Ni_xFe_{100-x}$, x is preferably in the range of 0 to 82 both inclusive. More specifically, such materials are Fe, Co, $Ni_{72}Fe_{28}$, $Ni_{51}Fe_{49}$, $Ni_{42}Fe_{58}$, $Ni_{25}Fe_{75}$, $Ni_9Fe_{91}$, and so on. Particularly preferred materials are those containing Fe, which has large polarization amounts of up and down spins in the Fermi surface, and those further containing Co as a second component.

The first magnetic layer is provided for forming the ring loop with the second magnetic layer and for reading the magnetization information preserved in the second magnetic layer by utilizing the giant magneto-resistance effect by spin dependent tunneling. The material for the first magnetic layer is selected from those having lower coercive force than that of the second magnetic layer and readily reversing only the magnetization in the first magnetic layer during regeneration and forming the ring loop with the second magnetic layer during storage.

Consequently, the material for forming the first magnetic layer is preferably selected from soft-magnetic materials containing Ni among the above-stated compositions and, specifically, the material is more preferably selected from alloy films containing NiFe or NiFeCo. When the element composition of NiFe is defined in the form of $Ni_xFe_{100-x}$, x is preferably in the range of 30 to 82 both inclusive. When the element composition of NiFeCo is defined in the form of $Ni_x(Fe_{100-y}Co_y)_{100-x}$, x is preferably in the range of 30 to 82 both inclusive, and y preferably in the range of 0 to 90 both inclusive.

If the thickness of the first magnetic layer is too small, the resistance of cell could become too small to achieve sufficient output of regenerated signal; therefore, the thickness is preferably not less than 20 Å and more preferably not less than 80 Å. In the case using the CPP (Current Perpendicular to the film Plane)-MR (Magneto-Resistance) effect where the current is made to flow perpendicular to the film plane during regeneration, an important factor is a distance of motion with preserving the orientation of spin, i.e., a spin diffusion length. Thus the thickness of the first magnetic layer is preferably smaller than the spin diffusion length. Since too large thicknesses will pose the problem that the resistance of cell becomes too large or the like, the thickness is preferably not more than 5000 Å and more preferably not more than 1000 Å.

The second magnetic layer is provided mainly for the purpose of preserving the magnetization information and the direction of magnetization is determined depending upon the information of "0" and "1." The second magnetic layer also needs to efficiently present the giant magneto-resistance effect and preserve the magnetization state stably as the first magnetic layer. The second magnetic layer has higher coercive force than that of the first magnetic layer. Because of this, the second magnetic layer is preferably one of metal films whose main component is Fe and/or Co, particularly. Examples of such metal films are magnetic films of Fe, FeCo, Co, and the like.

An additive element of Pt or the like may be added to the second magnetic layer in order to enhance control of coercive force and corrosion resistance. The coercive force becomes smaller with addition of Fe to Co; whereas the coercive force becomes larger with addition of Pt. Therefore, the second magnetic layer may be made, for example, of $Co_{100-x-y}Fe_xPt_y$, and the coercive force thereof can be controlled by adjusting the element composition rates x and y. Since the coercive force can also be increased by raising the temperature of the substrate during deposition of film, another method for controlling the coercive force may be adjustment of the substrate temperature during deposition. This method may be combined with the method for adjusting the composition of the ferromagnetic thin film as described above.

The coercive force of the first magnetic layer can also be controlled by the composition of film and the substrate temperature during deposition in the same manner as described above.

Too small thicknesses of the second magnetic layer would degrade the memory storage performance and decrease the resistance of cell to cause decrease the output of regenerated signal and fail to keep magnetization. Therefore, the thickness of the second magnetic layer is preferably not less than 20 Å and more preferably not less than 80 Å. In the case using the CPP-MR effect, the distance of motion with preserving the orientation of spin, i.e., the spin diffusion length is an important factor. The thickness of the second magnetic layer is thus preferably smaller than the spin diffusion length. Too large thicknesses would raise problems that the resistance of cell becomes too large and that the reversal of magnetization becomes unlikely to occur because of the large distance from the word electrode. The thickness of the second magnetic layer is thus preferably not more than 5000 Å and more preferably not more than 1000 Å.

The non-magnetic layer must be non-magnetic for electrons to tunnel with keeping their spin. The non-magnetic layer in this form is a layer for insulating the first magnetic layer from the second magnetic layer, and the whole layer may be made of an insulating material; or it may be formed in a multilayer structure a part of which is an insulating layer. Particularly, when the part is an insulating layer and the thickness thereof is minimum, the magneto-resistance effect can be enhanced further.

The insulating materials used for the non-magnetic layer are $AlO_x$, $AlN_x$, $SiO_x$, $SiN_x$, $NiO_x$, and so on. Among them, $Al_2O_3$ is preferred, because it has the high insulation property and is dense. When the insulating material is an oxide film, the $Al_2O_3$ film can be made, for example, by first forming an Al film and then oxidizing a part thereof in air.

The non-magnetic layer is preferably a uniform layer of approximately several ten Å, and the thickness thereof is preferably between 4 Å inclusive and 25 Å inclusive. The thickness of the non-magnetic layer is more preferably not less than 6 Å but less than 18 Å.

The second form of the magnetic thin-film memory of the second embodiment according to the present invention uses the magnetic thin-film memory element revealing the magneto-resistance effect by spin dependent scattering. This magneto-resistance effect by spin dependent scattering takes place, for example, in the structure of first magnetic layer/non-magnetic layer/second magnetic layer as shown in FIGS. 25A–25C or FIGS. 26A–26C, wherein the non-magnetic layer is a metal layer of a good conductor. This magneto-resistance effect by spin dependent scattering originates from the fact that scattering of conduction electrons greatly differs depending upon spins. Namely, conduction electrons with the spin of the same direction as magnetization are little scattered and the resistance thus becomes small. Consequently, in the case that the magnetic layers with the above non-magnetic layer in between take the ferromagnetic configuration in the same mangetization direction, the resistance is small. On the other hand, in the case that the magnetic layers with the above non-magnetic layer in between take the antiferromagnetic configuration in the antiparallel magnetization direction, conduction electrons with spins of all directions are equally scattered by magnetic atoms having spins of the opposite directions. As the result, the resistance is greater than that in the case of the above ferromegnetic configuration. Then this memory element utilizes the CPP-MR effect where the current is allowed to flow perpendicular to the film plane during regeneration. This CPP-MR increases the probability that conduction electrons traverse the interface and makes the probability greater than that by the CIP (Current Inplane to the film Plane)-MR effect where the current is allowed to flow in parallel to the film plane. Therefore, the CPP-MR enhances signal detection sensitivity to obtain a large resistance change rate.

Below described are the features of the first magnetic layer, the second magnetic layer, and the non-magnetic layer in this case. The first magnetic layer is provided for forming the ring loop with the second magnetic layer and for reading the magnetization information stored in the second magnetic layer by utilizing the giant magneto-resistance effect.

The first magnetic layer is preferably a film of metal having a component of at least one selected from the group consisting of Ni, Fe, and Co. Examples of this metal (alloy) are NiFe, NiFeCo, FeCo, CoFeB, and so on. When the element composition of NiFe is defined as $Ni_xFe_{100-x}$, x is preferably in the range of 35 to 86 both inclusive. When the element composition of NiFeCo is defined as $Ni_x(Fe_{100-y}Co_y)_{100-x}$, x is preferably in the range of 10 to 70 both inclusive and y preferably in the range of 30 to 90 both inclusive; more preferably, y in the range of 60 to 85 both inclusive.

The first magnetic layer may also be made preferably of an amorphous alloy main components of which are Co and Fe. A specific example of the amorphous alloy is amorphous magnetic material of CoFeB having such a composition as $Co_{84}Fe_9B_7$ or $Co_{72}Fe_8B_{20}$, for example.

The second magnetic layer is provided mainly for the purpose of storing the magnetization information and the direction of magnetization therein is determined depending upon the information of "0" or "1." Requirements for the second magnetic layer are that the giant magneto-resistance effect appears efficiently therein, as in the case of the first magnetic layer, and that it can stably preserve the state of magnetization.

The second magnetic layer is preferably a film of metal whose main component is Fe and/or Co. Examples of the metal (alloy) are Fe, FeCo, Co, and so on. The metal may also contain the additive element such as Pt. Addition of Fe to Co decreases the coercive force, whereas addition of Pt increases the coercive force. Therefore, the second magnetic layer can be, for example, $Co_{100-x-y}Fe_xPt_y$, and the coercive force is controlled by adjusting the element composition rates x and y.

The thickness of the first magnetic layer needs to be determined so as to efficiently withdraw the giant magneto-resistance effect of scattering type. Specifically, if the thickness of the first magnetic layer is much greater than the mean free path of electron electrons will experience phonon scattering in the first magnetic layer so as to degrade the magneto-resistance effect; therefore, the thickness is preferably not more than 200 Å. More preferably, the thickness is not more than 150 Å. Too small thicknesses, however, will lower the resistance of cell so as to decrease the output of regenerated signal or possibly fail to retain magnetization in some cases. Therefore, the thickness is preferably not less than 20 Å and more preferably not less than 80 Å.

Similarly, as in the case of the first magnetic layer, the thickness of the second magnetic layer is also determined so as to efficiently achieve the giant magneto-resistance effect of scattering type and thus is determined to be preferably not more than 200 Å and more preferably not more than 150 Å. Too small thicknesses, however, will degrade the memory retaining performance and may decrease the resistance of cell so as to reduce the output of regenerated signal in some cases. Therefore, the thickness of the second magnetic layer is preferably not less than 20 Å and more preferably not less than 80 Å.

In this form, the non-magnetic layer is a good conductor and it is preferably made of material a main component of which is Cu, because such material has the Fermi energy level close to those of the magnetic layers and good adhesion to the magnetic layers, so that the resistance is likely to occur at the interface upon change in the direction of magnetization and this is advantageous in obtaining large magneto-resistance ratios. The thickness of the non-magnetic layer is preferably between 5 Å inclusive and 60 Å inclusive.

In this form, it is preferred that a magnetic layer the main component of which is Co be provided either between the first magnetic layer and the non-magnetic layer or between the second magnetic layer and the non-magnetic layer, or at the both interfaces, because it increases the magneto-resistance ratios and thus achieves higher S/N ratios. In this case the thickness of the layer the principal component of which is Co is preferably not more than 20 Å.

In the present invention, defining {first magnetic layer/non-magnetic layer/second magnetic layer/non-magnetic layer} as one unit, a stack of such units may be employed in order to increase S/N. The number of the stacked units is preferably as large as possible, because the MR ratios will increase; too many units stacked would pose problems including the problem that disturbance becomes likely to occur at the interface between the magnetic layers and the non-magnetic layer. Therefore, the number of stacked units is preferably not more than 40 and more preferably in the range of approximately 3 to 20.

[Structure of Memory]

Next described in detail is an array structure of memory cells where a solid state memory is constructed by arraying many magnetic thin-film memory elements of the present invention.

Figure 30:
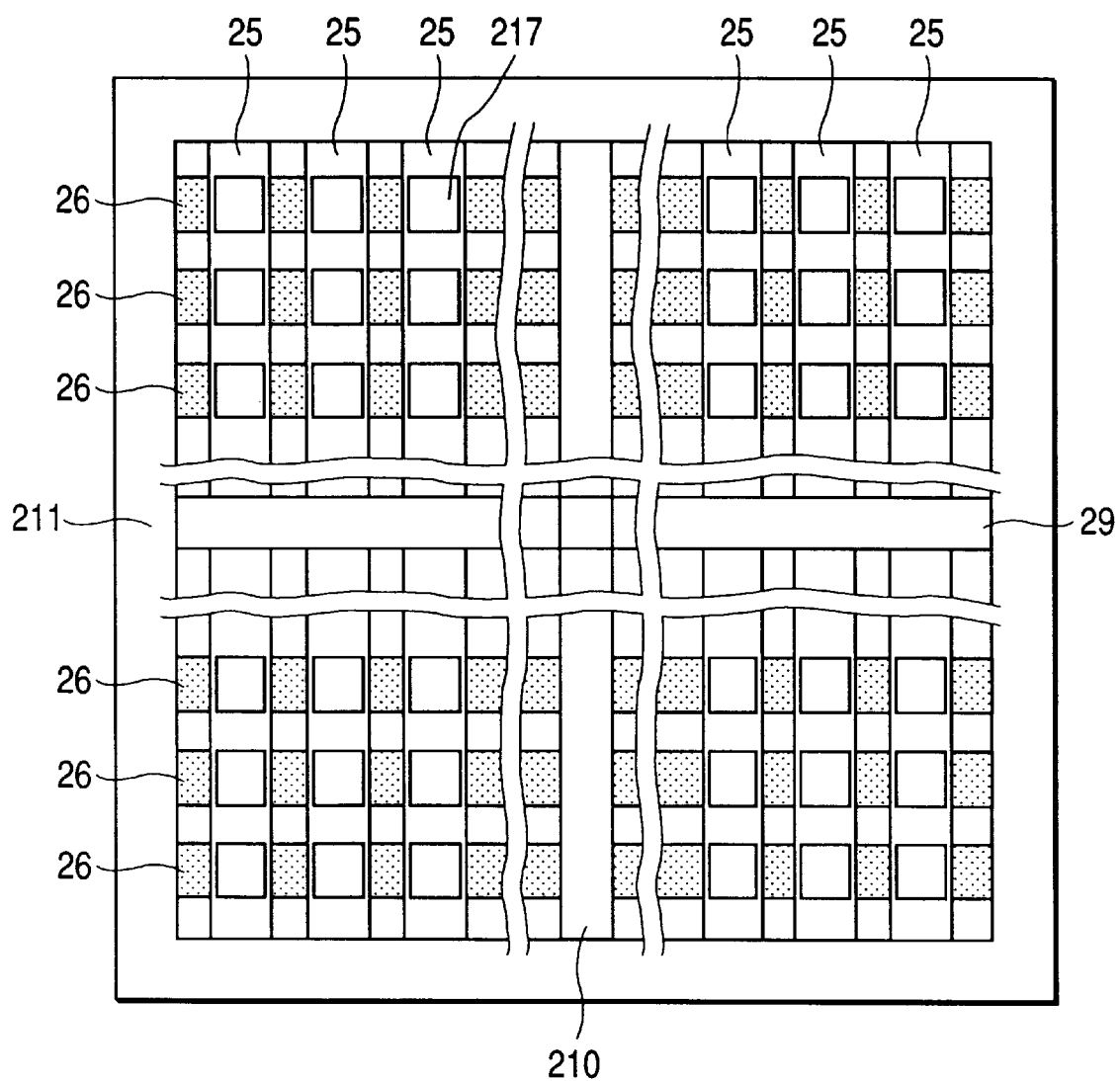
FIG. 30 is an overall plan view of a magnetic thin-film memory of the present invention.

FIG. 30 is a top plan view of an example of a magnetic thin-film memory of the present invention. Each memory cell 217 is a storage unit having one magnetic thin-film memory element. In this figure only parts of many memory cells 217 are illustrated and the other cells are omitted.

The magnetic thin-film memory of the present invention has first word lines 25 arranged vertically or laterally and second word lines 26 arranged in the direction perpendicular to the first word lines. The magnetic thin-film memory elements are arrayed at their intersecting portions. The magnetic thin-film memory elements are placed between the first word lines and the second word lines above and below and are connected in parallel in a matrix.

The first word lines and second word lines are provided for write-while-read. Driving circuit areas 29, 210, 211 are provided at the both ends of each first word line and each second word line. In these areas there are provided the semiconductor devices including decoders, drivers, and so on for selectively driving each word line and each sense line.

A material for the word lines used in the present invention is a good conductor with a larger conductivity than those of the first, second, and third magnetic layers. The material is selected, for example, from aluminum, copper, tungsten, or mixtures thereof, or mixtures of either one of these with silicon.

Figure 27:
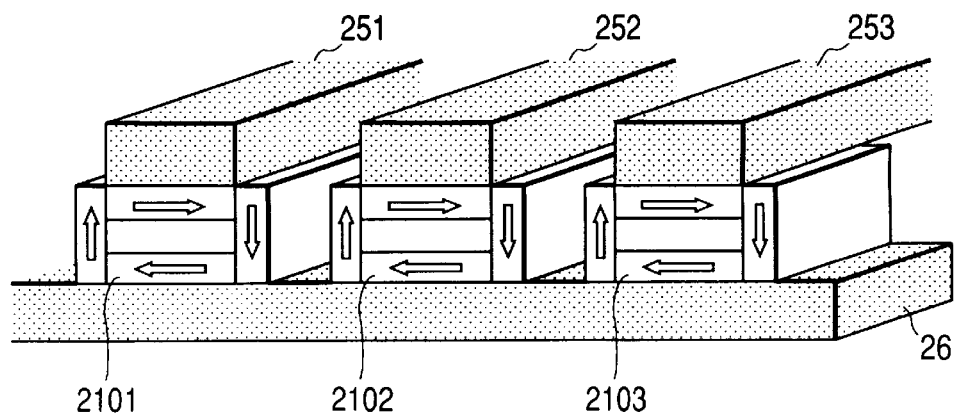
FIG. 27 is an explanatory drawing to stereoscopically show an example of array structure of magnetic thin-film memory elements according to the present invention.

FIG. 27 is a partly enlarged view to stereoscopically show a configuration in the structure of FIGS. 25A–25C. As illustrated in the same drawing the memory elements 2101, 2102, 2103 are arrayed in parallel and an insulating material is provided between the memory elements, though not illustrated, thereby preventing the memory elements from electrically conducting to each other. The first word lines 251, 252, 253 and the second word line 26 are placed perpendicular to each other on either side of the memory elements.

Figure 28:
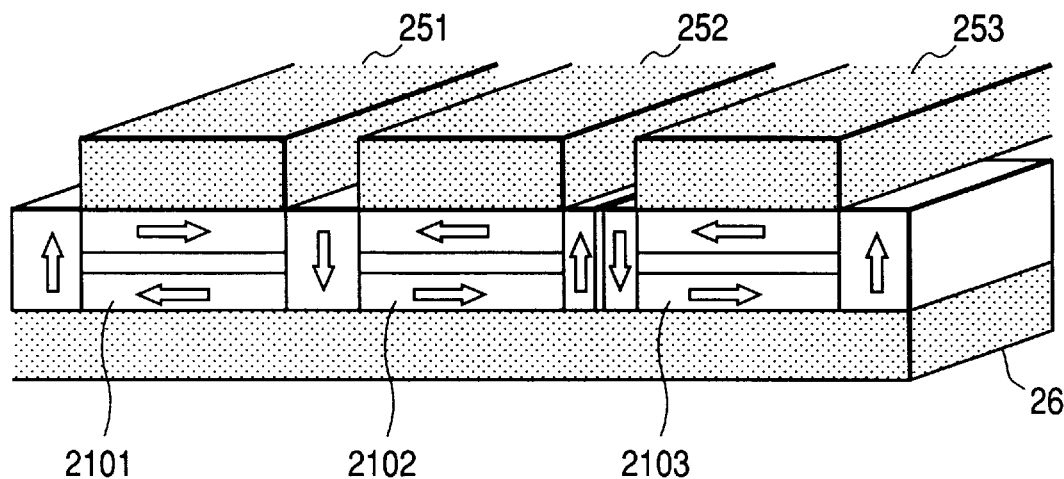
FIG. 28 is an explanatory drawing to stereoscopically show another example of array structure of magnetic thin-film memory elements according to the present invention.

FIG. 28 shows another example of the array structure of the magnetic thin-film memory according to the present invention. In this structure the third magnetic layer fills the spaces between the memory cells, so that the third magnetic layer also functions to separate the elements from each other. This structure is thus simple and preferable. In this case, the third magnetic layer needs to be made of an insulating magnetic material. For example, it is preferably selected from oxide magnetic materials. Specifically, preferred materials are compounds represented by $MFe_2O_4$ where the element M is Ni, Co, Mg, Mn, or the like to exhibit a large resistivity. Particularly, $NiFe_2O_4$ is preferably applicable, because it has the highest resistivity.

Figure 29:
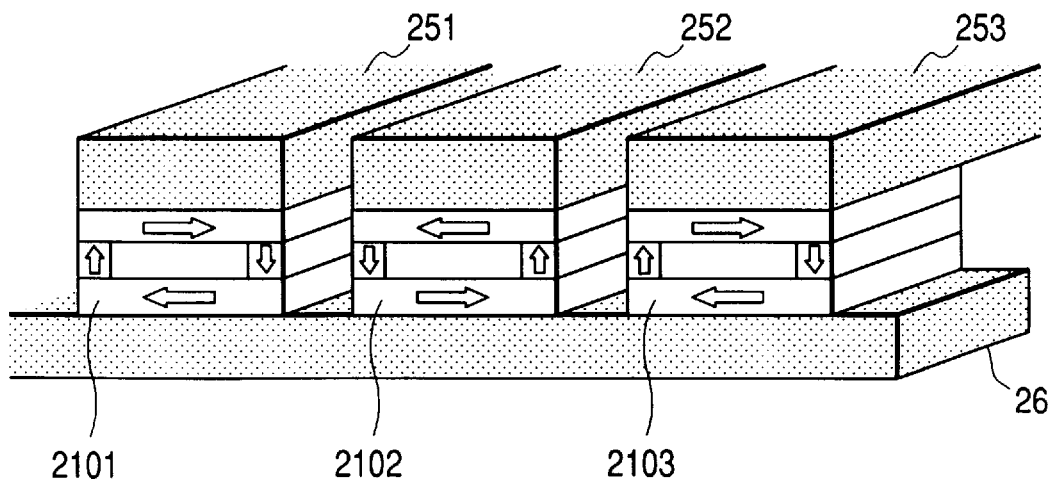
FIG. 29 is an explanatory drawing to stereoscopically show still another example of array structure of magnetic thin-film memory elements according to the present invention.

Another array structure example of the magnetic thin-film memory of the present invention is shown in FIG. 29. In this case the memory elements have the structure of the element shown in FIGS. 26A–26C. In this case the insulating material is also provided between the memory elements in the same manner as in FIG. 27, though not illustrated, thereby preventing the memory elements from electrically conducting to each other.

Although not illustrated in FIG. 27, FIG. 28, or FIG. 29, a switching element may be provided on one side or on the both sides of each magnetic thin-film memory element in order to prevent crosstalk between the memory elements. In the case where a specific memory cell can be selectively selected by the switching element, the first word lines and second word lines do not have to be placed perpendicular to each other but may be located in parallel.

When the substrate is a semiconductor substrate of silicon or the like, the second word lines do not always have to be separately made of a good conductor or the like; alternatively, channels for flow of current are formed in the semiconductor substrate by the known method, for example by adding an impurity element in a pattern into the semiconductor substrate, and the channels may also used as the second word lines.

The magnetic thin-film memory of the present invention can maintain the storage property of magnetization information even with decreased cell sizes, different from the conventional magnetic thin-film memories. This effect of the present invention will be described below in comparison with the conventional example.

The degree of degradation of the storage property of magnetization information is dependent on the intensity of the demagnetizing field appearing inside the magnetic layer; the stronger the demagnetizing field, the worse the storage property of magnetization. The intensity of the demagnetizing field can be roughly estimated under the assumption that the magnetic film is an ellipsoid of a disk shape.

Figure 31A:
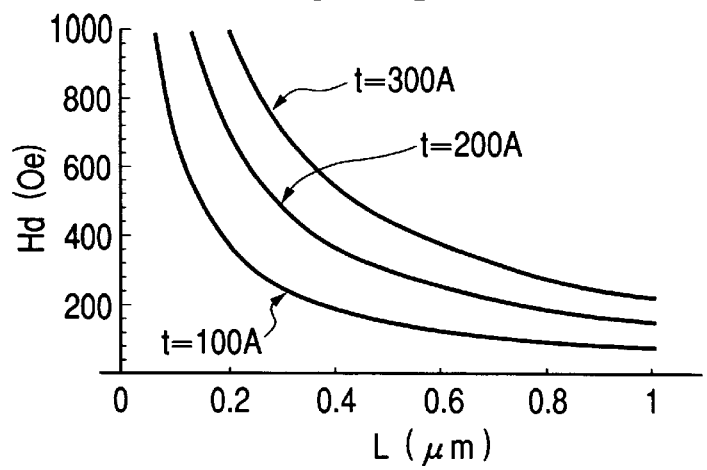
Figure 31B:
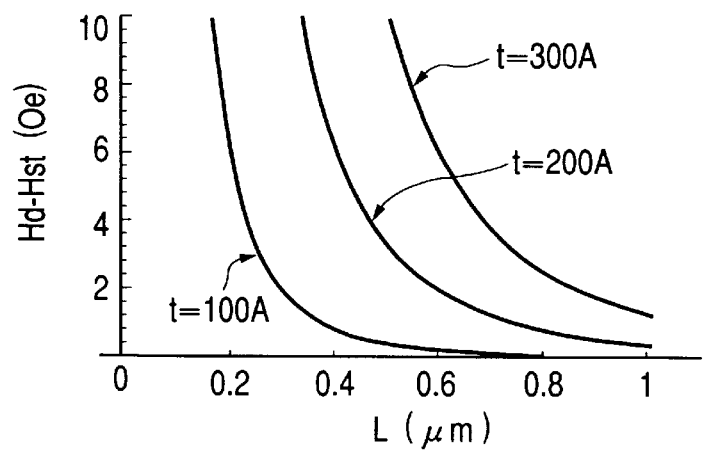
Figure 31C:
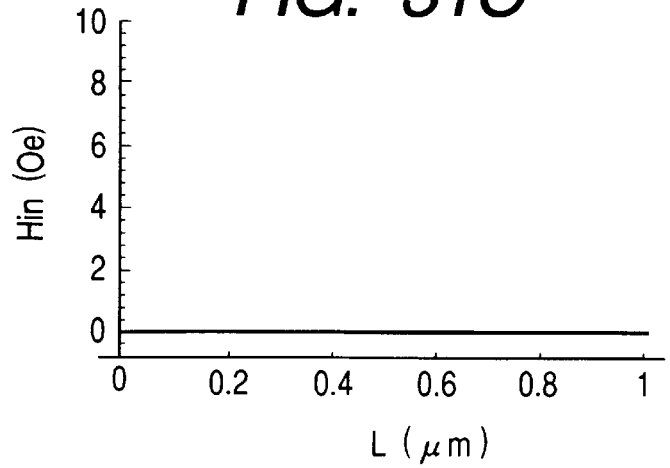

FIGS. 31A to 31C are graphs to show the relation of length L of magnetic layer vs. intensity of demagnetizing field.

Figure 33A:
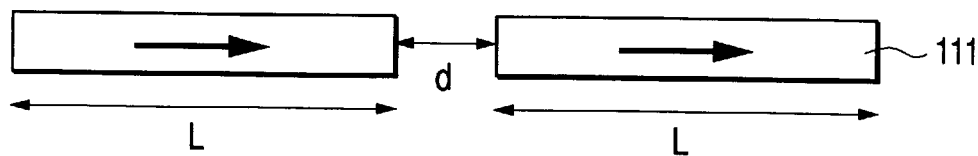

FIG. 31A shows the relation of demagnetizing field Hd vs. length L of magnetic layer in the case where monolayer magnetic film 111 is used as a recording layer as shown in FIG. 33A, as a comparative example. The relation was obtained under the following conditions; the width of the magnetic layer was equal to the length, the saturation magnetization was 800 emu/cc, which was a typical value of permalloy ($Ni_{80}Fe_{20}$), and thicknesses t of the magnetic layer were three thicknesses of 100 Å, 200 Å, and 300 Å. The demagnetizing field decreases as the thickness of the magnetic layer becomes smaller. It is, however, seen that the demagnetizing field has the very large intensity of not less than about 100 [Oe] in the range where the length L of magnetic layer is not more than 1 μm, even in the case of the thickness of magnetic layer of 100 Å.

Figure 33B:
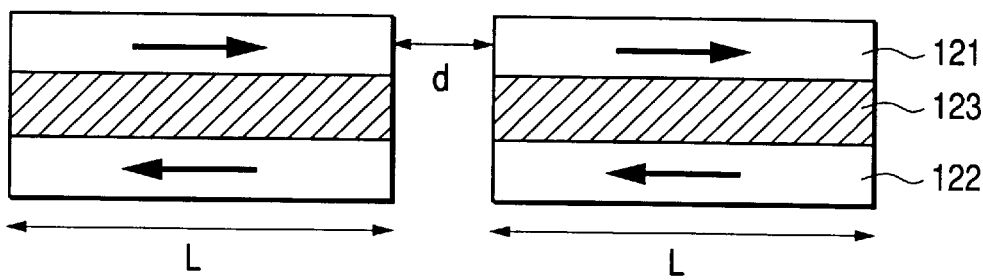

FIG. 31B shows the same relation for the two-layer film shown in FIG. 33B, as another comparative example. In this case the relation was also obtained under the following conditions; the width of the magnetic layers was equal to the length, the saturation magnetization was 800 emu/cc, the thicknesses t of the magnetic layer 121 and the magnetic layer 122 were equal to each other, and the relation was obtained for the three thicknesses t of 100 Å, 200 Å, and 300 Å. The thickness of the non-magnetic layer 123 was 10 Å. In the case of this two-layer film, the demagnetizing field appearing in one magnetic layer 121 is relieved by the static magnetic field Hst induced by the other layer 122, and thus the magnetic field Hd−Hst effectively applied to the inside of magnetic field was obtained. Here, Hst was obtained under the assumption that the magnetic charge existed without spin curling at the end face. In practice the magnetic charge experiences spin curling and thus Hst is smaller than the obtained value. Still, it is seen from the relation that Hd−Hst suddenly increases as the length L of magnetic film decreases.

The coercive force of the second magnetic layer is preferably in the range of 5 [Oe] inclusive to 50 [Oe] inclusive from the restriction of the magnitude of word current and more preferably in the range of approximately 10 [Oe] to 30 [Oe]. If the intensity of Hd−Hst is not less than 2 [Oe] it will be greater than approximately one tenth of the coercive force and stable magnetization storage will be difficult. The length L of magnetic layer at Hd−Hst of 2 [Oe] is 0.3 μm for the thickness of the magnetic layers of 100 Å, 0.6 μm for the thickness of 200 Å, or 0.9 μm for the thickness of 300 Å. It is thus apparent that, in the case of the antiparallel magnetization state of the two-layer magnetic film of the conventional technology, stable storage of magnetization becomes difficult with memory cells having the length of magnetic layer not more than 0.3 μm where the thickness of magnetic layer is not less than 100 Å; further, stable storage of magnetization becomes difficult with memory cells having the length of magnetic material not more than 0.6 μm where the thickness of the magnetic layer is not less than 200 Å, and with memory cells having the thickness of magnetic material not more than 0.9 μm where the thickness of magnetic layer is not less than 300 Å.

Figure 34:
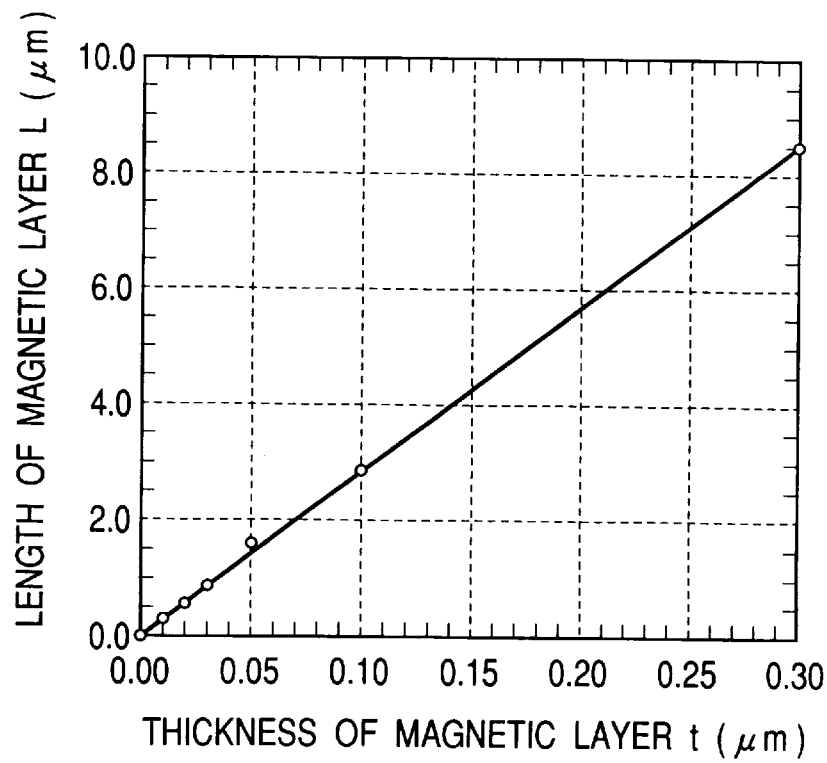
FIG. 34 is a drawing to show the relation of length L of magnetic layer against thickness t of magnetic layer where the strength of demagnetizing field Hd−Hst that cannot be canceled is 2 [Oe], as to the prior-art two-layer magnetic film of a comparative example in the antiparallel magnetization state.

FIG. 34 shows a plot of length L (μm) of magnetic layer at Hd−Hst of 2 [Oe] against thickness t (μm) of magnetic layer, and the relation of L vs. t is expressed by Eq. 1 below.

$$L(\mu m)=30 \times t(\mu m) \tag{Eq. 1}$$

In contrast with it, FIG. 31C shows the demagnetizing field (magnetic field Hin appearing inside the magnetic material) for the magnetic film made in the closed magnetic circuit configuration of the present invention achieved by providing the conventional two-layer magnetic film shown in FIG. 33B with the third magnetic layer. The demagnetizing field is 0, irrespective of the thickness of magnetic layer and the length L of magnetic film, so that the demagnetizing field that could impede the orientation of magnetization is suppressed effectively. In the present invention, the magnetization is preserved stably even if the relation of thickness t (μm) of magnetic layer against length L (μm) of magnetic film is in the condition of Eq. 2, accordingly.

$$L(\mu m)<30 \times t(\mu m) \tag{Eq. 2}$$

Namely, the magnetic thin-film memory element of the present invention can also preserve the magnetic information stably even with highly integrated memory cells of microstructure.

In the case of the conventional magnetic thin-film of the comparative example, it was difficult to produce magnetic anisotropy sufficient for the orientation of magnetization in the in-plane direction where the shape was one having the width and length equal to each other, for example, where the shape was a square or a circle on the top plan view. In the conventional magnetic thin-film memory the magnetization orientation was realized by shape anisotropy by setting the ratio of length to width to 2 to 3 or more, accordingly. In this case, however, there was the problem that the so-called superparamagnetism phenomenon that magnetism disappeared even near the room temperature was likely to occur because of the spin disturbance as described previously, so as to make preservation of magnetization unstable.

In contrast with it, in the case of the magnetic thin-film memory of the present invention, relatively large anisotropy appears because of the ring loop even in the case where the shape of the magnetic thin-film is square. This assures stability of information even where the memory cells are square, so that the degree of integration can be increased considerably. If the magnetic thin-film memory of the present invention is possibly used under conditions of relatively high temperatures, for example, it may be contemplated that the ratio of length to width is made greater than 1 to achieve shape anisotropy so as to enhance anisotropy and increase the storage performance more. In this case the effect of shape anisotropy becomes distinct where the ratio of length to width is not less than 2. Therefore, the ratio of length to width of the magnetic thin-film memory element is preferably not less than 2. In this case the third magnetic layer should better be formed along the longitudinal direction.

Another method for inducing magnetic anisotropy is a method for applying the magnetic field during formation of film, which is easy and effective. This method is carried out by applying the magnetic field along one in-plane direction to the substrate by use of permanent magnet or the like during deposition of the first magnetic layer and second magnetic layer. It is preferably executed by applying the external magnetic field having the intensity of not less than 10 [Oe]. More preferably, the magnetic field of not less than 50 [Oe] is applied along one direction during deposition. In this case the third magnetic layer is better formed along the direction in which the magnetic field is applied.

Further, the magnetic thin-film memory element of the present invention has the feature that no leakage magnetic field appears outside. Because of this, recording/regeneration of information can be carried out more stably even in the small cell size.

Figure 32A:
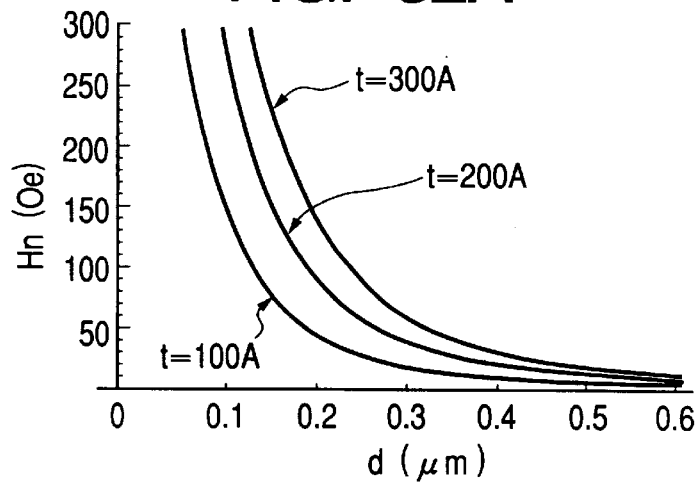
Figure 32B:
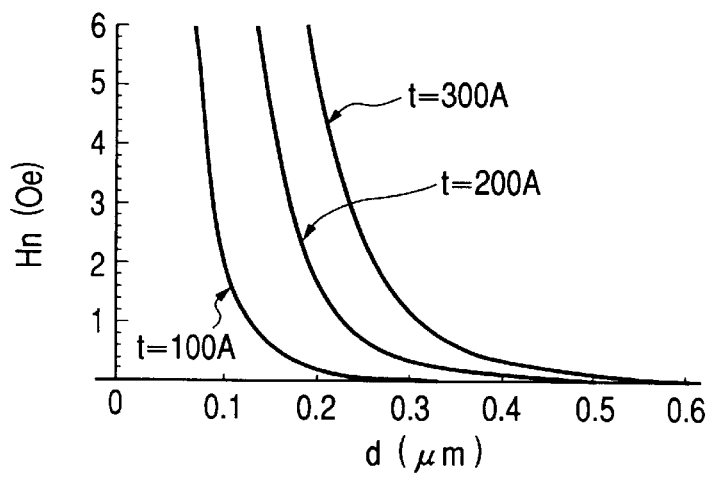
Figure 32C:
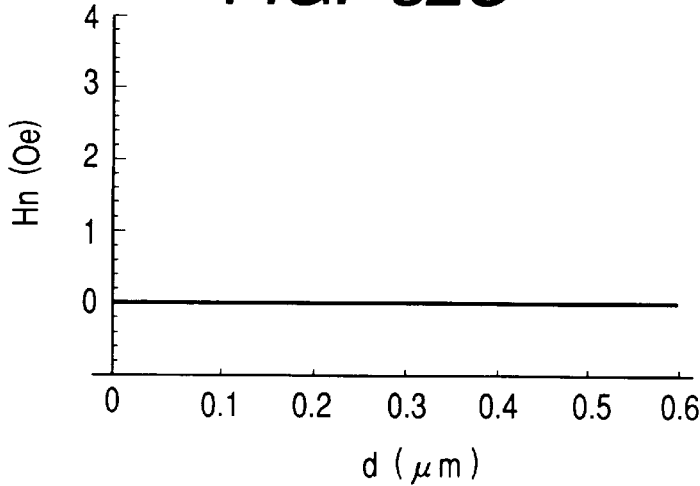

This effect will be described together with comparative examples in FIGS. 32A, 32B, and 32C. FIGS. 32A and 32B are plots of strength of in-plane magnetic field Hn generated at the side face of an adjacent memory element, against distance d between magnetic films where memory elements of the conventional monolayer film or two-layer film shown in FIG. 33A or in FIG. 33B, respectively, are arranged in series. Similarly, FIG. 32C is a plot of strength of in-plane magnetic field Hn generated at the side face of an adjacent memory element against distance d between the first magnetic layers of adjacent memory elements or between the second magnetic layers thereof, for the magnetic thin-film memory elements of the present invention as shown in FIGS. 27 to 29. The length of the all magnetic films was 0.2 μm, and the saturation magnetization and the thicknesses of the magnetic films and non-magnetic film were the same as in the case of FIGS. 31A to 31C.

It is apparent from FIG. 32A that in the monolayer magnetic film of the comparative example the magnetic field of not less than 5 [Oe] is produced in the range where the distance d between memory elements is not more than 0.6 μm and in the range where the thickness is not less than 100 Å and it is also seen from FIG. 32B that in the two-layer magnetic film of another comparative example the magnetic field suddenly becomes stronger with increase in the thickness t of magnetic layer. As described previously, the coercive force of the second magnetic layer is preferably in the range of 5 [Oe] inclusive to 50 [Oe] inclusive and more preferably in the range of approximately 10 [Oe] to 30 [Oe]. The preferred magnetic field during regeneration is a half or less of that during recording, and, therefore, the reversal of magnetization is induced more preferably by the generated magnetic field of 5 [Oe] to 20 [Oe] inclusive.

Figure 35:
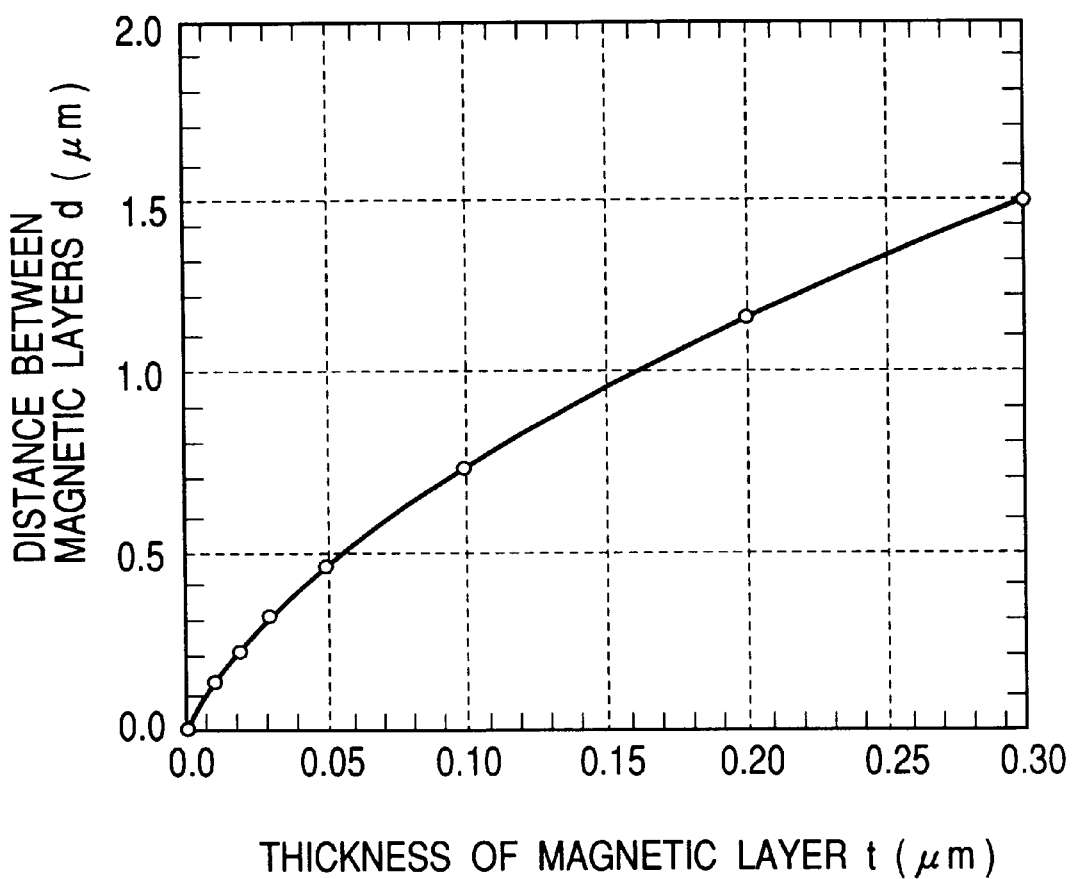
FIG. 35 is a drawing to show the relation of distance d between magnetic films against thickness t of magnetic layer where the magnetic field Hn induced by an adjacent memory element is 1 [Oe], as to the prior-art two-layer magnetic film of a comparative example in the antiparallel magnetization state.

When the magnetic field Hn induced by the adjacent memory element reaches 1 [Oe], the intensity could be approximately one tenth during recording or approximately one fifth during regeneration, of the magnetic field generated by the word line. Therefore, the magnetic field Hn could be a big cause of malfunction during recording/regeneration, particularly during regeneration. The distance d between magnetic films where the magnetic field Hn induced by the adjacent memory element is 1 [Oe], is 0.15 μm when the thickness t of magnetic layer is 100 Å; 0.25 μm when the thickness t is 200 Å; or 0.33 μm when the thickness t is 300 Å. This relation was also obtained for other thicknesses of magnetic layer, and FIG. 35 shows a plot of distance d (μm) between magnetic films against thickness t (μm) of magnetic layer. The relation of d vs. t is expressed by Eq. 3 below.

$$d=3.38 \times t^{0.68} \tag{Eq. 3}$$

It is thus seen that with the antiparallel magnetization state of the two-layer magnetic film of the conventional technology being used, stable preservation of magnetization becomes difficult in the range where the distance d between magnetic films is not more than 0.15 μm and where the thickness of magnetic layer is not less than 100 Å; and further that stable recording/regeneration becomes difficult in the range where the distance d between magnetic films is not more than 0.25 μm and where the thickness of magnetic layer is not less than 200 Å, or in the range where the distance d between magnetic films is not more than 0.33 μm and where the thickness of magnetic film is not less than 300 Å. Accordingly, in the case of the conventional cell structure, it is difficult to decrease the width between cells in order to increase the degree of integration and it is thus impossible to achieve high integration.

In contrast with it, the magnetic thin-film memory element of the present invention can perform stabler recording/regeneration of information, because no leakage magnetic field appears in the adjacent cells, irrespective of the thickness of magnetic layer, as shown in FIG. 32C. With the magnetic thin-film memory of the present invention, no leakage magnetic field appears in the adjacent cells even if the relation of thickness t (μm) of magnetic layer vs. distance d (μm) between magnetic films is according to the condition of Eq. 4 below, and the magnetic thin-film memory of the present invention can demonstrate the more prominent effect than the conventional techniques.

$$d < 3.38 \times t^{0.68} \quad \text{(Eq. 4)}$$

[Recording Method]

Next described is an example of the recording method using the magnetic thin-film memory elements according to the present invention. Each memory cell of the present invention is provided with at least two electrode lines of first word line 25 such as 251, 252, or 253 and second word line 26 as shown in FIG. 30 and FIG. 27 to FIG. 29, and a magnetic field is generated according to the Ampere's law when a current is allowed to flow through each line. Since these two electrode lines are perpendicular to each other, magnetic fields generated thereby are also perpendicular to each other. A magnetic field applied to the magnetic layers of memory cell is the vector sum of these orthogonal magnetic fields. When in this state a magnetic field strong enough to reverse the magnetization in the second magnetic layer is applied by the current through the word line, the magnetization in the second magnetic layer will be oriented in a desired direction, so as to achieve recording. It is thus possible to perform recording of only specific cells selected from the many cells on the matrix. Propriety of reversal of magnetization is described by asteroid curve of magnetic layer.

The first word line and the second word line are electrically connected by the memory element. However, for example, when the resistance of the memory element is set to be greater than those of the first word line and the second word line and when the current is allowed to flow between the both ends of the first word line and between the both ends of the second word line during recording, the current passing the memory cell can be negligibly small, so that the above-stated recording can be performed.

In an alternative arrangement, a switching element is provided on one side or on the both sides of each memory element so as to selectively select a specific memory cell as described above, which enables to rewrite information in a specific memory element.

In addition to the first word line and the second word line, another word line may be provided similarly through an insulating layer to these word lines and recording can be made with the another word line.

The second magnetic layer needs to have high coercive force, because it is preferred to preserve the magnetization state stably. On the other hand, it is, however, also preferred to reverse the magnetization in the second magnetic layer by a weak magnetic field generated by a small current in order to prevent disconnection of word line due to electromigration and in order to decrease the dissipation power. For this purpose, the second magnetic layer needs to have low coercive force. The coercive force of the second magnetic layer is thus determined so as to satisfy the both requirements. Specifically, the coercive force of the second magnetic layer is preferably in the range of 5 [Oe] inclusive to 50 [Oe] inclusive. More preferably, the coercive force of the second magnetic layer is in the range of 10 [Oe] inclusive to 30 [Oe] inclusive.

In another permissible arrangement a buffer layer is provided on the substrate and the memory elements are formed thereon in order to control the coercive force, for example. This provision of the buffer layer suppresses variation in coercive force between different memory cells or facilitates control of absolute value of coercive force. Preferred materials for the buffer layer are insulating materials, for example SiN.

[Regenerating Method]

Next described are examples of the regenerating method using the magnetic thin-film memory of the present invention.

The resistance of the magnetic thin-film memory of the present invention is low in the parallel magnetization state of the first magnetic layer and the second magnetic layer, while it is high in the antiparallel magnetization state thereof. Since they are in the antiparallel magnetization state during storage, the magnetic thin-film memory of the present invention has the high resistance.

The first example of the regenerating method using the magnetic thin-film memory element of the present invention will be described using an example where the information in the memory cell 2102 of FIG. 27 is read, for example.

The current is first allowed to flow between the both ends of the first word line to generate the rightward magnetic field in the drawing, for example. This magnetic field has such intensity as to reverse only the magnetization in the first magnetic layer but not to reverse the magnetization in the second magnetic layer, in order to prevent the magnetization information stored from being deleted during regeneration. Supposing at this time the magnetization recorded in the second magnetic layer is rightward, the magnetization in the first magnetic layer is reversed from leftward during storage to rightward, so that the magnetization in the first magnetic layer is aligned with the magnetization in the second magnetic layer. The resistance of the memory cell is thus small. On the other hand, when the magnetization recorded in the second magnetic layer is leftward, the magnetization in the first magnetic layer is kept rightward as during storage, and directions of magnetization in the first magnetic layer and in the second magnetic layer are antiparallel. The resistance is thus still large.

In this state a voltage is placed between the end of the first word line 252 and the end of the second word line 26 to allow the current to flow through the memory cell 2102. When the magnitude of the resistance of the memory cell 2102 is detected, the magnetization information stored in the second recording layer can be read depending upon the magnitude of the resistance.

The second example of the regenerating method will be described below.

The voltage is first placed between the end of the first word line 252 and the end of the second word line 26 to allow the current to flow through the memory cell 2102. The magnitude of the resistance of the memory cell 2102 is detected. This resistance is the high resistance. From this state, the current is also allowed to flow between the both ends of the first word line 252, thereby generating the magnetic field strong enough to reverse the magnetization in the first magnetic layer in the same manner as above. When the change in the resistance on this occasion is measured at the end of the first word line 252 and the end of the second word line 26, the magnetization information stored in the second recording layer can be read by presence or absence of change in the resistance.

The above described the examples for reading the information in the memory cell 2102, but the same is also applicable to reading of the other cells.

When the magnetization in the first magnetic layer becomes parallel to that in the second magnetic layer, the third magnetic layer is stabilized while being magnetized and oriented in the stablest state during application of the magnetic field to the first magnetic layer and the second magnetic layer. The coercive force of the first magnetic layer needs to be smaller than that of the second magnetic layer. In order to ensure the sufficient margin of the generated magnetic field, the coercive force of the first magnetic layer is preferably a half or less of the coercive force of the second magnetic layer and more preferably one third or less.

In the magnetic thin-film memory element of the present invention, in the state where no magnetic field is applied, the magnetization in the first magnetic layer is always antiparallel to that in the second magnetic layer. Therefore, the resistance of the other memory cells than accessed cells is always constant. Accordingly, the regenerating method using the magneto-resistive elements of the present invention causes no variation in resistance, when compared with the conventional methods using the conventional magnetic thin-film memories where the magnetization states of memory cells are unfixed, and permits detection with accuracy and with less noise.

The recording/regeneration of the present invention uses the pulse current; if the time width of this pulse is too long the access speed will become low and the dissipation power will increase. If it is too short conversely, appropriate recording or regeneration will not be performed. The time width of one pulse is thus preferably between 1 ns and 500 $\mu$s both inclusive and more preferably between 4 ns and 100 ns both inclusive. If the current is too large electromigration of wiring material will occur to increase the risk of disconnection. If the current is too small good recording or regeneration will not be realized in some cases. The current is determined also taking account of the cross section of wire, and it is usually preferably between 10 $\mu$A and 500 mA both inclusive. The current is more preferably between 50 $\mu$A and 10 mA both inclusive.

EXAMPLE 5

The magnetic thin-film memory element of the present invention was next fabricated and the operation thereof was checked. Deposition and processing of the memory element was conducted using the magnetron sputter apparatus and the focus ion beam apparatus. The sputter deposition was carried out as follows; the sputter chamber was evacuated to the high vacuum of $5\times10^{-5}$ Pa, then the Ar gas was introduced as a sputter gas up to 0.1 Pa, and the deposition was effected on a glass substrate.

The deposition of the first magnetic layer and second magnetic layer was carried out with the magnetic field of 200 [Oe] being applied so that the easy axis of magnetization was aligned in the longitudinal direction.

An Al film was first deposited in the thickness of 10 $\mu$m as a lower electrode over the entire surface of the glass substrate 1 cm square.

Then a thin film of $Ni_{30}(Fe_{70}Co_{30})_{70}$ was deposited as the first magnetic layer (in the thickness of 500 Å). Subsequently, a thin film of Al was deposited in the thickness of 30 Å on the first magnetic layer.

Then a small amount of oxygen was introduced into the sputter chamber and a negative potential was given to the substrate to effect reverse sputtering to oxidize the surface of the Al film, thus forming a layer of $Al_2O_3$ in the thickness of about 15 Å as an insulating layer. Further, a thin film of $Fe_{30}Co_{70}$ (the thickness of 500 Å) was deposited thereon as the second magnetic layer.

An Al film was further deposited in the thickness of 5 $\mu$m as an upper electrode.

The thickness of each layer was controlled by adjusting the sputter power. The element composition ratios of the magnetic layers were controlled by adjusting the sputter power of each of the targets of Ni, Fe, and Co.

Then only the deposited portions consisting of the first magnetic layer, the insulating layer, the second magnetic layer, and the upper electrode were processed in the size of 0.4 $\mu$m×0.6 $\mu$m and a film of $Ni_{50}Fe_{50}$ was deposited and processed as the third magnetic layer so that it was in contact with the longitudinal side faces of the first magnetic layer, insulating layer, and second magnetic layer thus processed, thereby producing the magnetic thin-film memory element of the structure of FIGS. 25A to 25C. The third magnetic layer had the width of 0.4 $\mu$m equal to that of the first and second magnetic layers, the length of 0.6 $\mu$m, and the thickness of 1030 Å and was deposited on the both side faces, thus being constructed in the same structure as shown in FIGS. 25A to 25C.

Then a film of SiN was deposited and etched by ion beam to form a protective layer around the first magnetic layer, insulating layer, and second magnetic layer. After that, an Al film 5 mm square was formed in the thickness of 10 $\mu$m as an upper terminal electrode in contact with the upper electrode.

The a Cu line was connected to each of the lower electrode and the upper terminal electrode by use of In, thus completing the magnetic thin-film memory element.

Then the leftward magnetic field of 25 [Oe] was applied to this element to record "0." The magnetic field was applied in the in-plane direction along the longitudinal direction of the element. Then the current of 10 $\mu$A was allowed to flow through the electrode line to generate the leftward magnetic field of 10 [Oe] similarly while measuring the resistance. The resistance was decreased thereby and the resistance returned to the original large value when the application of the magnetic field was stopped. When the rightward magnetic field of 10 [Oe] was generated, no change was observed in the resistance. The leftward magnetic field of 25 [Oe] was then applied in the longitudinal direction to record "0" and the same operation was conducted. No change was observed in the resistance with the weak leftward magnetic field, but the resistance was decreased by the rightward magnetic field. The magneto-resistance ratio at this time was about 7%. This example of experiment verified that the magnetic thin-film memory element of the present invention operated well.

THIRD EMBODIMENT

The feature of the third embodiment is that the Curie temperature of the third magnetic layer in the previous embodiments is set to be lower than those of the first and second magnetic layers.

Recording of data is effected by a magnetic field generated by an adjacent word line as detailed hereinafter. On this occasion, heat from the word line increases the temperature of memory cell. This causes the third magnetic layer of a memory element as a recording object to lose the magnetism enough to form the ring loop of magnetization. This makes the second magnetic layer with the magnetization information likely to experience reversal of magnetization. Therefore, the magnetization information can be recorded stably and recording can be done with a small current.

If the Curie temperature of the third magnetic layer is too low, it will result in damaging stable storage of magnetization information recorded in the second magnetic layer during storage; if it is too high it will result in degrading the effect of the present invention of facilitating disconnection of the ring lop of magnetization during recording.

Figure 40:
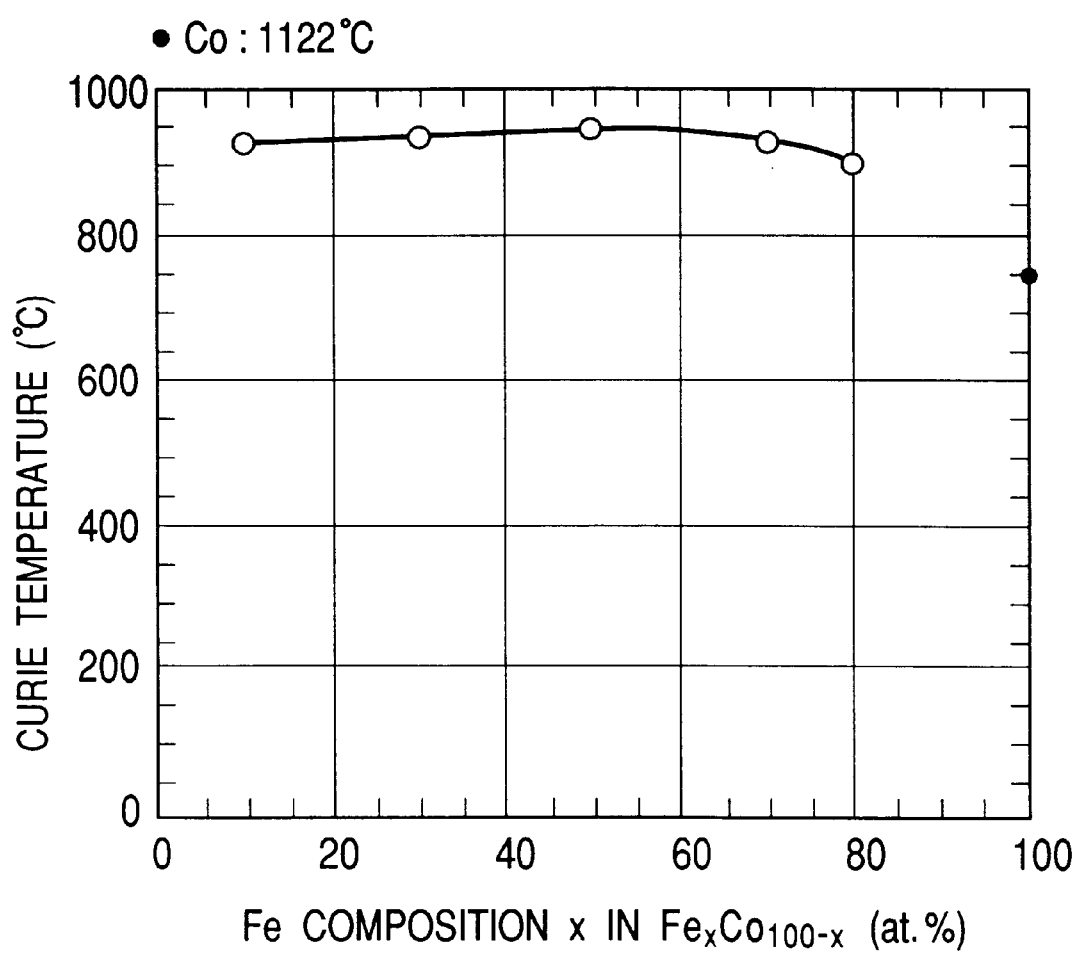
FIG. 40 is a graph to show the relation of composition of FeCo against Curie temperature.

Examples of the first magnetic layer are $Ni_{66}Fe_{16}Co_{18}$ and $Ni_{14}Fe_{13}Co_{73}$ having the magnetostriction of 0 and Curie temperatures of these materials are about 700° C. and about 1000° C., respectively. An example of the second magnetic layer is FeCo and the Curie temperature thereof is about 900° C. as shown in FIG. 40.

The Curie temperature of the third magnetic layer needs to be set below the Curie temperatures of the first and second magnetic layers and is thus desirably not more than 500° C. Taking account of the fact that the temperature during storage rises up to near 50° C., the Curie temperature of the third magnetic layer is desirably not less than 100° C. The Curie temperature of the third magnetic layer is thus desirably in the range of 100° C. to 500° C. both inclusive. More desirably, the Curie temperature of the third magnetic layer is in the range of 120° C. to 400° C. both inclusive. Still more desirably, it is in the range of 150° C. to 300° C. both inclusive. Still more desirably, it is in the range of 150° C. to 200° C. both inclusive.

The coercive force of the third magnetic layer at room temperature is preferably in the range of 4 Oe to 6 Oe both inclusive.

Figure 36:
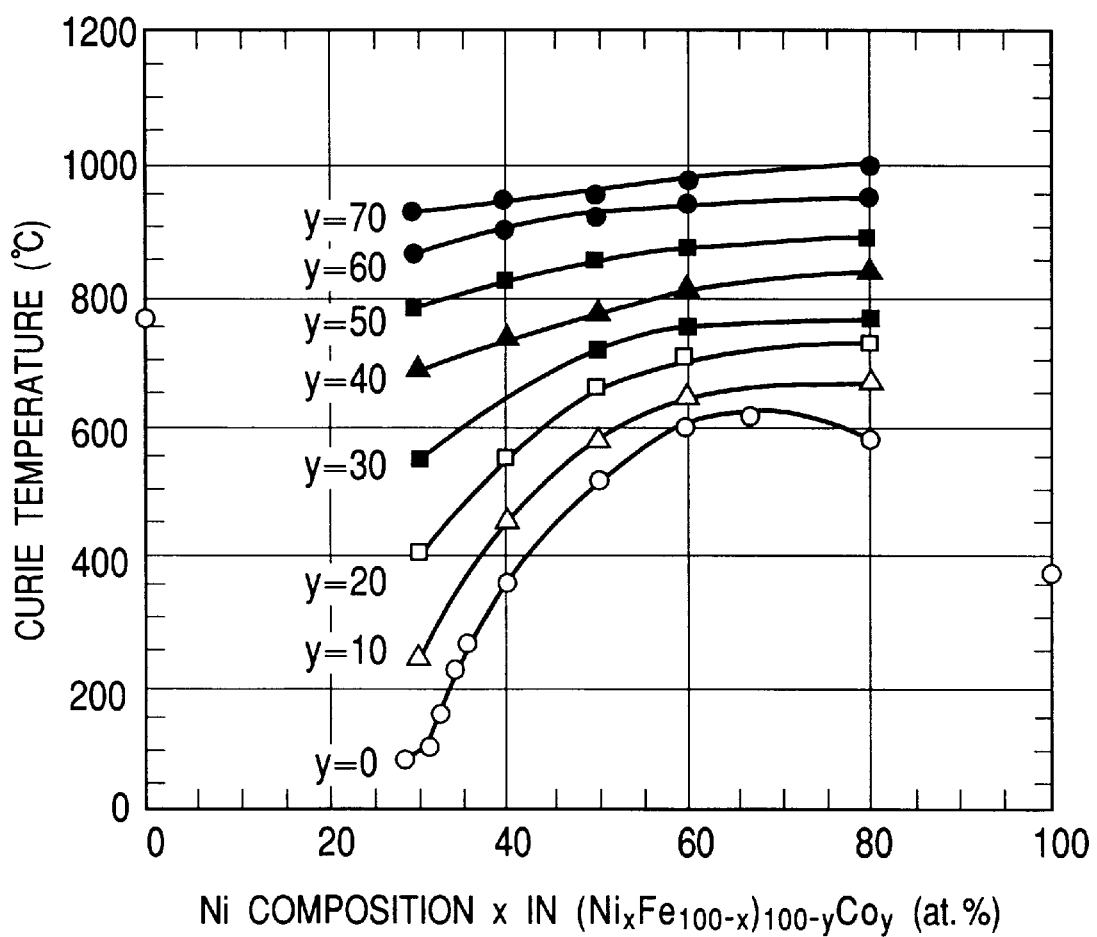
FIG. 36 is a graph to show the relation of composition of NiFeCo against Curie temperature.

FIG. 36 shows the relation of composition of $(Ni_xFe_{100-x})_{100-y}Co_y$ vs. Curie temperature. From FIG. 36, when the composition of the third magnetic layer is $(Ni_xFe_{100-x})_{100-y}Co_y$, it is desired to select an appropriate composition in the range of $25<x<50$ and $0 \leq y<30$ in order to set the Curie temperature not more than 500° C. In order to set the Curie temperature in the more preferred range of not more than 300° C., it is desired to select an appropriate composition in the range of $20<x<40$ and $0 \leq y<20$.

Figure 37:
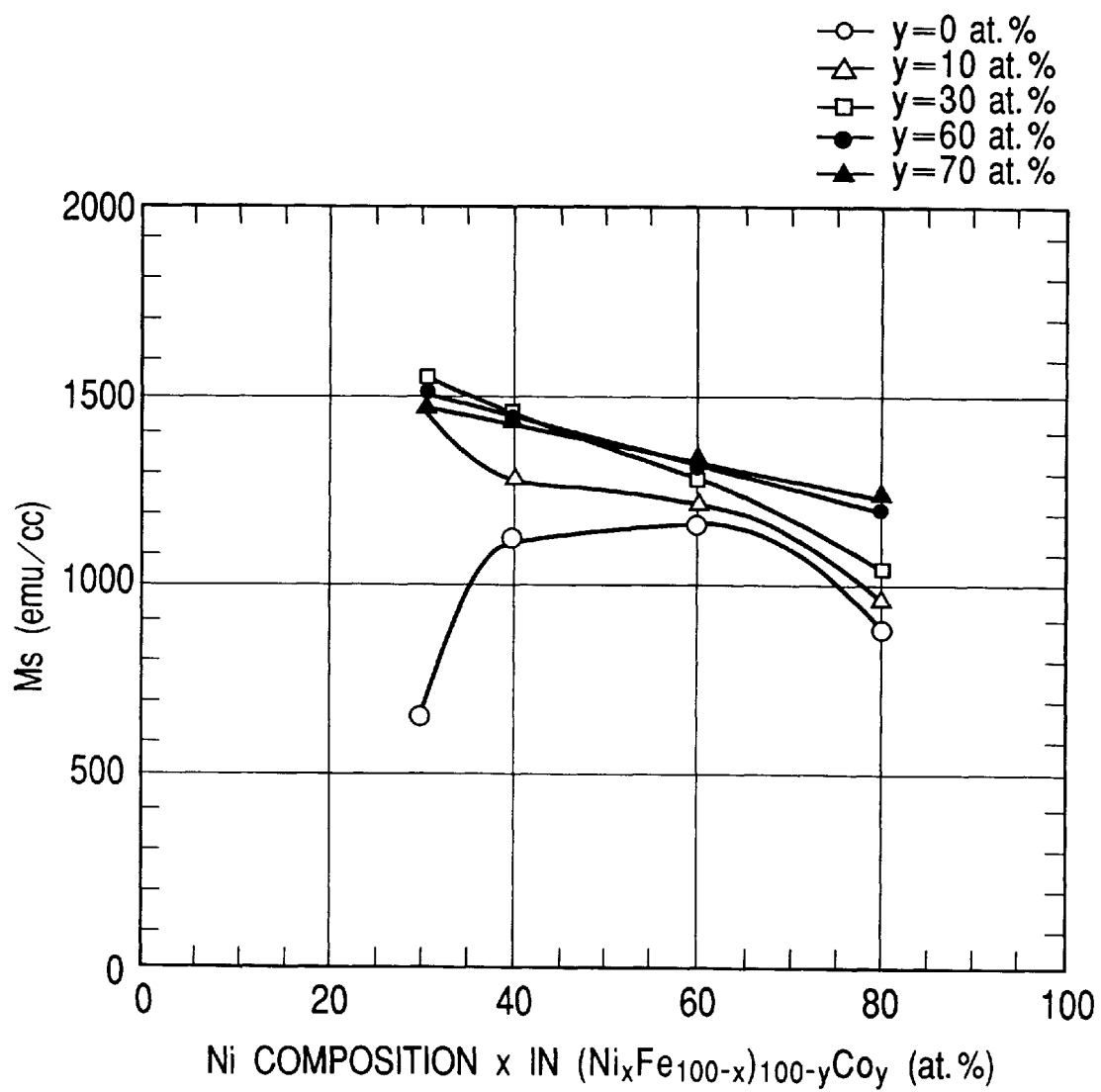
FIG. 37 is a graph to show the relation of composition of NiFeCo against saturation magnetization Ms.

FIG. 37 shows the relation of composition of $(Ni_xFe_{100-x})_{100-y}Co_y$ vs. saturation magnetization Ms. As shown in FIG. 37, the saturation magnetization Ms is at least 500 emu/cc, by which the effect of the present invention can be demonstrated.

Figure 38:
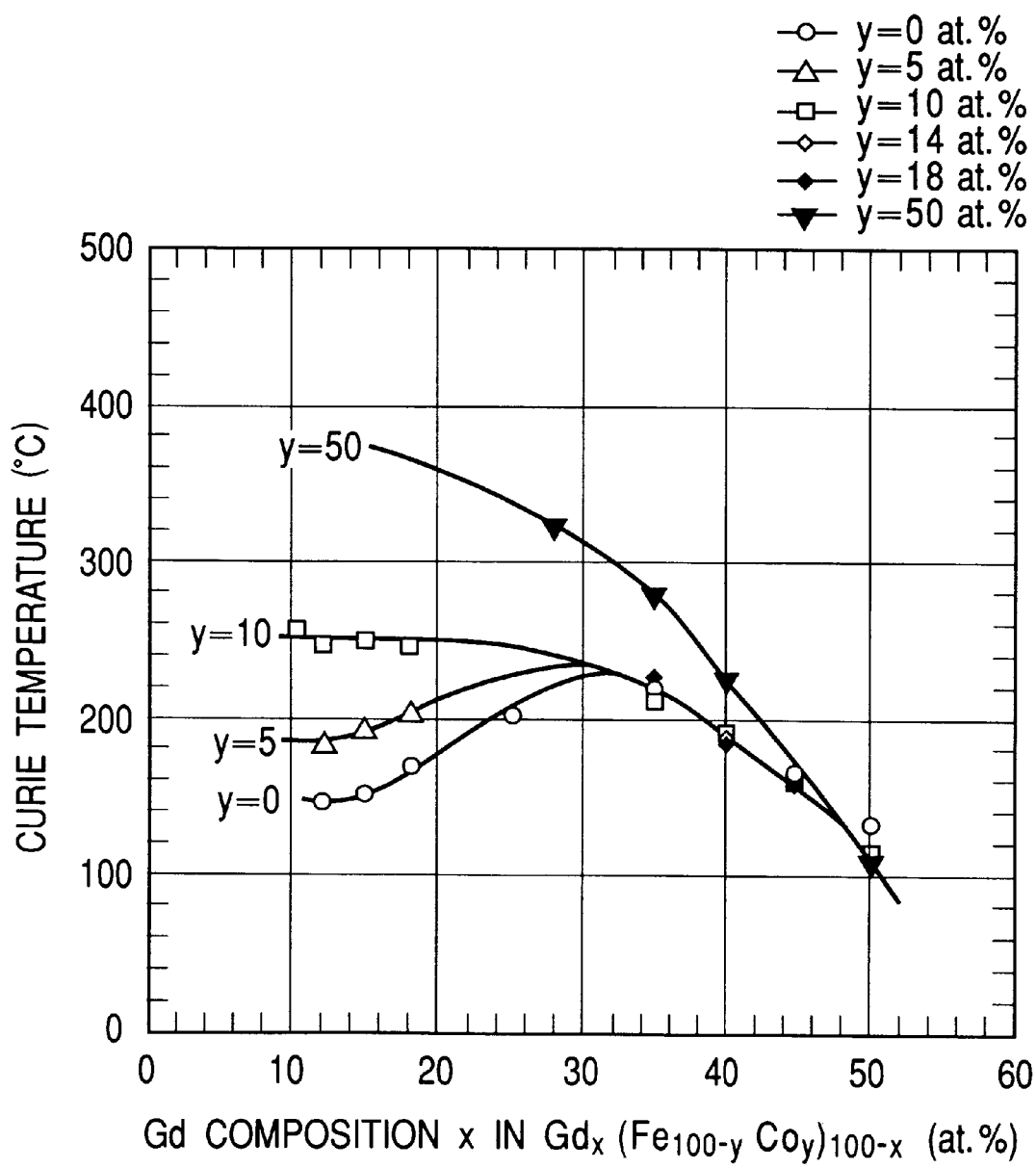
FIG. 38 is a graph to show the relation of composition of GdFeCo against Curie temperature.

FIG. 38 shows the relation of composition of $Gd_x(Fe_{100-y}Co_y)_{100-x}$ vs. Curie temperature. From FIG. 38, when the composition of the third magnetic layer is $Gd_x(Fe_{100-y}Co_y)_{100-x}$, it is desired to select a composition in the range of $43 \leq x$ and $0 \leq y \leq 50$ or in the range of $x \leq 18$ and $y \leq 5$ in order to set the Curie temperature not more than 200° C., for example. In order to set the Curie temperature not less than 100° C., for example, $x \leq 50$ is desired.

Figure 39:
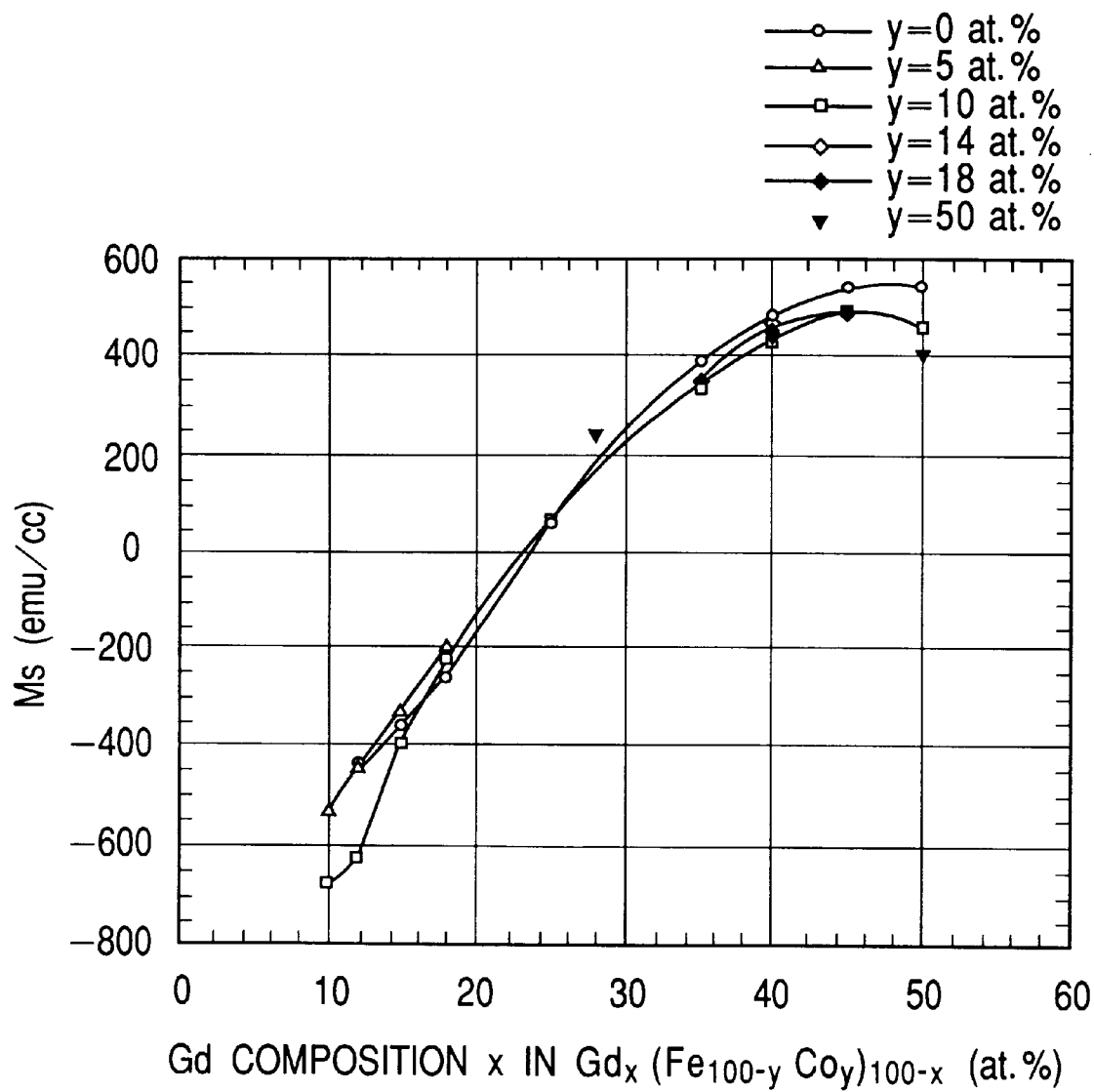
FIG. 39 is a graph to show the relation of composition of GdFeCo against saturation magnetization Ms.

FIG. 39 shows the relation of composition of $Gd_x(Fe_{100-y}Co_y)_{100-x}$ vs. saturation magnetization Ms. From FIG. 39, the effect of the present invention will not be demonstrated greatly with compositions where the saturation magnetization is within ±50 Oe, because the flux density in the third magnetic layer is small. It is thus desired to avoid x from dropping in the range of 24%±2%.

Since the third magnetic layer forms portions with large curvature in the ring loop, the third magnetic layer is preferably made of a material having smaller magnetic anisotropy and coercive force and higher permeability than the first magnetic layer and the second magnetic layer and readily taking any magnetization direction. The third magnetic layer may also be preferably made of a material with small domain wall energy, in order to suppress increase in the domain wall energy occurring in the case of spins being curved. The magnetization in the magnetic thin-film memory of the present invention forms the ring loop and the magnetic path is the closed magnetic circuit. This structure can realize the stable magnetization state. The product of flux density and cross section is desirably constant throughout the inside of the first, second, and third magnetic layers in order to establish the perfect closed magnetic circuit. The material for the third magnetic layer can be selected from NiFe and NiFeCo and the material is preferably a magnetic material having small magnetostriction constants and small magnetic anisotropy and smaller coercive force than those of the first magnetic layer and the second magnetic layer. The main component of the material may be the perpendicular magnetic film of $Gd_xFe_{100-x}$, $Dy_xFe_{100-x}$, $Tb_xFe_{100-x}$, or the like. As for these perpendicular magnetic films, x is desirably the element composition rate of 10 to 35 and they may further contain an element Co or the like. Among the perpendicular magnetic films GdFe is most desirable because of small coercive force thereof.

[Array Structure of Memory Cells]

Next described are examples of array structure of memory cells (series array configuration and parallel array configuration) where the solid state memory is fabricated by arraying many magnetic thin-film memory elements of the present invention.

[Series Array Configuration]

Figure 41A:
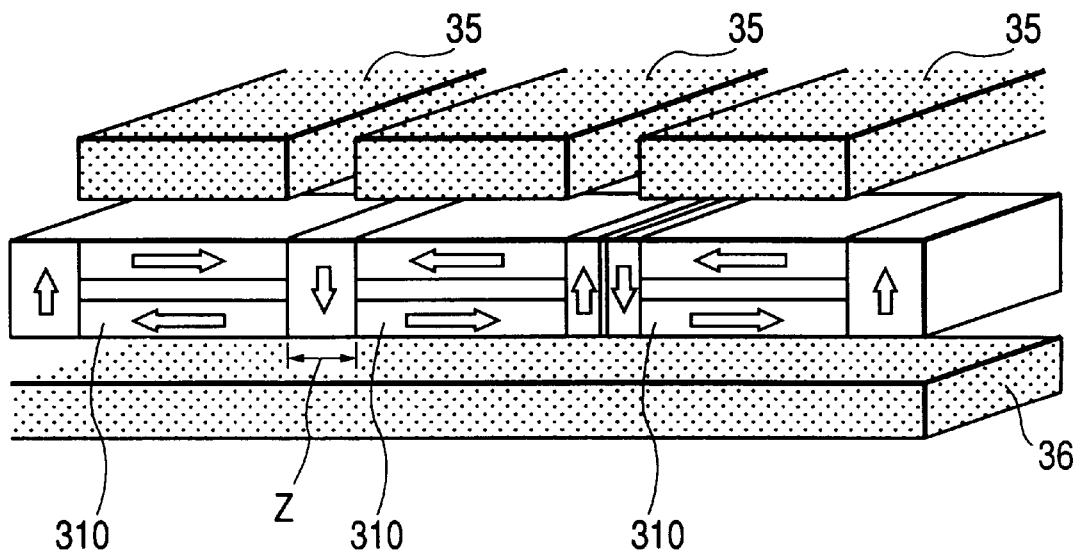
FIGS. 41A and 41B are explanatory drawings to show examples of array structure of magnetic thin-film memory elements according to the present invention.

FIG. 41A is a drawing to stereoscopically show an example of a configuration in which the magnetic thin-film memory elements of the present invention having the same structure as that shown in FIG. 4 or FIGS. 25A to 25C are arrayed in series. As shown in FIG. 41A, the memory elements 310 are connected in series and a word line 35 is provided above each memory element. Another word line 36 is provided below the memory elements. Here, the sense line is composed of the memory elements 310 connected in series.

Although not illustrated in FIG. 41A, an insulating layer fills the space between each word line and the memory element, so as to prevent electrical conduction between the word line and the memory element. The word line 36 does not always have to be provided in the case where recording is carried out with the sense line and word line 35. In order to reduce the resistance between memory elements, the memory elements may be connected by a good conductor, or the good conductor may be provided above the third magnetic layer. This good conductor is desirably one containing at least a main component of a material having a lower resistivity than those of the first magnetic layer and the second magnetic layer, for example Al.

Since the current is allowed to flow through the sense line during regeneration, the current passes through the third magnetic layer. An undesired situation is that the magnetization state of the third magnetic layer affects the regenerated signal on this occasion. In order to avoid it, the length Z of the third magnetic layer in the direction of sense line is desirably not less than 500 Å.

Figure 42A:
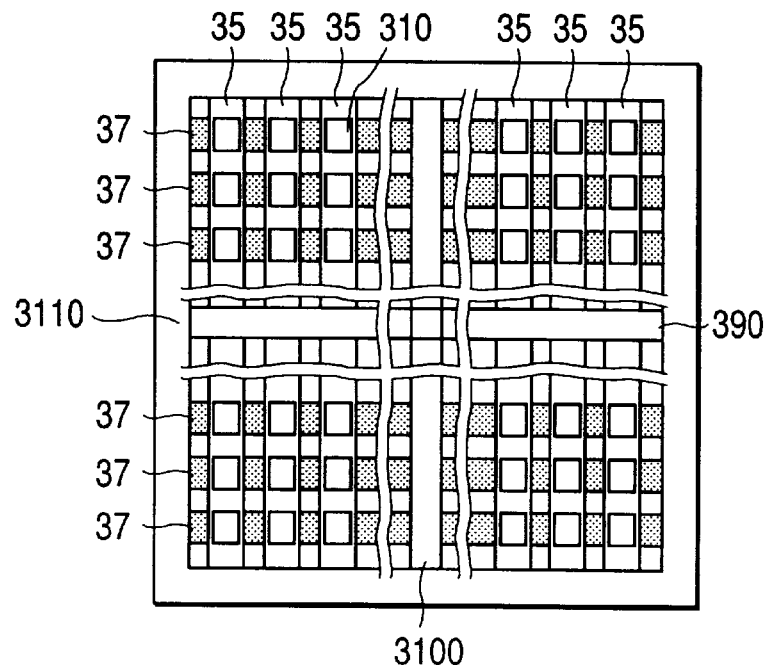
FIGS. 42A and 42B are plan views of magnetic thin-film memories of the present invention.

FIG. 42A is a plan view of a memory where the magnetic thin-film memory elements of the present invention are arrayed in series. The memory elements 310 are arrayed in series to compose each of sense lines 37. In the same drawing the sense lines are arranged horizontally, but the sense lines may be positioned vertically. The word lines 35 are placed immediately above each memory element through the insulating layer not illustrated in the same figure and are located perpendicular to the sense lines. Word lines 36 may be provided perpendicular to the word lines 35, below the sense lines 37. The word lines are provided mainly for recording and the sense lines mainly for reading the regenerated signals. At the both ends 390, 3100, 3110 of each word line and each sense line, there are provided the semiconductor devices including the decoders, the drivers, and so on for driving them. A sense amplifier for amplifying the regenerated signal is incorporated at the end of each sense line. The all word lines used in the present invention are made of a good conductor having a higher conductivity than those of the first, second, and third magnetic layers. Examples of the word lines are those made of aluminum, copper, tungsten, or alloys thereof, or mixtures of these materials with silicon or the like. The substrate of the magnetic thin-film memory elements of the present invention is desirably a substrate a main component of which is Si. This is because the above-stated semiconductor devices can be fabricated on the common substrate to the memory elements of the present invention.

[Parallel Array Configuration]

Figure 41B:
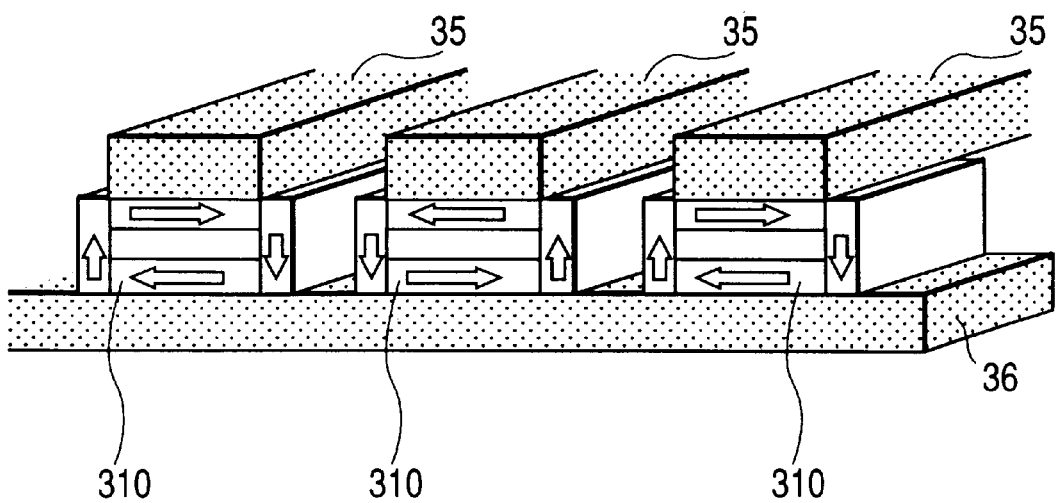

FIG. 41B shows a configuration in which the magnetic thin-film memory elements of the present invention having the same structure as that shown in FIG. 4 or FIGS. 25A to 25C are arrayed in parallel. The memory elements 310 are arrayed in parallel as shown in FIG. 41B, and the word line 35 and the word line 36 are provided above and below each memory element. In this configuration, a sense line is a combination of word line 35, memory element 310, and word line 36.

Figure 42B:
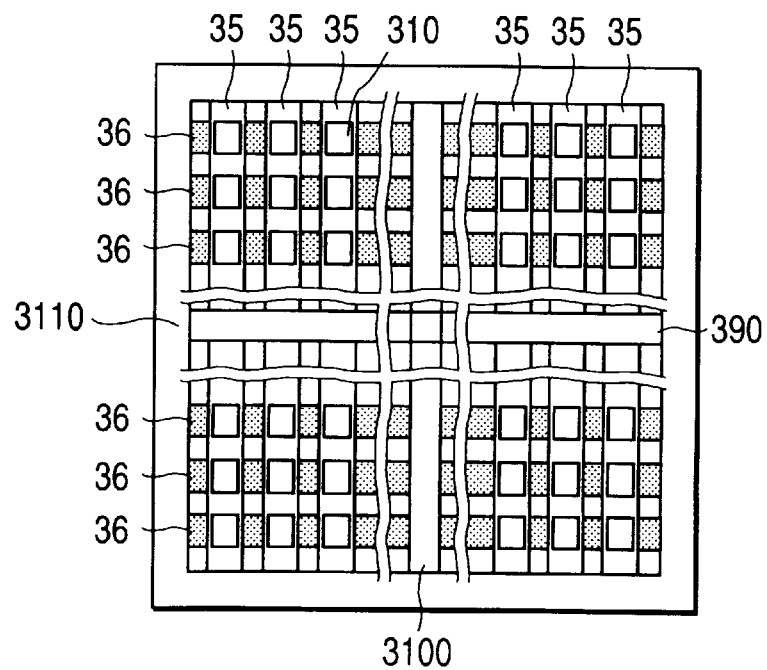

FIG. 42B is a plan view of a memory where the magnetic thin-film memory elements of the present invention are arrayed in parallel. The memory elements 310 are connected in parallel by the word lines 35 arranged vertically or horizontally and the word lines 36 perpendicular thereto. At the both ends 390, 3100, 3110 of each word line there are provided the semiconductor devices including the decoders, the drivers, and so on for selectively driving the word lines. These word lines are provided for write-while-read. At the end of each word line 35, 36 a sense amplifier for amplifying the regenerated signal is incorporated.

[Structure of Memory Cell of the Present Invention]

Other examples of the structure of memory cell according to the present invention will be described referring to FIGS. 43A1 to 43C2.

FIG. 43A1 and FIG. 43A2 are a circuit diagram of one unit and a cross-sectional view of device structure of an array configuration of memory cells in which structures, each being one unit of memory elements of the present invention connected in series, are arrayed in parallel and in which a diode is provided for elimination of crosstalk of each structure; FIG. 43B1 and FIG. 43B2 are a circuit diagram of one unit and a cross-sectional view of device structure of an active matrix configuration in which each memory element of the present invention is connected to a transistor; FIG. 43C1 and FIG. 43C2 are a circuit diagram of one unit and a cross-sectional view of device structure of a configuration in which memory cells are arrayed in parallel and in which each memory element of the present invention is connected to a diode for elimination of crosstalk.

FIG. 43C2 shows a part of a memory device fabricated by rendering the memory element of the present invention hybrid with a semiconductor element. In the memory device, a Write line, or word line 392 is established in the memory element 391 consisting of the present invention through an insulator. One end of memory element 391 is electrically connected with PN junction diode 395, and the other end with the Select electrode. 396 denotes a P-type semiconductor substrate. FIG. 43C1 is a circuit diagram corresponding to the structure shown by FIG. 43C2. The circuit diagram of FIG. 43C1 expresses one semiconductor hybrid memory element as a unit on a matrix consisting of the elements. As a matter of fact, a number of the constitution of FIG. 43C1 are matrically arranged in all directions surrounding FIG. 43C1, wherein respective Select lines are common to a series of the semiconductor hybrid memory elements in the right and left direction in the figure; and respective Write lines and respective Signal lines are respectively common to a series of the elements in the upper and lower direction in the figure. The electrifying to a specific Write line and a specific Select line to which an objective semiconductor hybrid memory element to which the user aims at the recording belongs makes it possible to conduct a recording to only the objective element located on a point at which the above specific Write and Select lines intersect each other. The reproducing can be carried out in the same manner as of the above recording, i.e. electrifying to the Write and Select lines to which the objective element from which the user aims at the reproducing belongs to cause a change in the resistance of the objective element, and then detecting a signal in accordance with the change of the resistance through the Signal line. The diode set in the above semiconductor hybrid memory element is for preventing the deterioration of the signal caused by the electrifying to other elements than the objective one toward which the user aims at the recording or reproducing.

FIGS. 43A1 and 43A2 show another constitution on the basis of the memory element of FIGS. 43C1 and 43C2, in which a plurality of Write lines are established so as to make possible to record a plurality of bits.

FIGS. 43B1 and 43B2 show the same constitution as FIGS. 43C1 and 43C2, except that MOS transistor 394 is employed instead of the diode. In the figures, one end of memory element 391 is electrically connected with a drain electrode of the MOS transistor 394, and the other end with a constant voltage, e.g. source voltage $V_{DD}$. The application of voltage to the Select line connected with gate electrode 393 of MOS transistor 394 realizes the selection of a specific memory element from those of the matrix. This is because the application allows the current to flow between the source and the drain of MOS transistor 394 and does not allow the current to flow through MOS transistors on the other Select lines to which lines the voltage is not applied. The electrifying to the Write line in this state makes possible to conduct the recording/reproducing toward the specific memory element.

When the memory is constructed in the hybrid structure where the memory elements of the present invention are connected to the semiconductor devices such as the diodes or the transistors as shown in FIGS. 43A1 to 43C2, the production processes become a little complex, but the hybrid structure can eliminate the impedance components including the stray capacitance appearing in the configuration of the memory elements arrayed in the simple matrix described previously, thereby assuring stabler operation.

[Recording Method using Magnetic Thin-film Memory Element of the Present Invention]

Next described is an example of the recording method using the magnetic thin-film memory element of the present invention. This magnetic thin-film memory element is provided with a word line and a sense line. When the current is allowed to flow through each line, a magnetic field is produced according to the Ampere's law. Since these two electrode lines are perpendicular to each other, magnetic fields generated thereby are also perpendicular to each other. Therefore, a magnetic field exerted on the magnetic layer of memory cell is the vector sum of these perpendicular magnetic fields. When in this state a magnetic field strong enough to reverse the magnetization in the second magnetic field is applied by the current through the word line, the magnetization in the second magnetic layer will be aligned in a desired direction, so as to effect recording. Consequently, recording can be done of only specific cells out of many cells on a matrix.

Further, the heat generated by the word line on this occasion increases the temperature in the cell portion, particularly in the portion of the memory cell below the perpendicular word line through which the current is allowed to flow. The feature of the present invention is that the Curie temperature of the third magnetic layer is set low, so that the third magnetic layer of a memory element as a recording object loses the magnetism enough to form the ring loop of magnetization. Therefore, the second magnetic layer becomes ready fro reversal of magnetization. Namely, the magnetization reversal field becomes small only in the memory cells of recording objects, but the other memory cells still have the high magnetization reversal field. This keeps magnetization stable during storage, so as to achieve the excellent storage property, and the magnetization can be reversed by the weak magnetic field on the occasion of recording, so as to lower the recording current.

Propriety of reversal of magnetization is described by asteroid curve of magnetic layer. The second magnetic layer needs to have high coercive force, because it is preferred to preserve the magnetization state stably. On the other hand, it is, however, also preferred to reverse the magnetization in the second magnetic layer by a weak magnetic field generated by a small current in order to prevent disconnection of word line due to electromigration and in order to decrease the dissipation power. For this purpose, the second magnetic layer needs to have low coercive force. The coercive force of the second magnetic layer is thus determined so as to satisfy the both requirements. Specifically, the coercive force of the second magnetic layer is preferably in the range of 5 [Oe] inclusive to 50 [Oe] inclusive. More preferably, the coercive force of the second magnetic layer is in the range of 10 [Oe] inclusive to 30 [Oe] inclusive.

Since the fundamental recording and below-described regeneration of the present invention can be done using the word line and sense line as described above, the word line 36 shown in FIGS. 41A and 41B does not always have to be provided. However, the recording and below-described regeneration may be carried out using the word line 36 perpendicular to the word line 35 in order to generate a greater magnetic field. In another permissible arrangement the word line 35 above the memory element is omitted and the word line 36 below the memory element is positioned in the direction perpendicular to the sense line 37. When the semiconductor devices and memory elements are made on a common substrate, production is easier where the word lines are made after deposition of memory elements, however. Therefore, the memory is made preferably in the order of substrate/first magnetic layer/non-magnetic layer/second magnetic layer/insulating layer/word lines.

In another permissible arrangement a buffer layer is provided on the substrate and the memory elements are formed thereon in order to control the coercive force, for example. This provision of the buffer layer suppresses variation in coercive force between different memory cells or facilitates control of absolute value of coercive force. Preferred materials for the buffer layer are insulating materials, for example SiN.

[Regenerating Method Using Magnetic thin-film Memory Element of the Present Invention]

Next described is an example of the regenerating method using the magnetic thin-film memory of the present invention. The magnetic thin-film memory element of the present invention exhibits the giant magneto-resistance (GMR) effect by spin dependent scattering and the resistance thereof is low in the parallel magnetization state of the first magnetic layer and second magnetic layer but high in the antiparallel magnetization state thereof. During regeneration a current weaker than during recording is allowed to flow through the word line above or below the magnetic thin-film memory element, thereby generating a weaker magnetic field. This magnetic field is arranged to have such intensity as to reverse only the magnetization in the first magnetic layer but not to reverse the magnetization in the second magnetic layer, in order to prevent the magnetization information stored from being deleted during regeneration. The coercive force of the first magnetic layer needs to be smaller than that of the second magnetic layer. In order to ensure the sufficient margin of generated magnetic field, the coercive force of the first magnetic layer is preferably not more than a half of that of the second magnetic layer, and more preferably not more than one third thereof. The current is set so that the magnetic field induced by the word line is greater than the magnetic field for reversal of the magnetization in the first magnetic layer but smaller than the magnetic field for reversal of magnetization in the second magnetic layer.

Further, as during recording, the heat generated by the word line on this occasion increases the temperature in the cell portion, particularly in the portion of the memory cell below the perpendicular word line through which the current is allowed to flow. The feature of the present invention is that the Curie temperature of the third magnetic layer is set low, so that the third magnetic layer of a memory element as a recording object loses the magnetism enough to form the ring loop of magnetization. Therefore, the second magnetic layer becomes ready for reversal of magnetization. Namely, the magnetization reversal field becomes small only in the memory cells of recording objects, but the other memory cells still have the high magnetization reversal field. This keeps magnetization stable during storage, so as to achieve the excellent storage property, and the magnetization can be reversed by the weak magnetic field on the occasion of recording, so as to lower the recording current.

The above described the regeneration of only one cell, but in practice there are many cells placed on the matrix and it is necessary to regenerate only the magnetization information of specific cells. In order to achieve it, as in recording, the current is allowed to flow through the sense line connected to each objective cell and the current is also allowed to flow through the word line perpendicular to the sense line at the same time as it, thereby generating the magnetic field; the regeneration is thus achieved by applying the magnetic field outside the asteroid curve of magnetic field to only the first magnetic layer of the objective cells. In an alternative way, only the first magnetic layer of the specific cells can also be inverted using the two perpendicular word lines. The resistance change is measured at the both ends of a sense line that connects the memory elements arranged vertically or horizontally in series. Specifically, semiconductor devices for detecting the resistance change are arranged in the portion of 390, 3100, or 3110 shown in FIGS. 42A and 42B, so that information can be regenerated in order from the cells arranged on one sense line.

The third embodiment may also adopt the form utilizing the spin dependent scattering and the form utilizing the spin dependent tunneling as described in the preceding embodiments.

[FOURTH EMBODIMENT]

The feature of the fourth embodiment is that the structure of the third magnetic layer in the preceding embodiments is made up of a part of the first magnetic layer or the second magnetic layer.

[Examples of Structure of Magnetic Thin-film Memory Element]

Figure 44:
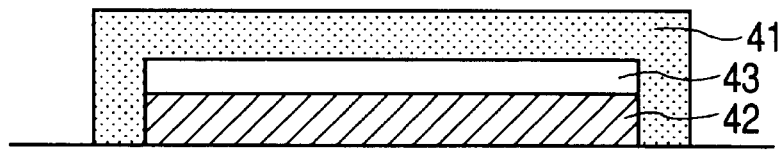
FIG. 44 is a cross-sectional, structural drawing of a magnetic thin-film memory element as a fourth embodiment of the present invention.
Figure 45:
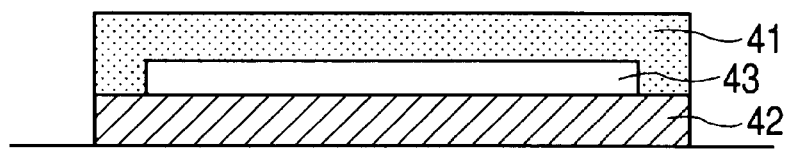
FIG. 45 is a cross-sectional, structural drawing to show another example of the magnetic thin-film memory element in the fourth embodiment of the present invention.

FIG. 44 and FIG. 45 are cross-sectional views each of which shows an example of the magnetic thin-film memory element of the present invention. In FIG. 44, reference numeral 41 designates a first magnetic layer, 42 a second magnetic layer, and 43 a non-magnetic layer. It is noted that numeral 41 may be the second magnetic layer while 42 the first magnetic layer.

As shown in FIG. 44, the magneto-resistive element of the present invention is a magneto-resistive element in which the first magnetic layer 41, which is magnetized mainly in an orientation of magnetization along one in-plane direction parallel to the film plane and has low coercive force, and the second magnetic layer 42, which is magnetized mainly in an orientation of magnetization along one in-plane direction parallel to the film plane and has high coercive force, are stacked with the non-magnetic layer 43 in between on the substrate and which exhibits a low resistance when the magnetization of the first magnetic layer and the magnetization of the second magnetic layer are parallel but a high resistance when they are antiparallel; the magnetization of the first magnetic layer and the magnetization of the second magnetic layer become antiparallel when the external magnetic field is 0; a closed magnetic circuit configuration is constructed in such a way that the first magnetic layer is bent so as to contact the end faces of the non-magnetic layer and then contact the end faces of the second magnetic layer or in such a way that the second magnetic layer is bent so as to contact the end faces of the non-magnetic layer and then contact the end faces of the first magnetic layer.

FIG. 44 shows the configuration in which the first magnetic layer 41 is in contact with the lateral faces of the non-magnetic layer 43 and the second magnetic layer 42, but another possible configuration is that the first magnetic layer 41 is in contact with the lateral surfaces of the non-magnetic layer 43 while being in contact with the top surface of the second magnetic layer, as shown in FIG. 45.

Figure 46:
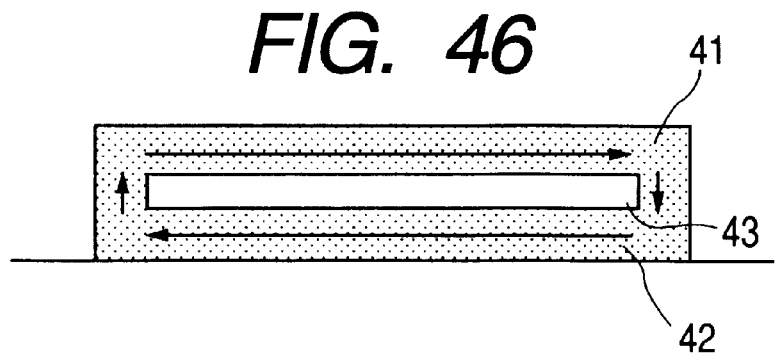
FIG. 46 is an explanatory drawing to show a schematic view of an example of magnetization directions in the magnetic thin-film memory elements shown in FIGS. 44 and 45.

FIG. 46 is a schematic view to show directions of magnetization in the respective layers of FIG. 44 and FIG. 45. As shown in FIG. 46, the first magnetic layer and the second magnetic layer compose a closed magnetic circuit surrounding the non-magnetic layer. Describing in further detail, the magnetization in the first magnetic layer or in the second magnetic layer is gently curved to form a ring loop, thereby realizing a stable energy state. In the conventional magnetic two-layer film structure not forming a closed magnetic circuit, spins are turned at the end faces with high magnetic charge density, so that magnetization cannot be kept stable; whereas the magnetization information can be stored stably in the magnetic thin-film memory element of the present invention.

[Examples of Production of Magnetic Thin-film Memory Element]

Processes for fabricating the magnetic thin-film memory elements of the present invention will be described referring to FIGS. 47A to 47C, FIGS. 48A to 48C, FIGS. 49A to 49D, and FIGS. 50A to 50D.

Figure 47A:
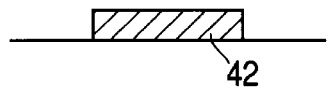
FIGS. 47A, 47B and 47C are explanatory drawings to show an example of a process for producing a magnetic thin-film memory element of one bit according to the present invention.
Figure 47B:
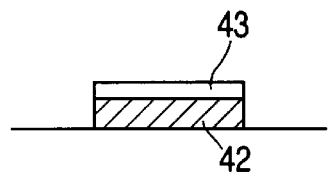
Figure 47C:
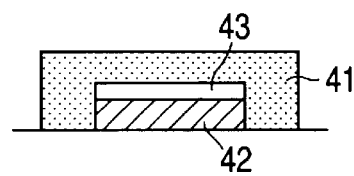
Figure 48A:
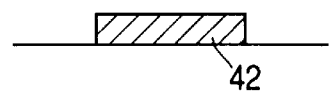
FIGS. 48A, 48B, and 48C are explanatory drawings to show another example of a process for producing a magnetic thin-film memory element of one bit according to the present invention.
Figure 48B:
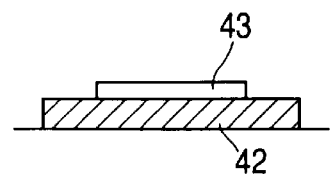
Figure 48C:
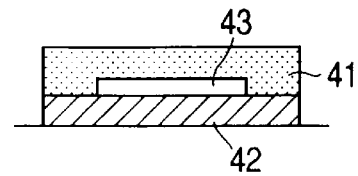

Since the magnetic thin-film memory element of the present invention realizes the closed magnetic circuit configuration of stable magnetization by the simplified structure, the production process thereof is also simple. For example, as shown in FIGS. 47A to 47C, a 1-bit memory cell shown in FIG. 44 can be fabricated by depositing the second magnetic layer 42 and non-magnetic layer 43, etching them, and thereafter depositing the first magnetic layer. Further, a 1-bit memory cell shown in FIG. 45 can be fabricated by depositing the second magnetic layer 42 and non-magnetic layer 43, thereafter etching only the non-magnetic layer, and depositing the first magnetic layer 41, as shown in FIGS. 48A to 48C.

Figure 49A:
FIGS. 49A, 49B, 49C, and 49D are explanatory drawings to show an example of a process for producing a magnetic thin-film memory element of eight bits according to the present invention.
Figure 49B:
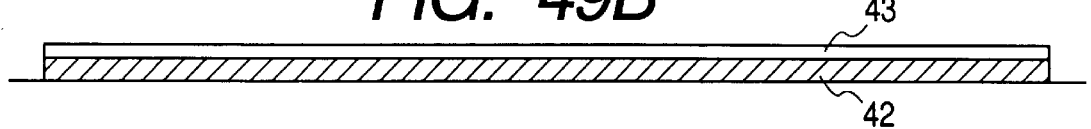
Figure 49C:
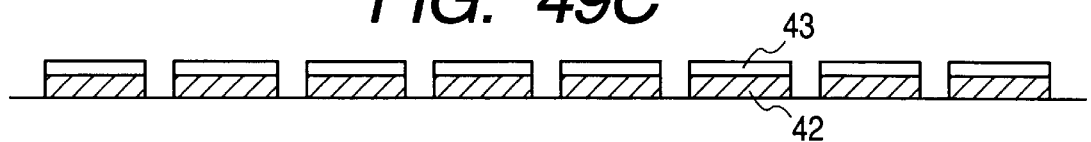
Figure 49D:
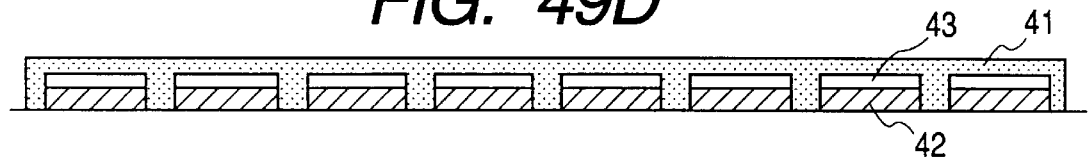

FIGS. 49A to 49D are drawings to show an example in which memory cells of eight bits are connected in series. The second magnetic layer 42 is deposited as shown in FIG. 49A and thereafter the non-magnetic layer 43 is deposited as shown in FIG. 49B. Then the layers are sectioned into eight areas by etching as shown in FIG. 49C and thereafter the first magnetic layer 41 is deposited as shown in FIG. 49D, thus completing a magnetic thin-film memory of the present invention.

Figure 50A:
FIGS. 50A, 50B, 50C, and 50D are explanatory drawings to show another example of a process for producing a magnetic thin-film memory element of eight bits according to the present invention.
Figure 50B:
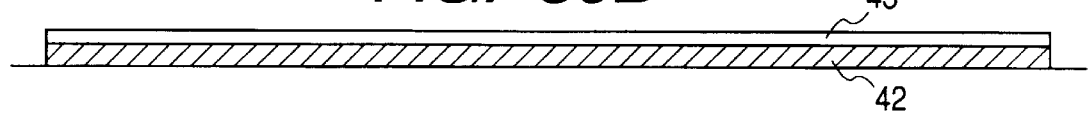
Figure 50C:
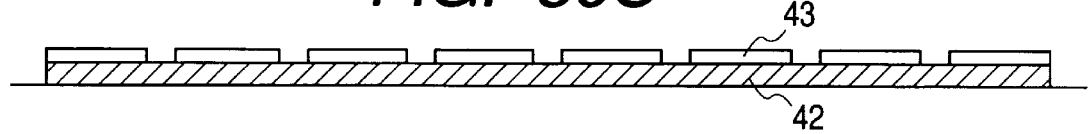
Figure 50D:
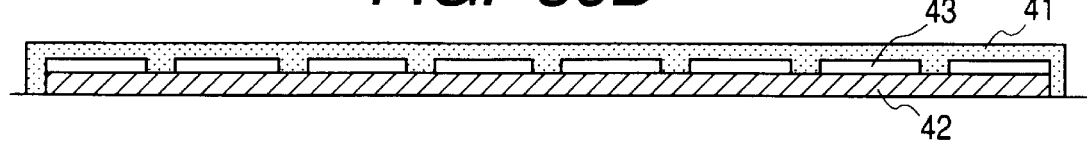

FIGS. 50A to 50D are drawings to show another example in which memory cells of eight bits are connected in series. In this case, the steps up to deposition of the non-magnetic layer are the same as described above, but the subsequent steps are carried out as follows; only the non-magnetic layer 43 is sectioned into eight areas by etching as shown in FIG. 50C and then the first magnetic layer 41 is deposited as shown in FIG. 50D, thus completing a magnetic thin-film memory of the present invention.

[Hybrid Configurations of Magnetic Thin-film Memory Element of the Present Invention and Semiconductor Device]

FIGS. 51A1 to 51C2 show hybrid configurations of the magnetic thin-film memory element of the present invention and the semiconductor device.

FIG. 51A1 and FIG. 51A2 are a circuit diagram of one unit and a cross-sectional view of device structure of an array configuration of memory cells in which structures, each being one unit of memory elements of the present invention connected in series, are arrayed in parallel and in which a diode is provided for elimination of crosstalk of each structure; FIG. 51B1 and FIG. 51B2 are a circuit diagram of one unit and a cross-sectional view of device structure of an active matrix configuration in which each memory element of the present invention is connected to a transistor; FIG. 51C1 and FIG. 51C2 are a circuit diagram of one unit and a cross-sectional view of device structure of a configuration in which memory cells are arrayed in parallel and in which each memory element of the present invention is connected to a diode for elimination of crosstalk.

FIG. 51C2 shows a part of a memory device fabricated by rendering the memory element of the present invention hybrid with a semiconductor element. In the memory device, a Write line, or word line 482 is established in the memory element 481 consisting of the present invention through an insulator. One end of memory element 481 is electrically connected with PN junction diode 485, and the other end with the Select electrode. 486 denotes a P-type semiconductor substrate. FIG. 51C1 is a circuit diagram corresponding to the structure shown by FIG. 51C2. The circuit diagram of FIG. 51C1 expresses one semiconductor hybrid memory element as a unit on a matrix consisting of the elements. As a matter of fact, a number of the constitution of FIG. 51C1 are metrically arranged in all directions surrounding FIG. 51C1, wherein respective Select lines are common to a series of the semiconductor hybrid memory elements in the right and left direction in the figure; and respective Write lines and respective Signal lines are respectively common to a series of the elements in the upper and lower direction in the figure. The electrifying to a specific Write line and a specific Select line to which an objective semiconductor hybrid memory element to which the user aims at the recording belongs makes it possible to conduct a recording to only the objective element located on a point at which the above specific Write and Select lines intersect each other. The reproducing can be carried out in the same manner as of the above recording, i.e. electrifying to the Write and Select lines to which the objective element from which the user aims at the reproducing belongs to cause a change in the resistance of the objective element, and then detecting a signal in accordance with the change of the resistance through the Signal line. The diode set in the above semiconductor hybrid memory element is for preventing the deterioration of the signal caused by the electrifying to other elements than the objective one toward which the user aims at the recording or reproducing.

FIGS. 51A1 and 51A2 show another constitution on the basis of the memory element of FIGS. 51C1 and 51C2, in which a plurality of Write lines are established so as to make possible to record a plurality of bits.

FIGS. 51B1 and 51B2 show the same constitution as FIGS. 51C1 and 51C2, except that MOS transistor 484 is employed instead of the diode. In the figures, one end of memory element 481 is electrically connected with a drain electrode of the MOS transistor 484, and the other end with a constant voltage, e.g. source voltage $V_{DD}$. The application of voltage to the Select line connected with gate electrode 483 of MOS transistor 484 realizes the selection of a specific memory element from those of the matrix. This is because the application allows the current to flow between the source and the drain of MOS transistor 484 and does not allow the current to flow through MOS transistors on the other Select lines to which lines the voltage is not applied. The electrifying to the Write line in this state makes possible to conduct the recording/reproducing toward the specific memory element.

When the memory is constructed in the hybrid structure where the memory elements of the present invention are connected to the semiconductor devices such as the diodes or the transistors as shown in FIGS. 51A1 to 51C2, the production processes become a little complex, but the hybrid structure can eliminate the impedance components including the stray capacitance appearing in the configuration of the memory elements arrayed in the simple matrix described previously, thereby assuring stabler operation.

[Matrix Array Configurations of Memory Cells]

Figure 52:
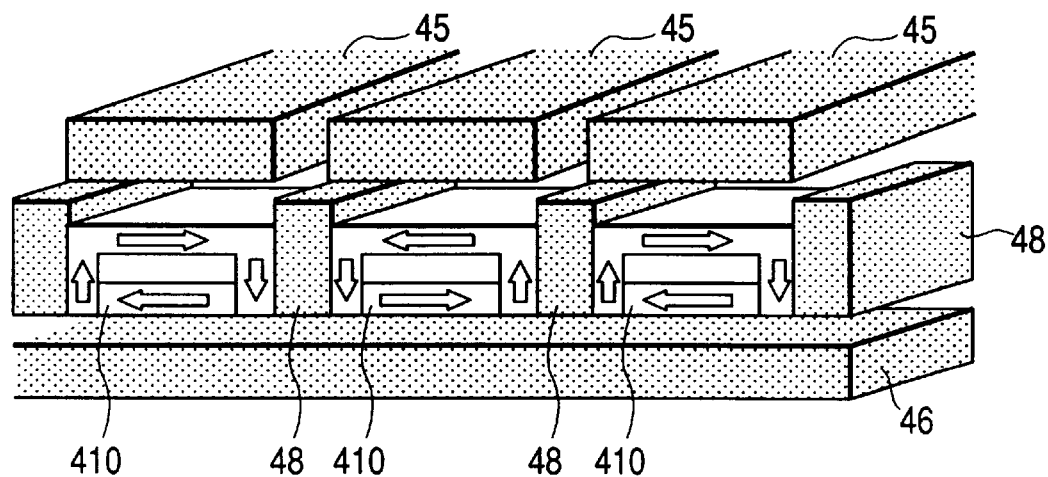
FIG. 52 is an explanatory drawing to show an example of array structure of magnetic thin-film memory elements according to the present invention.
Figure 53:
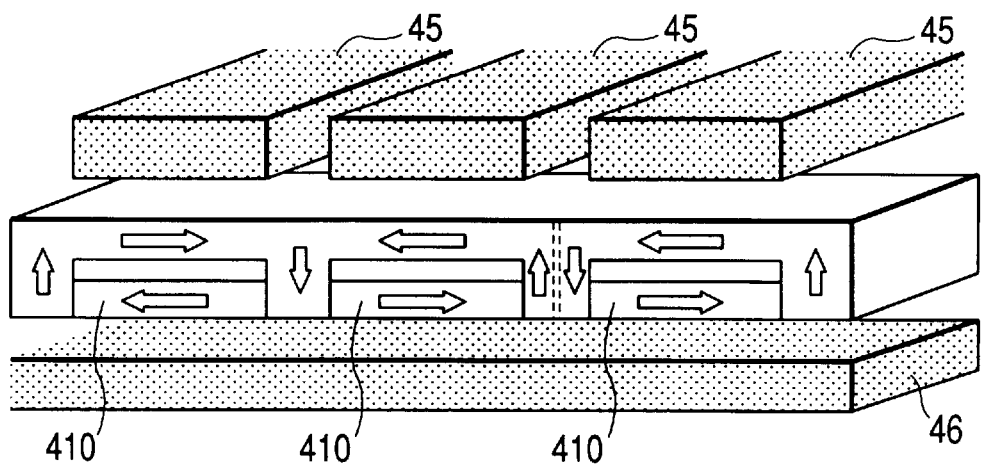
FIG. 53 is an explanatory drawing to show another example of array structure of magnetic thin-film memory elements according to the present invention.
Figure 54:
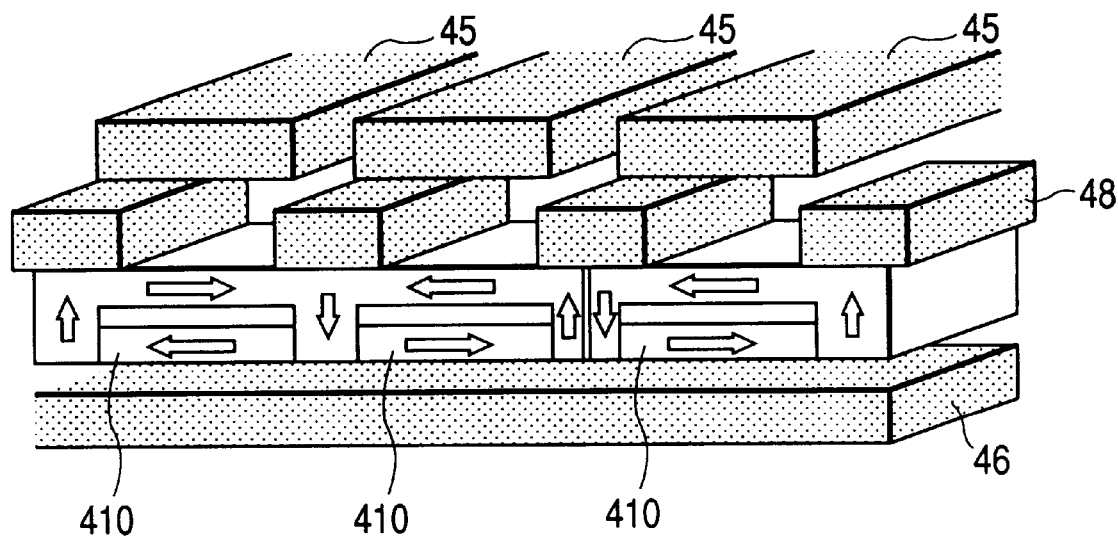
FIG. 54 is an explanatory drawing to show still another example of array structure of magnetic thin-film memory elements according to the present invention.

Next described are examples of array configurations of memory cells where a solid state memory of a matrix type is made by arraying many magnetic thin-film memory elements of the present invention. FIG. 52, FIG. 53, and FIG. 54 are drawings each of which stereoscopically shows an example of the array configuration in which the magnetic thin-film memory elements of the present invention shown in FIG. 44 or FIG. 45 are arrayed in series.

As shown in the drawings, the memory elements 410 are arrayed in series and word lines 45 are placed above the respective memory elements. Another word line 46 is provided below the memory cells.

In the series configurations of FIG. 52, FIG. 53, and FIG. 54, an insulating layer fills the space between each word line and memory cell, though not illustrated, thereby preventing the word line from electrically conducting to the memory cell. In the series configurations of FIG. 52, FIG. 53, and FIG. 54, the word line 46 may be omitted in the case where recording is carried out using the sense line 47 and word line 45.

In the case of the series array configurations, the memory cells may be connected by the bent portions of the first or second magnetic layer as shown in FIG. 53, but the resistance between memory cells may be reduced by connecting the memory cells with a good conductor 48 as shown in FIG. 52 or by placing the good conductor 48 above the first magnetic layer as shown in FIG. 54. The good conductor may be such material as Al, and is desirably one containing at least a principal component of material with lower resistivity than those of the first magnetic layer and the second magnetic layer. Since the current is allowed to flow through the sense line during regeneration, the current passes through the bent portions of the first magnetic layer or the second magnetic layer. It is not preferred that the magnetization state of the bent portions should affect the regenerated signal on that occasion. In order to avoid it, the length of the bent portions in the direction of sense line is desirably not less than 500 Å. In FIG. 52, the sense line is the whole of the memory elements and good conductor arranged in series.

Figure 55:
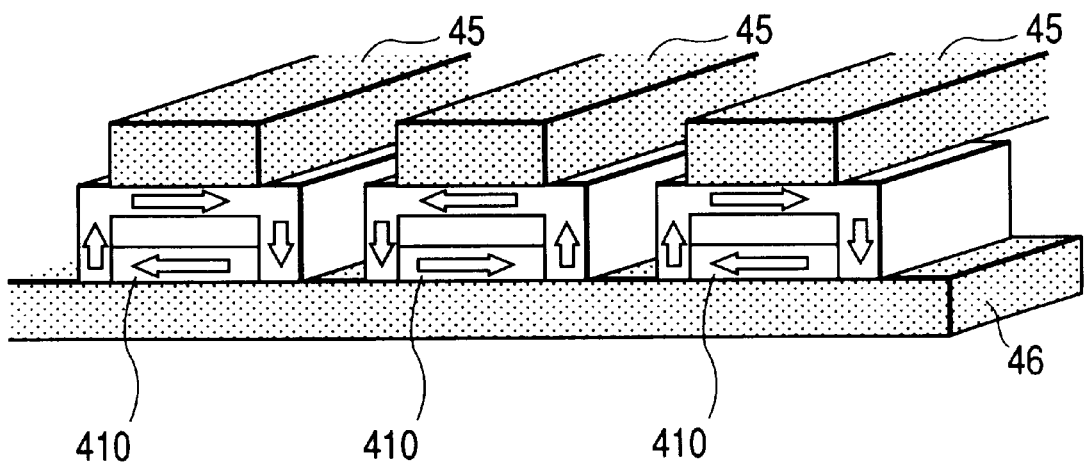
FIG. 55 is an explanatory drawing to show still another example of array structure of magnetic thin-film memory elements according to the present invention.

FIG. 55 shows an example of structure in which the memory cells are arrayed in parallel, in which the word lines 45 are arranged to connect the sense lines and cells in parallel.

Figure 56:
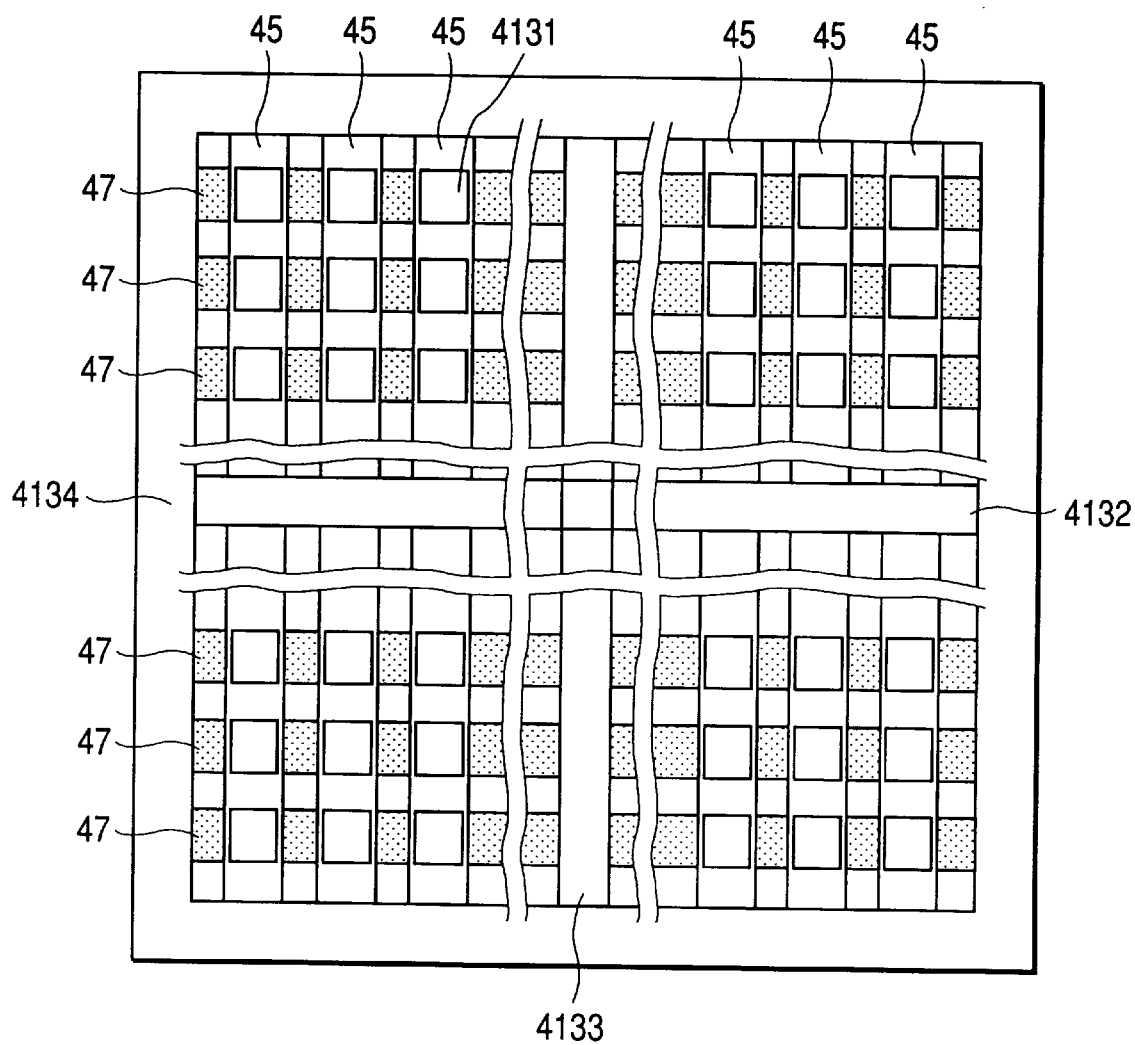
FIG. 56 is a plan view of a magnetic thin-film memory according to the present invention.

FIG. 56 is a top plan view to show an example of a magnetic thin-film memory of the present invention. Memory cells 4131 of memory elements are only some cells illustrated and the other most cells are not illustrated. The memory cells 4131 are arranged in series to compose each of sense lines 47. The sense lines are arranged horizontally in FIG. 56, but they may be arranged vertically. The word lines 45 are placed immediately above the memory elements through an insulating layer not illustrated in the same figure and perpendicular to the sense lines 47. Word lines 46 perpendicular to the word lines 45 are provided below the sense lines 47, though not illustrated. The word lines are provided mainly for recording while the sense lines mainly for reading regenerated signals. At the both ends 4132, 4133, 4134 of each word line and each sense line there are provided the semiconductor devices including the decoders, the drivers, etc. for selectively driving these lines. A sense amplifier for amplifying regenerated signals is incorporated at the end of each sense line.

The substrate of the magnetic thin-film memory elements of the present invention is desirably a substrate containing a principal component of Si. This is because the semiconductor devices described above can be made on the common substrate to the memory elements of the present invention.

The all word lines used in the present invention are made of a good conductor with a larger conductivity than those of the first and second magnetic layers. Examples of the word lines are those of aluminum, copper, tungsten, or mixtures thereof, or mixtures thereof with silicon or the like.

[Recording Method Using Magnetic Thin-film Memory Elements of the Present Invention]

Next described is an example of the recording method using the magnetic thin-film memory elements according to the present invention. Each memory cell of the present invention is provided with two electrode lines of a word line and a sense line, and a magnetic field is generated according to the Ampere's law when a current is allowed to flow through each line. Since these two electrode lines are perpendicular to each other, magnetic fields generated thereby are also perpendicular to each other. A magnetic field applied to the magnetic layers of memory cell is the vector sum of these orthogonal magnetic fields. When in this state a magnetic field strong enough to reverse magnetization in the second magnetic layer is applied by the current through the word line, the magnetization in the second magnetic layer will be oriented in a desired direction, so as to achieve recording. It is thus possible to perform recording of only specific cells selected from the many cells on the matrix.

Propriety of reversal of magnetization is described by asteroid curve of magnetic layer. The second magnetic layer needs to have the high coercive force, because it is preferred to preserve the magnetization state stably. On the other hand, it is, however, also preferred to reverse the magnetization in the second magnetic layer by a weak magnetic field generated by a small current in order to prevent disconnection of word line due to electromigration and in order to decrease the dissipation power. For this purpose, the second magnetic layer needs to have low coercive force. The coercive force of the second magnetic layer is thus determined so as to satisfy the both requirements. Specifically, the coercive force of the second magnetic layer is preferably in the range of 5 [Oe] inclusive to 50 [Oe] inclusive. More preferably, the coercive force of the second magnetic layer is in the range of 10 [Oe] inclusive to 30 [Oe] inclusive.

Since the fundamental recording and below-described regeneration of the present invention can be done using the word line 45 and sense line 47 as described above, the word line 46 shown in FIG. 52 to FIG. 54 does not always have to be provided. However, the recording and below-described regeneration may be carried out using the word line 46 perpendicular to the word line 45 in order to generate a greater magnetic field. In another permissible arrangement the word line 45 above the memory element is omitted and the word line 46 below the memory element is positioned in the direction perpendicular to the sense line 47. When the semiconductor devices and memory elements are made on a common substrate, production is easier where the word lines are made after deposition of memory elements, however. Therefore, the memory is made preferably in the order of substrate/first magnetic layer/non-magnetic layer/second magnetic layer/insulating layer/word lines.

In another permissible arrangement a buffer layer is provided on the substrate and the memory elements are formed thereon in order to control the coercive force, for example. This provision of the buffer layer suppresses variation in coercive force between different memory cells or facilitates control of absolute value of coercive force. Preferred materials for the buffer layer are insulating materials, for example SiN.

[Regenerating Method Using Magnetic Thin-film Memory Elements of the Present Invention]

Next described is an example of the regenerating method using the magnetic thin-film memory elements of the present invention. The magnetic thin-film memory of the present invention exhibits the giant magneto-resistance (GMR) effect by spin dependent scattering and the resistance thereof is low in the parallel magnetization state of the first magnetic layer and second magnetic layer but high in the antiparallel magnetization state thereof. During regeneration a current weaker than during recording is allowed to flow through the word line above or below the magnetic thin-film memory element, thereby generating a weaker magnetic field. This magnetic field is arranged to have such intensity as to reverse only the magnetization in the first magnetic layer but not to reverse the magnetization in the second magnetic layer, in order to prevent the magnetization information stored from being deleted during regeneration. The coercive force of the first magnetic layer needs to be smaller than that of the second magnetic layer. In order to ensure the sufficient margin of generated magnetic field, the coercive force of the first magnetic layer is preferably not more than a half of that of the second magnetic layer, and more preferably not more than one third thereof. The current is set so that the magnetic field induced by the word line is greater than the magnetic field for reversal of magnetization in the first magnetic layer but smaller than the magnetic field for reversal of magnetization in the second magnetic layer.

The above described the regeneration of only one cell, but in practice there are many cells placed on the matrix and it is necessary to regenerate only the magnetization information of specific cells. In order to achieve it, as in recording, the current is allowed to flow through the sense line connected to each objective cell and the current is also allowed to flow through the word line perpendicular to the sense line at the same time as it, thereby generating the magnetic field; the regeneration is thus achieved by applying the magnetic field outside the asteroid curve of magnetic field to only the first magnetic layer of the objective cells. In an alternative way, only the first magnetic layer of the specific cells can also be inverted using the two perpendicular word lines. The resistance change is measured at the both ends of a sense line that connects the memory elements arranged vertically or horizontally in series. Specifically, the semiconductor devices for detecting the resistance change are arranged in the portion of 4134 or 4133 shown in FIG. 56, so that information can be regenerated in order from the cells arranged on one sense line.

The fourth embodiment may also adopt the form utilizing the spin dependent scattering and the form utilizing the spin dependent tunneling as described in the preceding embodiments.

What is claimed is:

1. A magnetic memory element comprising:
    a first magnetic layer magnetized in an orientation of magnetization along one in-plane direction;
    a second magnetic layer magnetized in an orientation of magnetization parallel or antiparallel to said orientation of magnetization of said first magnetic layer, said second magnetic layer having a higher coercive force than that of said first magnetic layer;
    a non-magnetic layer interposed between said first magnetic layer and said second magnetic layer, said non-magnetic layer comprised of an insulating material; and
    a third magnetic layer for magnetically coupling said first magnetic layer with said second magnetic layer in order to form a closed magnetic circuit with said first magnetic layer and second magnetic layer, wherein said third magnetic layer is in direct contact with both said first and second magnetic layers and said non-magnetic layer is not interposed between said third magnetic layer and said first and second magnetic layers.

2. The magnetic memory element according to claim 1, wherein said third magnetic layer is comprised of a part of said first magnetic layer or said second magnetic layer.

3. The magnetic memory element according to claim 1, wherein a Curie temperature of said third magnetic layer is lower than those of said first magnetic layer and second magnetic layer.

4. The magnetic memory element according to claim 1, wherein said third magnetic layer is disposed in contact with end faces of said first magnetic layer and second magnetic layer.

5. The magnetic memory element according to claim 1, wherein said third magnetic layer is interposed between said first magnetic layer and said second magnetic layer.

6. The magnetic memory element according to claim 5, wherein a total length of said third magnetic layer is not more than one third of a total length of said non-magnetic layer.

7. The magnetic memory element according to claim 1, wherein magnetic anisotropy of said third magnetic layer is smaller than those of said first magnetic layer and second magnetic layer.

8. The magnetic memory element according to claim 1, wherein said third magnetic layer contains principal components of Ni and Fe.

9. The magnetic memory element according to claim 1, wherein said third magnetic layer is comprised of an alloy containing at least one selected from GdFe, DyFe, and TbFe.

10. The magnetic memory element according to claim 1, wherein a ratio of length to width of said first magnetic layer and second magnetic layer is 2 or more and said third magnetic layer is disposed at longitudinal ends of said first magnetic layer and second magnetic layer.

11. The magnetic memory element according to claim 1, wherein said third magnetic layer is made of an insulating material.

12. The magnetic memory element according to claim 11, wherein said insulating material is a compound that can be expressed by $MFe_2O_4$ (where M is Ni, Co, Mg, or Mn).

13. The magnetic memory element according to claim 3, wherein said Curie temperature of the third magnetic layer is 100–500° C.

14. The magnetic memory element according to claim 1, wherein a coercive force of said third magnetic layer is smaller than that of said first magnetic layer.

15. A magnetic thin-film memory wherein the magnetic thin-film memory elements as set forth in claim 1 are arranged in a matrix.

* * * * *

UNITED STATES PATENT AND TRADEMARK OFFICE
CERTIFICATE OF CORRECTION

PATENT NO. : 6,028,786

DATED : February 22, 2000

INVENTOR(S) : NAOKI NISHIMURA

It is certified that error appears in the above-identified patent and that said Letters Patent is hereby corrected as shown below:

<u>ON THE TITLE PAGE AT [56]</u>
    References Cited, insert:
        --5,503,924  4/1996    Osato . . . .     428/336
          5,375,082 12/1994    Katti et al. . . .  365/45--.

<u>COLUMN 3</u>
    Line 44, "dependece" should read --dependence--.

<u>COLUMN 8</u>
    Line 59, after "electron" insert --,--.

<u>COLUMN 9</u>
    Line 25, "the" (first occurrence) should be deleted;
    Line 64, "sense" should read --a sense--.

<u>COLUMN 10</u>
    Line 28, "sense" should read --a sense--.

<u>COLUMN 12</u>
    Line 65, "the all" should read --all the--.

<u>COLUMN 14</u>
    Line 16, "better be" should read --be--;
    Line 22, "of" should read --of a--;
    Line 60, "the" should be deleted.

<u>COLUMN 17</u>
    Line 23, "other memory cells than" should read --memory cells other than--.

UNITED STATES PATENT AND TRADEMARK OFFICE
CERTIFICATE OF CORRECTION

PATENT NO. : 6,028,786

DATED : February 22, 2000

INVENTOR(S) : NAOKI NISHIMURA

It is certified that error appears in the above-identified patent and that said Letters Patent is hereby corrected as shown below:

COLUMN 18
    Line 8, "the" (first occurrence) should be deleted;
    Line 10, "the" (first occurrence) should be deleted;
    Line 16, "the" (second occurrence) should be deleted.

COLUMN 19
    Line 7, "Hi" should read --H1--;
    Line 42, "cross section" should read --cross-section--.

COLUMN 20
    Line 18, "the" should be deleted.

COLUMN 21
    Line 45, "cross" should read --cross---;
    Line 53, "reverse" should read --reversed--.

COLUMN 22
    Line 3, "of which are" should be deleted;
    Line 32, "reverse" should read --reversed--;
    Line 60, "electron" should read --electrons--.

COLUMN 23
    Line 21, "metal" should read --metals--.

COLUMN 24
    Line 47, "with" should read --while--.

COLUMN 26
    Line 41, "the" (first occurrence) should be deleted.

COLUMN 27
    Line 51, "the" should be deleted;
    Line 64, "used" should read --be used--.

UNITED STATES PATENT AND TRADEMARK OFFICE
CERTIFICATE OF CORRECTION

PATENT NO. : 6,028,786

DATED : February 22, 2000

INVENTOR(S) : NAOKI NISHIMURA

It is certified that error appears in the above-identified patent and that said Letters Patent is hereby corrected as shown below:

COLUMN 31
    Line 52, "the" (first and third occurrences) should be deleted;
    Line 57 "the" should be deleted.

COLUMN 32
    Line 7, "the" should be deleted;
    Line 36, "the" (second occurrence) should be deleted.

COLUMN 33
    Line 2, "the" (second occurrence) should be deleted;
    Line 27, "other memory cells than" should read --memory cells other than--.

COLUMN 34
    Line 28, "the" should be deleted;
    Line 38, "a" should be deleted;
    Line 57, "of" should read --of the--.

COLUMN 35
    Line 13, "lop" should read --loop--.

COLUMN 36
    Line 12, "cross section" should read --cross-section--;
    Line 26, "small" should read --the small--.

COLUMN 37
    Line 9, "the" should be deleted;
    Line 40, "the" should be deleted.

COLUMN 39
    Line 24, "fro" should read --for--;
    Line 43, "the" (first occurrence) should be deleted.

UNITED STATES PATENT AND TRADEMARK OFFICE
CERTIFICATE OF CORRECTION

PATENT NO.   : 6,028,786
DATED        : February 22, 2000
INVENTOR(S)  : NAOKI NISHIMURA It is certified that error appears in the above-identified patent and that said Letters Patent is hereby corrected as shown below:

<u>COLUMN 40</u>
    Line 64, "the" should be deleted.

<u>COLUMN 43</u>
    Line 3, "constitution" should read --constituents--;
    Line 29, "to record" should read --recording--.

<u>COLUMN 44</u>
    Line 56, "The all" should read --All the--.

<u>COLUMN 45</u>
    Line 25, "the" (first occurrence) should be deleted.

Signed and Sealed this

Seventeenth Day of April, 2001

*Attest:*

NICHOLAS P. GODICI

*Attesting Officer*    *Acting Director of the United States Patent and Trademark Office*